United States Patent
Nakano et al.

(10) Patent No.: US 8,916,275 B2
(45) Date of Patent: Dec. 23, 2014

(54) LIGHT EMITTING DEVICE MATERIAL AND LIGHT EMITTING DEVICE

(75) Inventors: Yohei Nakano, Otsu (JP); Kazunori Sugimoto, Otsu (JP); Kazumasa Nagao, Otsu (JP); Daisaku Tanaka, Otsu (JP); Tsuyoshi Tominaga, Otsu (JP)

(73) Assignee: Toray Industries, Inc. (JP)

( * ) Notice: Subject to any disclaimer, the term of this patent is extended or adjusted under 35 U.S.C. 154(b) by 185 days.

(21) Appl. No.: 13/254,285

(22) PCT Filed: Mar. 25, 2010

(86) PCT No.: PCT/JP2010/055177
§ 371 (c)(1),
(2), (4) Date: Sep. 20, 2011

(87) PCT Pub. No.: WO2010/113743
PCT Pub. Date: Oct. 7, 2010

(65) Prior Publication Data
US 2012/0001161 A1    Jan. 5, 2012

(30) Foreign Application Priority Data

Mar. 30, 2009 (JP) ................................... 2009-81410
Dec. 24, 2009 (JP) ................................. 2009-292004

(51) Int. Cl.
| | | |
|---|---|---|
| H01L 51/54 | (2006.01) | |
| C07D 401/10 | (2006.01) | |
| C07D 215/12 | (2006.01) | |
| C07D 213/16 | (2006.01) | |
| C09K 11/06 | (2006.01) | |
| H01L 51/00 | (2006.01) | |
| C09B 57/00 | (2006.01) | |
| H01L 51/50 | (2006.01) | |

(52) U.S. Cl.
CPC ............ *C09K 11/06* (2013.01); *H01L 51/0054* (2013.01); *H01L 51/0058* (2013.01); *H01L 51/006* (2013.01); *C09B 57/00* (2013.01); *C09B 57/001* (2013.01); *C09K 2211/1011* (2013.01); *H01L 51/0056* (2013.01); *H01L 51/0072* (2013.01); *H01L 51/5012* (2013.01); *H01L 51/5052* (2013.01); *Y10S 428/917* (2013.01)
USPC ........ 428/690; 428/917; 428/411.1; 428/336; 546/285

(58) Field of Classification Search
None
See application file for complete search history.

(56) References Cited

U.S. PATENT DOCUMENTS

| | | |
|---|---|---|
| 2004/0207318 A1 | 10/2004 | Lee et al. |
| 2004/0234809 A1 | 11/2004 | Chen et al. |
| 2006/0240283 A1 | 10/2006 | Tai et al. |
| 2009/0066245 A1 | 3/2009 | Sugimoto et al. |
| 2009/0096356 A1* | 4/2009 | Murase et al. ............... 313/504 |
| 2009/0162612 A1* | 6/2009 | Hatwar et al. ............... 428/156 |
| 2010/0030634 A1 | 2/2010 | McElroy et al. |
| 2011/0121268 A1* | 5/2011 | Nagao et al. ................. 257/40 |

FOREIGN PATENT DOCUMENTS

| | | | |
|---|---|---|---|
| CN | 101407493 | 4/2009 | |
| EP | 1 345 278 | 9/2003 | |
| EP | 1 808 912 | 7/2007 | |
| EP | 1 852 486 | 11/2007 | |
| EP | 1 942 171 | 7/2008 | |
| EP | 2 296 204 | 3/2011 | |
| JP | 2000-348864 | 12/2000 | |
| JP | 2002-352961 | 12/2002 | |
| JP | 2003-347060 | 12/2003 | |
| JP | 2004-002297 | 1/2004 | |
| JP | 2004-277377 | 10/2004 | |
| JP | 2004-319424 | 11/2004 | |
| JP | 2007-131723 | 5/2007 | |
| JP | 2009-246354 | 10/2009 | |
| WO | 2006/090772 | 8/2006 | |
| WO | 2007/029798 | 3/2007 | |
| WO | WO 2007/029798 A1 * | 3/2007 | ............. C09K 11/06 |
| WO | 2008/108256 | 9/2008 | |
| WO | 2010/001817 | 1/2010 | |
| WO | WO 2010/001817 * | 1/2010 | ............. C09K 11/06 |

OTHER PUBLICATIONS

Tang, C.W. et al. "Organic electroluminescent diodes," *Applied Physics Letters*, 1987, vol. 51, No. 12, pp. 913-915.

Xing, Y. et al., "Carbazole-Pyrene-Based Organic Emitters for Electroluminescent Device," *Chemical Physics Letters*, Jun. 7, 2005, vol. 408, pp. 169-173.

* cited by examiner

*Primary Examiner* — J. L. Yang
(74) *Attorney, Agent, or Firm* — DLA Piper LLP (US)

(57) ABSTRACT

Disclosed is an organic electroluminescent element which has achieved both high luminous efficiency and low driving voltage by containing a light-emitting element material, which comprises a specific pyrene compound, in one of the layers that constitute the light-emitting element, preferably in a light-emitting layer or in an electron-transporting layer. The pyrene compound may have the following general formula:

(1)

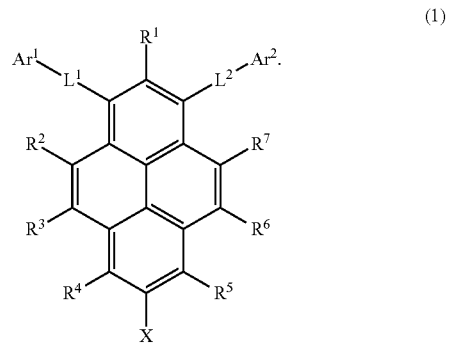

13 Claims, No Drawings

LIGHT EMITTING DEVICE MATERIAL AND LIGHT EMITTING DEVICE

RELATED APPLICATIONS

This is a §371 of International Application No. PCT/JP2010/055177, with an international filing date of Mar. 25, 2010, which is based on Japanese Patent Application No. 2009-081410, filed Mar. 30, 2009 and Japanese Patent Application No. 2009-292004, filed on Dec. 24, 2009, the subject matter of which is incorporated by reference.

TECHNICAL FIELD

The present invention relates to a light emitting device which can convert an electric energy into light, and the light emitting device can be utilized in the fields of display equipments, flat panel displays, backlight, illumination, interiors, signs, advertising displays, electrophotographic machines and light signal generators.

BACKGROUND ART

Researches on an organic thin-film light emitting device in which electrons injected from a cathode and holes injected from an anode emit light when they are recombined in an organic fluorescent body held by both electrodes have been actively conducted in recent years. This light emitting device is characteristic for high luminance light emission in the form of a thin type and under a low driving voltage, and multicolor light emission due to selection of a fluorescent material, and has been paid attention.

Such researches have been studied by many research institutes since C. W. Tang et al. of Kodak Co., Ltd. showed that an organic thin-film device emits light at high luminance. A representative constitution of the organic thin-film light emitting device presented by the research group of Kodak Co., Ltd. is one such that a hole transporting diamine compound, 8-hydroxyquinoline aluminum which serves as an emissive layer, and Mg:Ag as a cathode are sequentially provided on an ITO glass substrate, and can emit green light of 1,000 cd/m$^2$ at a driving voltage of around 10V (see Non-Patent Document 1).

Since the organic thin-film light emitting device can afford a variety of light-emitted colors by using various fluorescent materials in an emissive layer, and studies of practical realization for displays and the like have been actively conducted. Among emissive materials emitting three primary colors, a research on a green emissive material is most advanced and, currently in a red emissive material and a blue emissive material, a research has been conducted intensively aiming at improvement in properties.

It is necessary that the organic thin-film light emitting device satisfies improvement in a luminance efficiency, reduction in a driving voltage and improvement in durability. Among them, when the luminance efficiency is low, outputting of an image requiring high luminance becomes impossible, and the amount of power consumed for outputting desired luminance is increased. For example, in order to improve the luminance efficiency, a variety of emissive materials have been developed (see, e.g., Patent Documents 1 to 4). In addition, electron transporting materials having pyrene as a basic skeleton have been developed (see, e.g., Patent Documents 5 to 7). In addition, techniques of doping a material used as an electron transporting layer with an alkali metal have been developed (see, e.g., Patent Documents 8 to 12).

PRIOR ART DOCUMENTS

Patent Documents

Patent Document 1: International Publication WO 2007/29798 pamphlet
Patent Document 2: International Publication WO 2008/108256 pamphlet
Patent Document 3: JP-A No. 2007-131723 gazette
Patent Document 4: International Publication WO 2006/90772 pamphlet
Patent Document 5: European Patent Publication No. 1808912
Patent Document 6: Chinese Patent Publication No. 101407493
Patent Document 7: International Publication WO 2010/001817 pamphlet
Patent Document 8: JP-A No. 2000-348864 gazette
Patent Document 9: JP-A No. 2004-277377 gazette
Patent Document 10: JP-A No. 2003-347060 gazette
Patent Document 11: JP-A No. 2002-352961 gazette
Patent Document 12: JP-A No. 2004-2297 gazette Non-Patent Document Non-Patent Document 1: "Applied Physics Letters", (USA), 1987, Vol. 51, No. 12, pp. 913-915

SUMMARY OF THE INVENTION

Problems to be Solved by the Invention

However, as described above, it is necessary that the organic thin-film light emitting device satisfies improvement in a luminance efficiency, reduction in a driving voltage and improvement in durability, particularly regarding a blue light emitting device, there are a few blue emissive materials which provide a device excellent in durability and having high reliance.

In addition, even when a compound used in an electron transporting layer is improved, conventionally known combinations as in Patent Documents 7 to 11 are insufficient in realization of both of low voltage driving and a high luminance efficiency.

An object of the present invention is to solve such conventional problems, and to provide a light emitting device material which enables an organic thin-film light emitting device realizing both of a high luminance efficiency and a low driving voltage, and a light emitting device using the same.

Means for Solving the Problems

The present invention relates to a light emitting device material including a pyrene compound represented by the following general formula (1):

[Chemical formula 1]

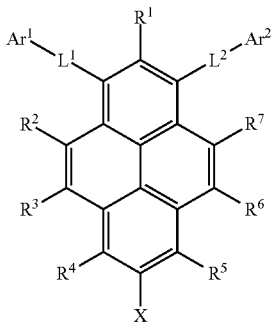

(1)

R[1] to R[7] may be the same or different, and are each selected from the group consisting of hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen, a carbonyl group, a carboxyl group, an oxycarbonyl group, a carbamoyl group, an amino group, a silyl group, and —P(=O)R[8]R[9]. R[8] and R[9] are each an aryl group or a heteroaryl group, and adjacent substituents may form a ring. L[1] and L[2] may be the same or different, and are each a single bond or an arylene group. X is selected from the group consisting of an alkyl group, an aryl group, and a heteroaryl group. Ar[1] is an aromatic heterocyclic group containing electron-accepting nitrogen, and Ar[2] is an aryl group or a heteroalyl group, provided that when Ar[2] is a heteroaryl group, a dibenzofuranyl group, a dibenzothiophenyl group and a carbazolyl group are excluded.

Advantages of the Invention

According to the present invention, an organic electric field light emitting device realizing both of a high luminance efficiency and a low driving voltage can be provided.

MODE FOR CARRYING OUT THE INVENTION

A pyrene compound represented by the general formula (1) in the present invention will be described in detail.

[Chemical formula 2]

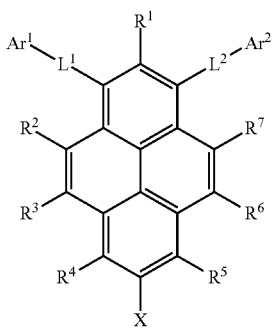

(1)

R[1] to R[7] may be the same or difference, and are each selected from the group consisting of hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen, a carbonyl group, a carboxyl group, an oxycarbonyl group, a carbamoyl group, an amino group, a silyl group, and —P(=O)R[8]R[9]. R[8] and R[9] are each an aryl group or a heteroaryl group, and adjacent substituents may form a ring. L[1] and L[2] may be the same or different, and are each a single bond or an arylene group. X is selected from the group consisting of an alkyl group, an aryl group and a heteroaryl group. Ar[1] is an aromatic heterocyclic group containing an electron-accepting nitrogen, and Ar[2] is an aryl group or a heteroaryl group, provided that when Ar[2] is a heteroaryl group, a dibenzofuranyl group, a dibenzothiophenyl group and a carbazolyl group are excluded.

Among these substituents, hydrogen may be deuterium. In addition, the alkyl group denotes a saturated aliphatic hydrocarbon group such as a methyl group, an ethyl group, a n-propyl group, an isopropyl group, a n-butyl group, a sec-butyl group, or a tert-butyl group, and this may or may not have a substituent. An additional substituent when substituted is not particularly limited, and examples thereof include an alkyl group, an aryl group, and a heteroaryl group, and this point is also common to the following descriptions. In addition, the number of carbon atoms in the alkyl group is not particularly limited, but from the viewpoints of easy availability and cost, it is in a range of usually 1 or more and 20 or less, more preferably 1 or more and 8 or less.

The cycloalkyl group denotes a saturated alicyclic hydrocarbon group such as a cyclopropyl group, a cyclohexyl group, a norbornyl group or an adamantyl group, and this may or may not have a substituent. The number of carbon atoms in portion of an alkyl group is not particularly limited, but is usually in a range of 3 or more and 20 or less.

The heterocyclic group denotes an aliphatic ring having an atom other than carbon in the ring, such as a pyran ring, a piperidine ring and cyclic amide, and this may or may not have a substituent. The number of carbon atoms in the heterocyclic group is not particularly limited, but is usually in a range of 2 or more and 20 or less.

The alkenyl group denotes an unsaturated aliphatic hydrocarbon group containing a double bond, such as a vinyl group, an allyl group or a butadienyl group, and this may or may not have a substituent. The number of carbon atoms in the alkenyl group is not particularly limited, but is usually in a range of 2 or more and 20 or less.

The cycloalkenyl group denotes an unsaturated alicyclic hydrocarbon group containing a double bond, such as a cyclopentenyl group, a cyclopentadienyl group or a cyclohexenyl group, and this may or may not have a substituent.

The alkynyl group denotes an unsaturated aliphatic hydrocarbon group containing a triple bond, such as an ethynyl group, and this may or may not have a substituent. The number of carbon atoms in the alkynyl group is not particularly limited, but is usually in a range of 2 or more and 20 or less.

The alkoxy group denotes a functional group in which an aliphatic hydrocarbon group is bound via an ether group, such as a methoxy group, an ethoxy group or a propoxy group, and this aliphatic hydrocarbon group may or may not have a substituent. The number of carbon atoms in the alkoxy group is not particularly limited, but is usually in a range of 1 or more and 20 or less.

The alkylthio group is a group in which the oxygen atom of an ether bond of the alkoxy group is substituted with a sulfur atom. The hydrocarbon group of the alkylthio group may or may not have a substituent. The number of carbon atoms in the alkylthio group is not particularly limited, but is usually in a range of 1 or more and 20 or less.

The arylether group denotes a functional group in which an aromatic hydrocarbon group is bound via an ether bond, such as a phenoxy group, and the aromatic hydrocarbon group may or may not have a substituent. The number of carbon atoms in the arylether group is not particularly limited, but is usually in a range of 6 or more and 40 or less.

The arylthioether group is a group in which the oxygen atom of an ether bond of the arylether group is substituted with a sulfur atom. The aromatic hydrocarbon group in the arylether group may or may not have a substituent. The number of carbon atoms in the arylether group is not particularly limited, but is usually in a range of 6 or more and 40 or less.

The aryl group denotes an aromatic hydrocarbon group such as a phenyl group, a naphthyl group, a biphenyl group, a phenanthryl group, a terphenyl group, or a pyrenyl group. The aryl group may or may not have a substituent. The number of carbon atoms in the aryl group is not particularly limited, but is usually in a range of 6 or more and 40 or less.

The heteroaryl group denotes a cyclic aromatic group having one or a plurality of atoms other than carbon in the ring, such as a furanyl group, a thiophenyl group, a pyridyl group, a quinolinyl group, an isoquinolinyl group, a pyrazinyl group, a pyrimidyl group, a naphthyridyl group, a benzofuranyl group, a benzothiophenyl group, an indolyl group, dibenzofuranyl group, a dibenzothiophenyl group, or a carbazolyl group, and this may be unsubstituted or substituted. The number of carbon atoms in the heteroaryl group is not particularly limited, but is usually in a range of 2 or more and 30 or less.

The halogen atom denotes fluorine, chlorine, bromine or iodine.

The carbonyl group, the carboxyl group, the oxycarbonyl group, the carbamoyl group, the amino group, and the phosphine oxide group may or may not have a substituent, and examples of the substituent include an alkyl group, a cycloalkyl group, an aryl group, and a heteroaryl group, and these substituents may be further substituted.

The silyl group denotes a functional group having a bond with a silicon atom, such as a trimethylsilyl group, and this may or may not have a substituent. The number of carbon atoms in the silyl group is not particularly limited, but is usually in a range of 3 or more and 20 or less. In addition, the number of silicon is usually in a range of 1 or more and 6 or less.

The arylene group denotes a divalent group derived from an aromatic hydrocarbon group, such as a phenyl group, a naphthyl group, a biphenyl group, a phenanthryl group, a terphenyl group, or a pyrenyl group, and this may or may not have a substituent. The number of carbon atoms in the arylene group is not particularly limited, but is usually in a range of 6 or more and 40 or less. When $L^1$ and $L^2$ in the general formula (1) are each an arylene group, the arylene group may or may not have a substituent, and the number of carbon atoms including a substituent is in a range of 6 or more and 60 or less.

When adjacent substituents form a ring, arbitrary adjacent two substituents (e.g., $R^2$ and $R^3$ in the general formula (1)) can be bound to each other to form a conjugated or non-conjugated fused ring. The fused ring may contain nitrogen, oxygen, sulfur, phosphorus and silicon atoms in addition to carbon as a constituent element of the fused ring, and may be further fused with another ring.

The aromatic heterocyclic group containing electron-accepting nitrogen denotes a cyclic aromatic group having at least one or a plurality of electron-accepting nitrogen atoms as an atom other than carbon in the ring, among the heteroaryl groups, such as a pyridyl group, a quinolinyl group, an isoquinolinyl group, a quinoxanyl group, a pyrazinyl group, a pyrimidyl group, a pyridazinyl group, a phenanthrolinyl group, an imidazopyridyl group, a triazyl group, an acridyl group, a benzoimidazolyl group, a benzooxazolyl group, and a benzothiazolyl group. The aromatic heterocyclic group containing electron-accepting nitrogen may be unsubstituted or substituted. The number of electron-accepting nitrogen contained in the aromatic heterocyclic group containing electron-accepting nitrogen is not particularly limited, but is usually in a range of 1 or more and 3 or less. In addition, when the aromatic heterocyclic group containing electron-accepting nitrogen is substituted, the substituent is not particularly limited, but examples thereof include an alkyl group, an aryl group, and a heteroaryl group.

The electron-accepting nitrogen refereed herein represents a nitrogen atom which forms a multiple bond between adjacent atoms. Since a nitrogen atom has high electronegativity, the multiple bond has an electron-accepting nature. For this reason, the aromatic heterocyclic ring containing electron-accepting nitrogen has high electron affinity. The pyrene compound of the present invention having electron-accepting nitrogen makes easy acceptance of electrons from a cathode having high electron affinity, and lower voltage driving becomes possible. In addition, since supply of electrons to an emissive layer is increased and a recombining probability is increased, a luminance efficiency is increased. The number of carbon atoms in the aromatic heterocyclic group containing electron-accepting nitrogen is not particularly limited, but is usually in a range of 2 or more and 30 or less. The connecting position of the aromatic heterocyclic group containing electron-accepting nitrogen may be any position and, for example, in the case of a pyridyl group, the position may be any of a 2-pyridyl group, a 3-pyridyl group or a 4-pyridyl group.

Among the aforementioned substituents, preferable examples of X include a methyl group, an ethyl group, a n-propyl group, an isopropyl group, a n-butyl group, a sec-butyl group, a tert-butyl group, an adamantyl group, a phenyl group, a naphthyl group, a biphenyl group, a terphenyl group, a pyridyl group, a quinolinyl, a pyrazinyl group, a naphthyridyl group, a benzofuranyl group, and a benzothiophenyl group.

In addition, $L^1$ and $L^2$ are each independently preferably a phenylene group or a naphthylene group. More specific examples thereof include a 1,4-phenylene group, a 1,3-phenylene group, a 2,6-naphthylene group, and a 2,8-naphthylene group, more preferably a 1,4-phenylene group etc.

$Ar^1$ is preferably a pyridyl group, a quinolinyl group, an isoquinolinyl group, a quinoxanyl group, a pyrimidyl group, a phenanthrolinyl group, a benzo[d]imidazolyl group, an imidazo[1,2-a]pyridyl group etc. More specific examples thereof include a 2-pyridyl group, a 3-pyridyl group, a 4-pyridyl group, a 2-quinolinyl group, a 3-quinolinyl group, a 6-quinolinyl group, a 1-isoquinolinyl group, a 3-isoquinolinyl group, a 2-quinoxanyl group, a 5-pyrimidyl group, a 2-phenanthrolinyl, group, a 1-benzo[d]imidazolyl group, a 2-benzo[d]imidazolyl group, a 2-imidazo[1,2-a]pyridyl group, and a 3-imidazo[1,2-a]pyridyl group, more preferably a 2-pyridyl group, a 3-pyridyl group etc.

$Ar^2$ is preferably a phenyl group, a naphthyl group, a phenanthryl group, a pyridyl group, a quinolinyl group, a quinoxanyl group, a pyrimidyl group, a phenanthrolinyl group, a benzo[d]imidazolyl group, an imidazo[1,2-a]pyridyl group etc. More specific examples thereof include a phenyl group, a 1-naphthyl group, a 2-naphthyl group, a 9-phenanthryl group, a 2-pyridyl group, a 3-pyridyl group, a 4-pyridyl group, a 2-quinolinyl group, a 3-quinolinyl group, a 6-quinolinyl group, a 2-quinoxanyl group, a 5-pyrimidyl group, a 2-phenanthrolinyl group, a 1-benzo[d]imidazolyl group, a 2-benzo[d]imidazolyl group, a 2-imidazo[1,2-a]pyridyl group, and a 3-imidazo[1,2-a]pyridyl group, more preferably a phenyl group, a 1-naphtyl group, a 2-naphthyl group, a 2-pyridyl group, a 3-pyridyl group etc.

The pyrene compound represented by the general formula (1) has a pyrene skeleton and an aromatic heterocyclic ring containing electron-accepting nitrogen in the molecule. Therefore, it becomes possible to realize both of high electron transporting property and electrochemical stability of the pyrene skeleton and high electron acceptability of the aromatic heterocyclic ring containing electron-accepting nitrogen, and thus, high electron injection transporting ability is exerted.

Further, introduction of a substituent selected from an alkyl group, an aryl group and a heteroaryl group in the 7-position (X) of the pyrene skeleton suppresses interaction between pyrene skeletons, and improves luminance efficiency and thin-film stability.

In addition, inter alia, it is preferable that $L^1$ is an arylene group. Since the aromatic heterocyclic ring containing electron-accepting nitrogen is weak to oxidation, binding via an arylene group rather than direct binding with the pyrene skeleton becomes more stable in electrochemical property. This generates the synergistic effect with high electron transporting property of the pyrene skeleton, and exerts higher electron injection transporting ability.

For synthesis of the pyrene compound represented by the general formula (1), known methods can be used. Examples of a method of introducing the aromatic heterocyclic ring containing electron-accepting nitrogen into the pyrene skeleton include, but are not limited to, a method of using a coupling reaction of a halogenated pyrene derivative and boronic acid or boronic acid ester of the aromatic heterocyclic ring containing electron-accepting nitrogen under a palladium or nickel catalyst.

Examples of a method of introducing an alkyl group into the 7-position of the pyrene skeleton include a method using the Friedel-Crafts reaction with halogenated alkyls such as t-BuCl, or a reduction reaction of pyrenecarboxyaldehyde derivative or pyrenecarboxylic acid derivative, in the presence of Lewis acids such as $AlCl_3$. In addition, examples of a method of introducing an aryl group or a heteroaryl group into the 7-position of the pyrene skeleton include, but are not limited to, a method of introducing boronic acid ester into the 2-position of pyrene under an iridium catalyst and, thereafter, using a coupling reaction of pyreneboronic acid ester and halogenated aryl or halogenated heteroaryl under a palladium or nickel catalyst.

The pyrene compound represented by the general formula (1) is not particularly limited, but specifically the following examples are exemplified.

[Chemical formula 3]

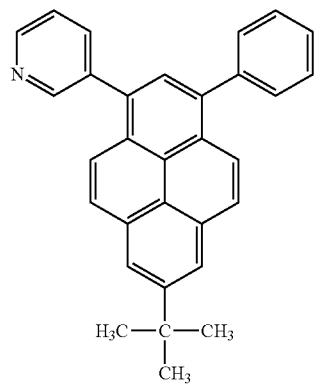

[1]

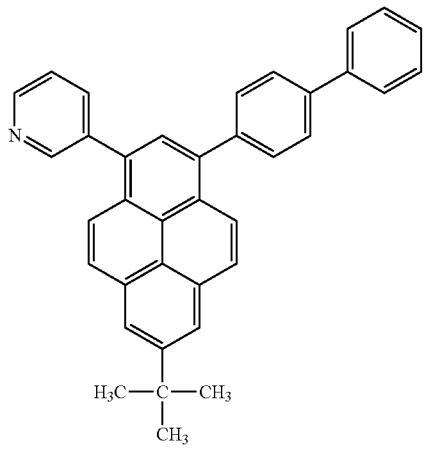

[2]

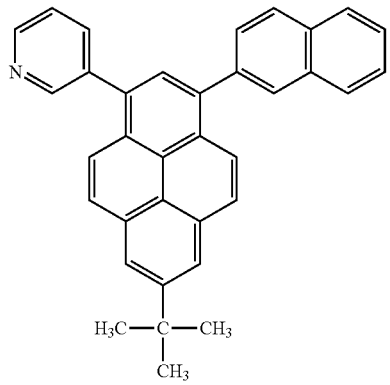

[3]

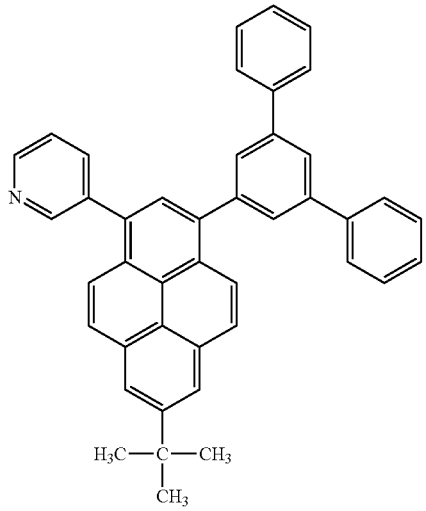

[4]

-continued
[5]
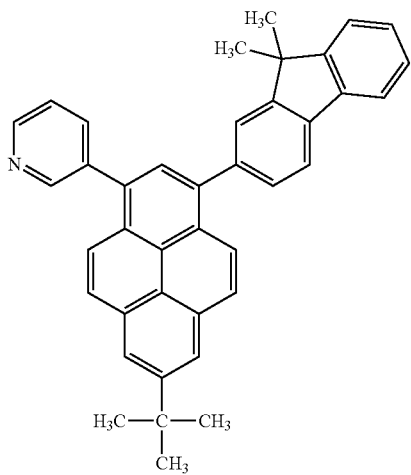
[6]
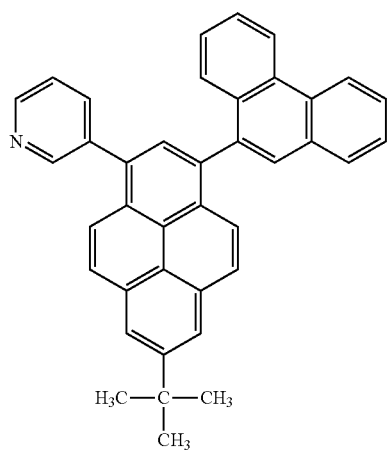
[7]
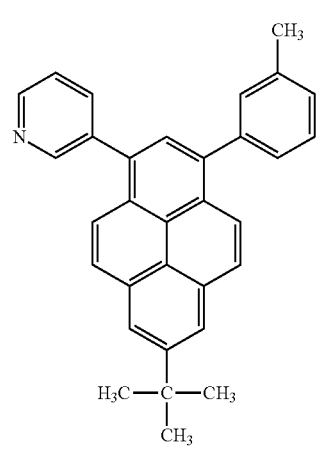
[8]
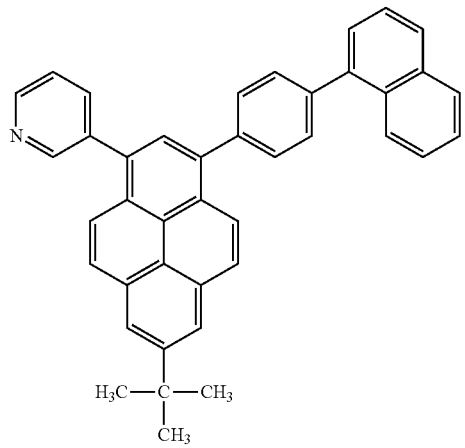
[9]
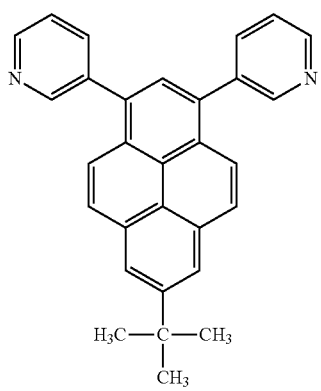
[10]
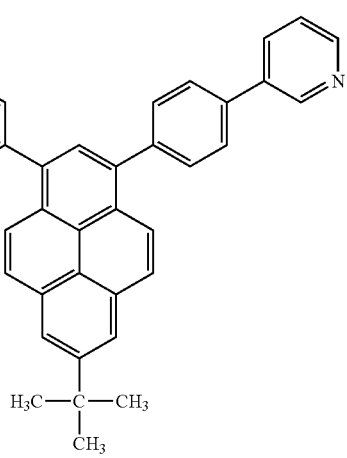

-continued
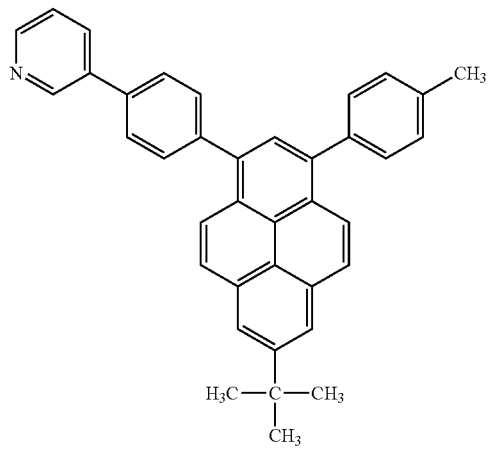
[11]
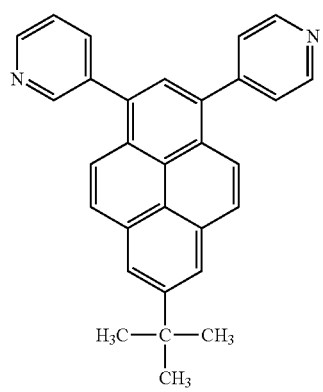
[12]
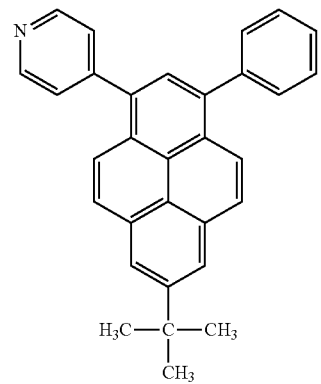
[13]
-continued
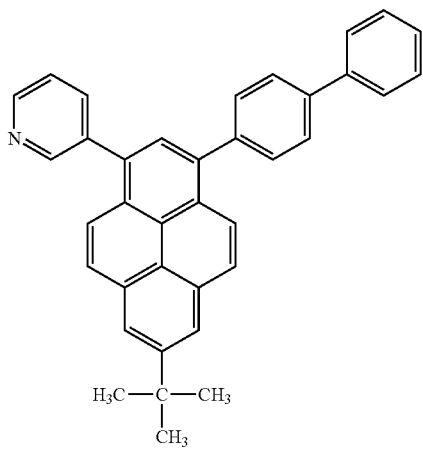
[14]
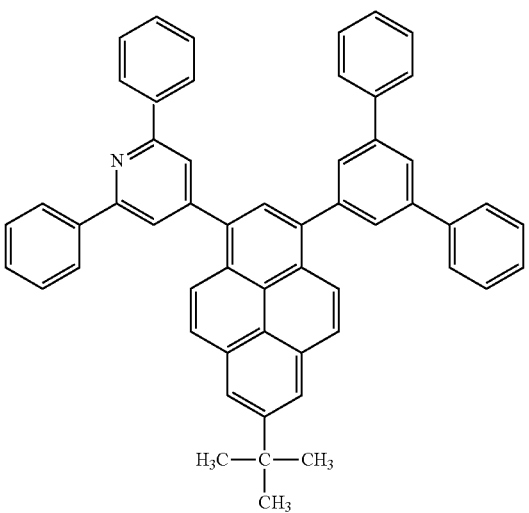
[15]
[Chemical formula 4]
[16]

-continued
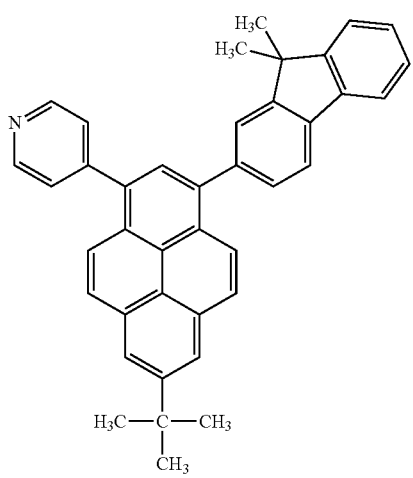
[17]
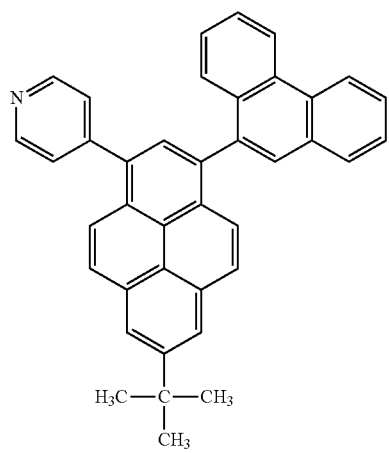
[18]
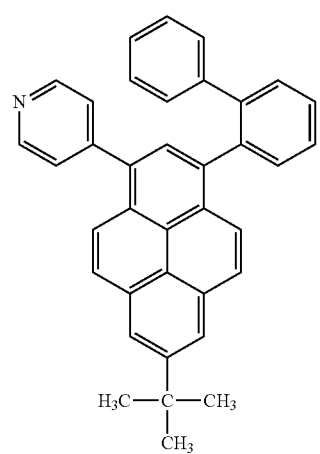
[19]
-continued
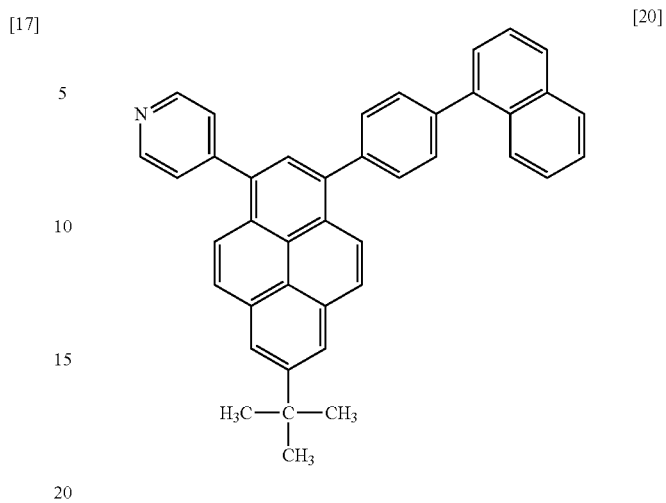
[20]
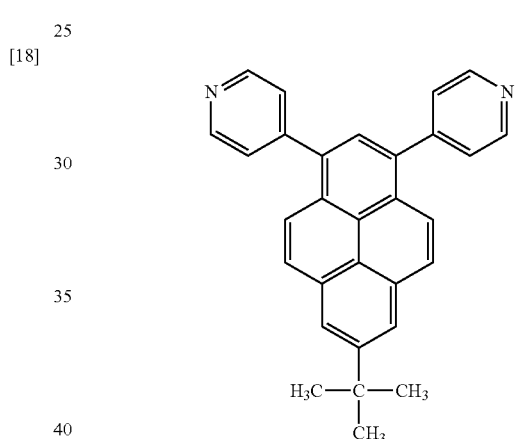
[21]
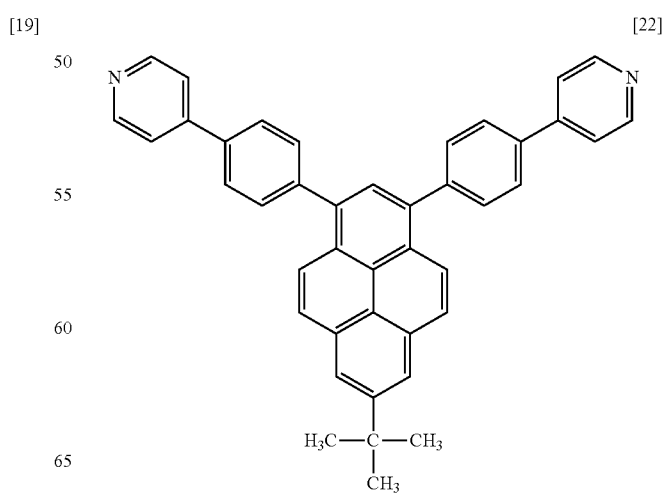
[22]

-continued

[23]

[24]

[25]

[26]

[27]

[28]

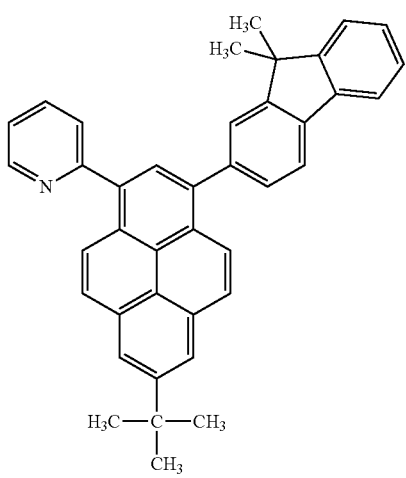
[29]
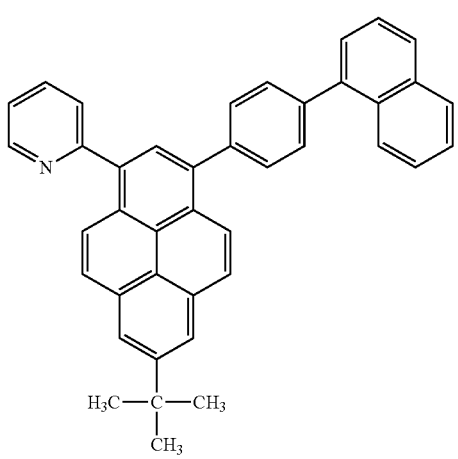
[32]
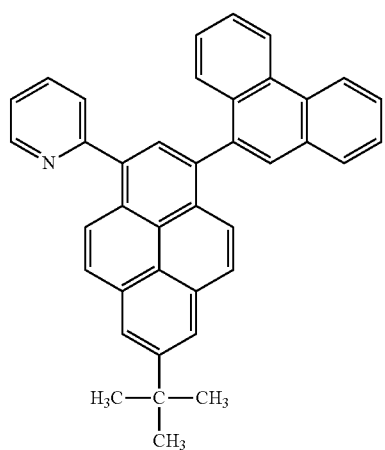
[30]
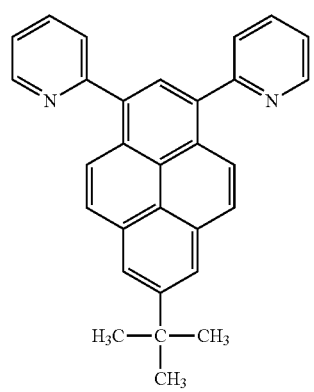
[33]
[Chemical formula 5]
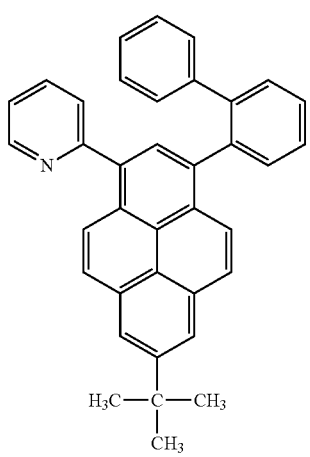
[31]
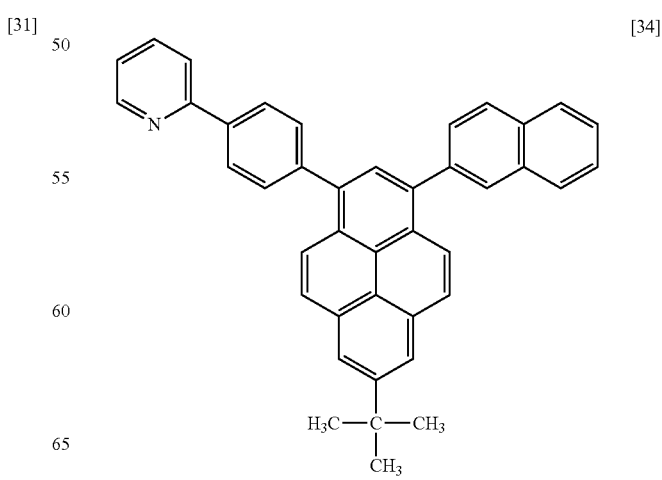
[34]

-continued
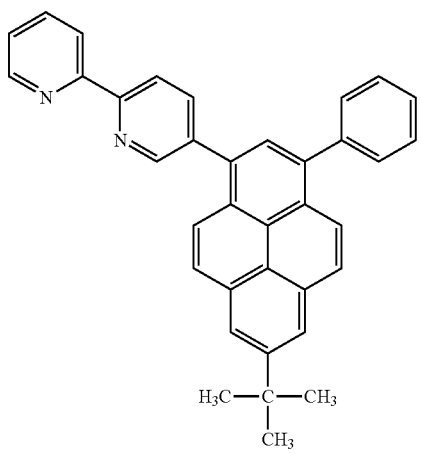
[35]
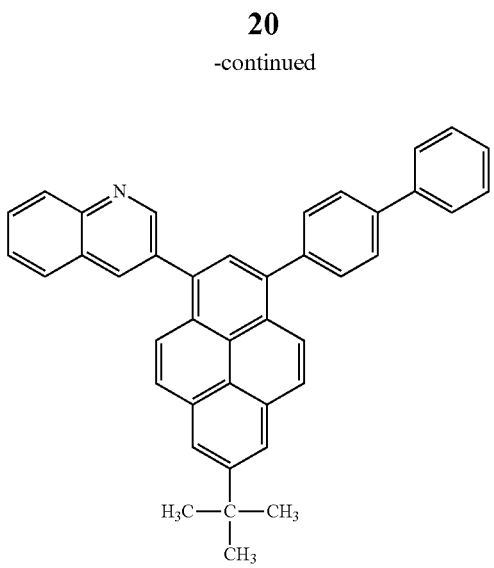
[38]
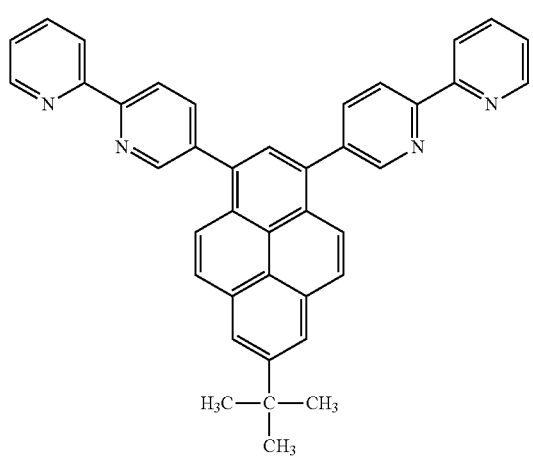
[36]
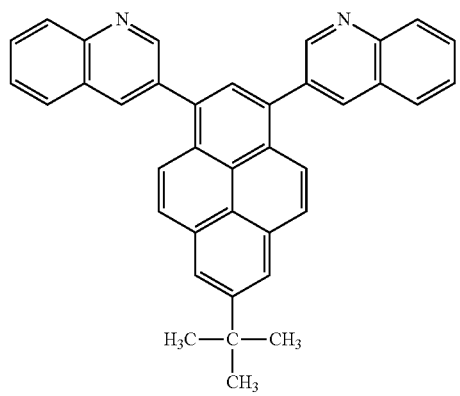
[39]
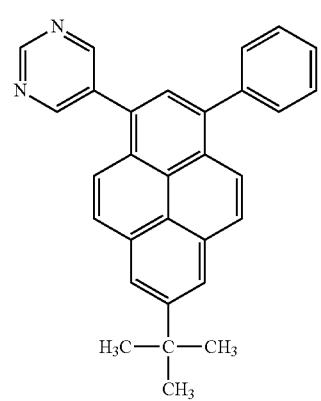
[37]
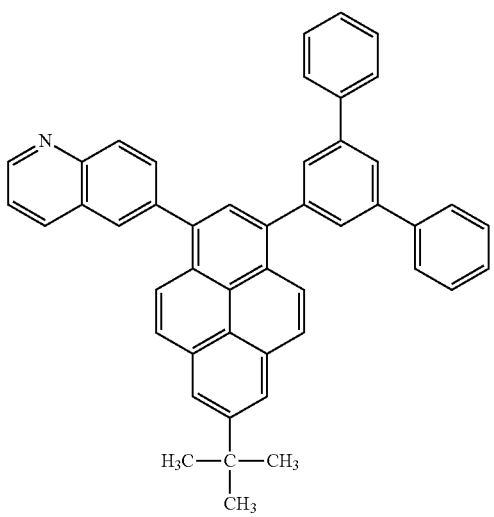
[40]

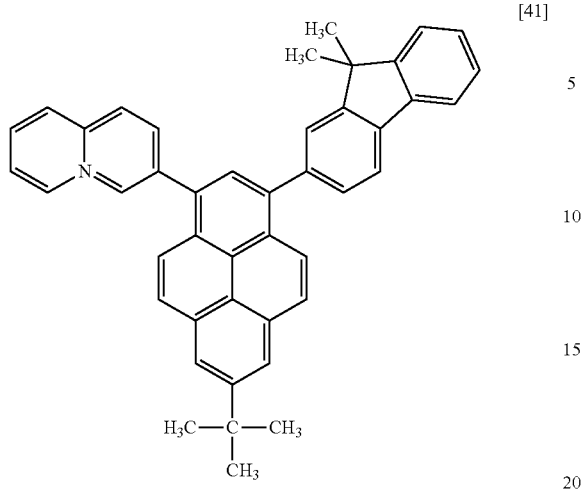
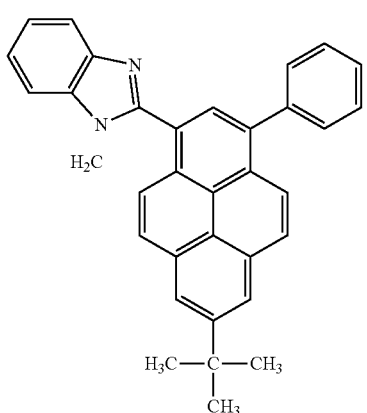
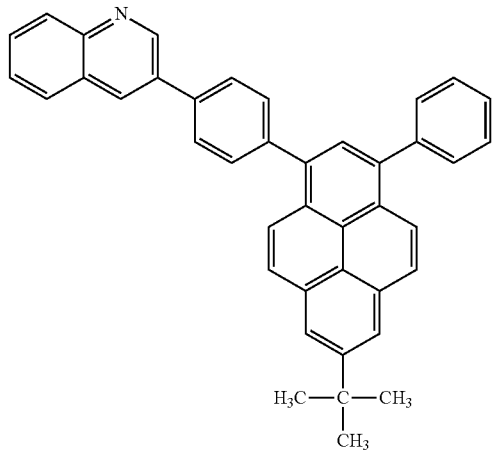
[Chemical formula 6]
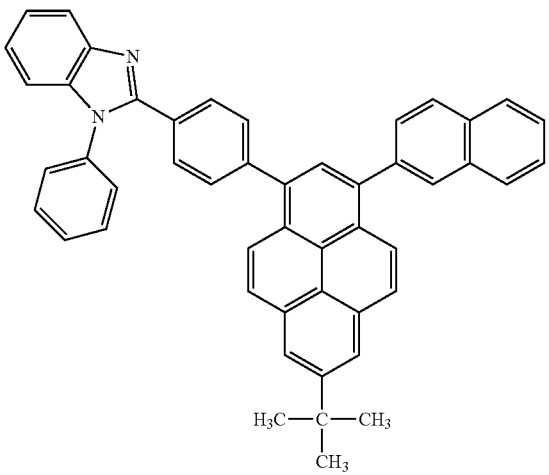

[47]
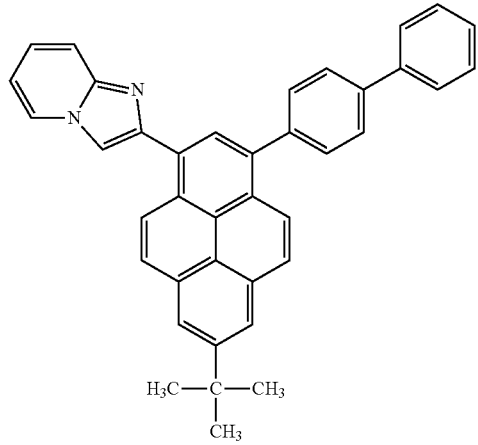
[50]
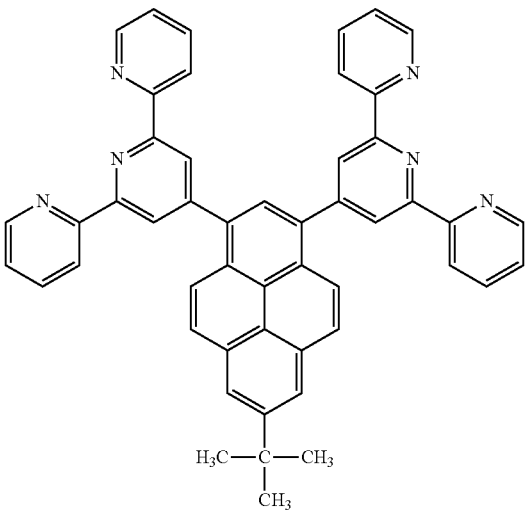
[48]
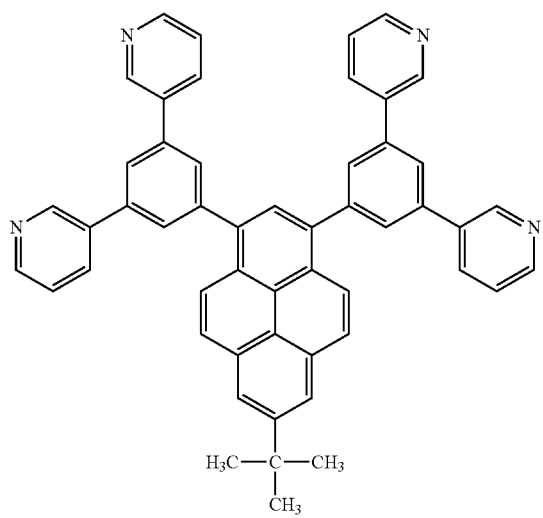
[51]
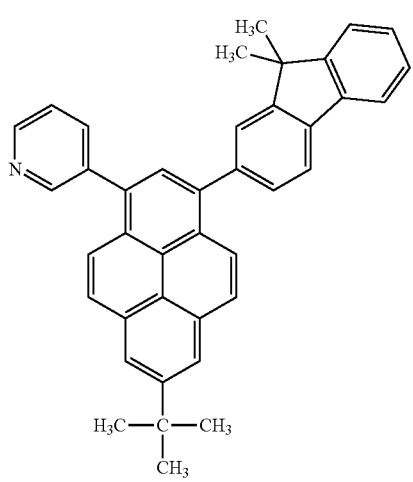
[49]
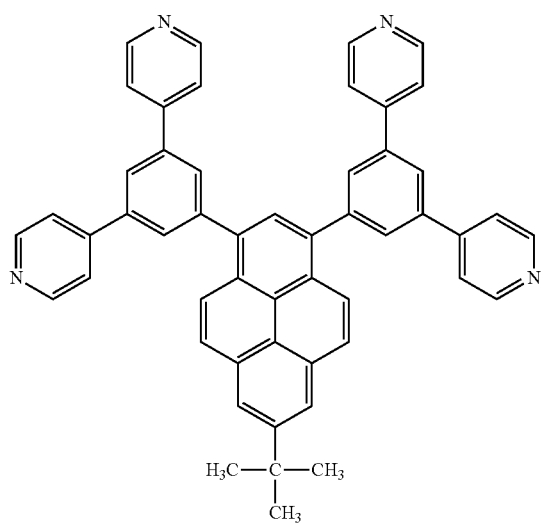
[52]
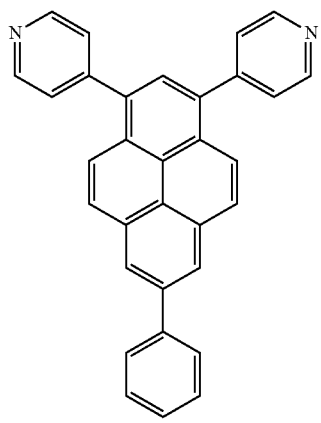

[53]
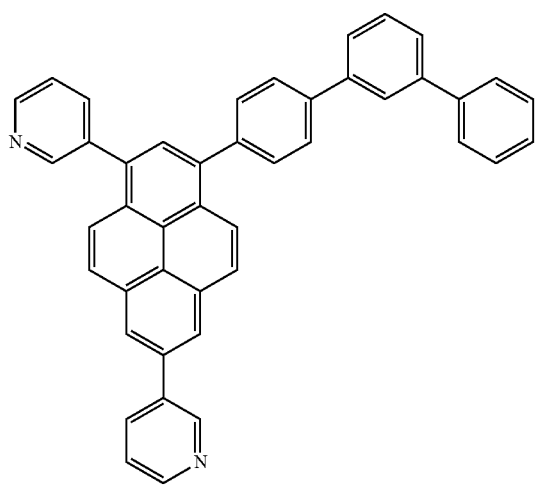
[56]
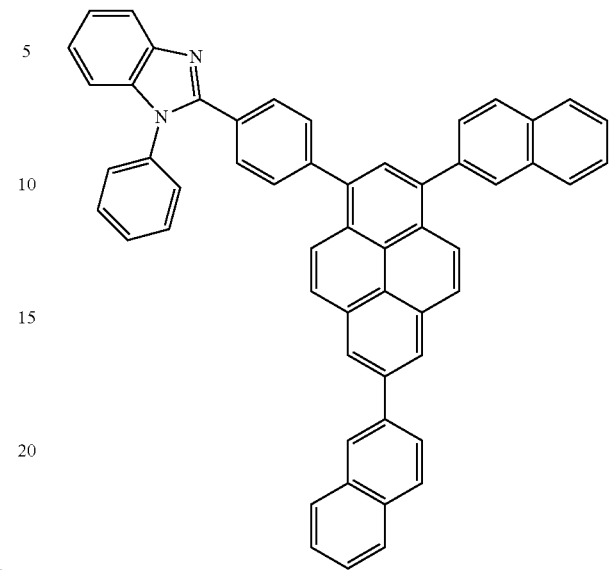
[54]
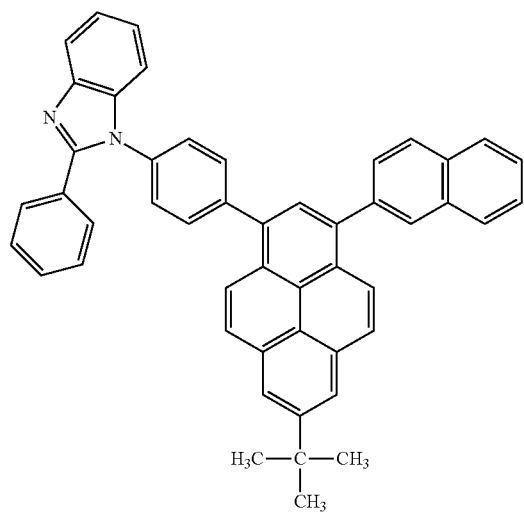
[57]
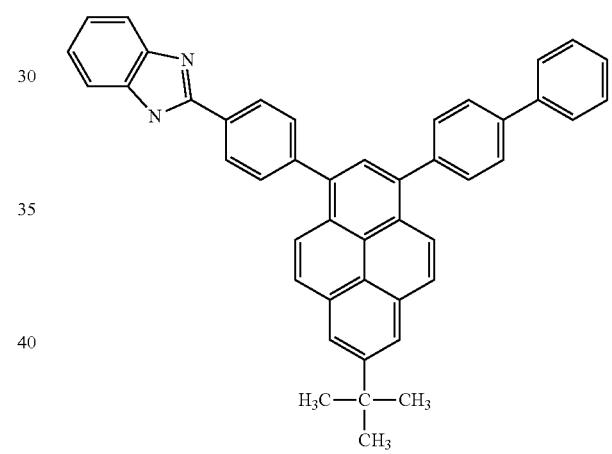
[55]
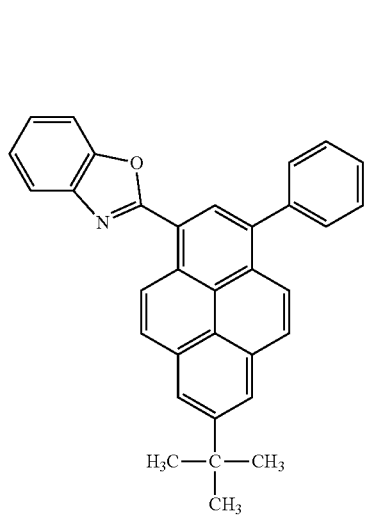
[58]
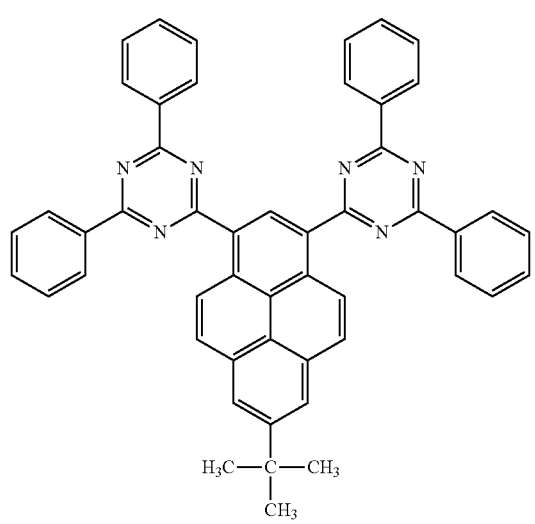

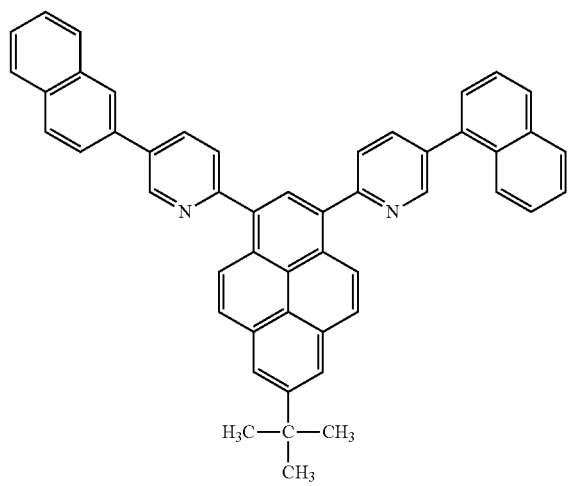
[59]
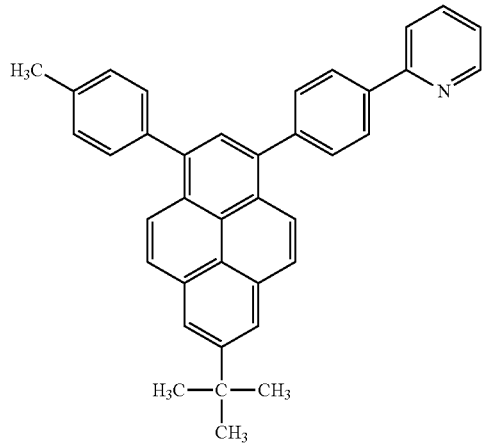
[62]
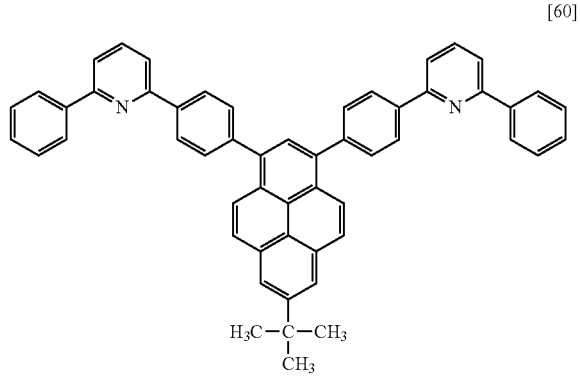
[60]
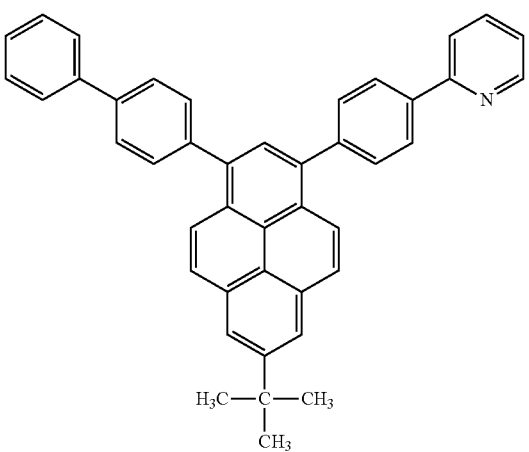
[63]
[Chemical formula 7]
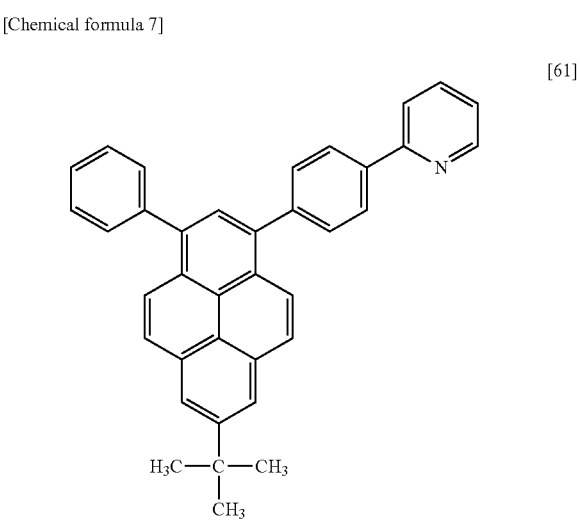
[61]
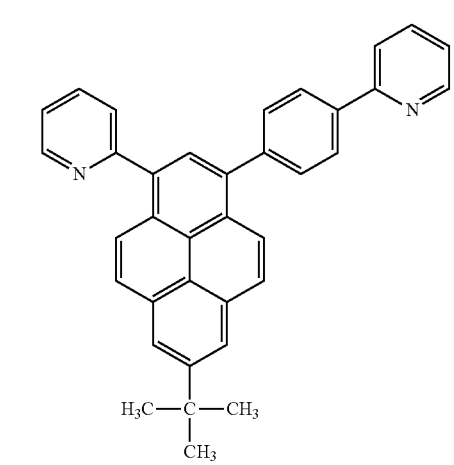
[64]

-continued
[65]
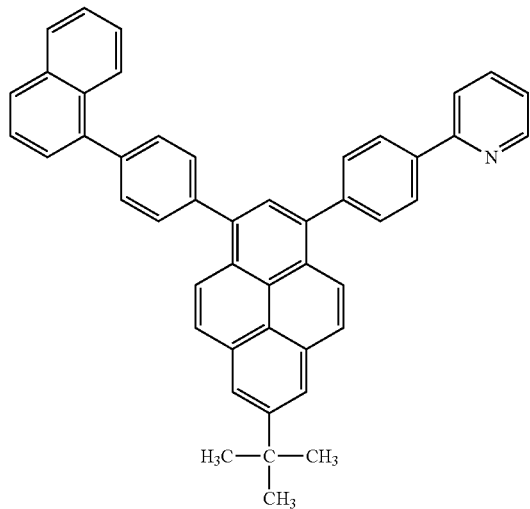
[66]
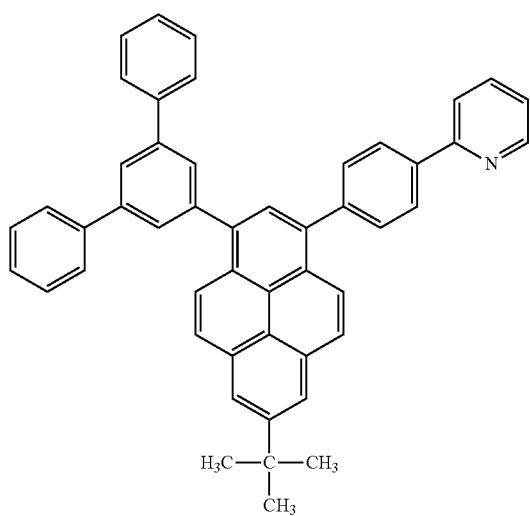
[67]
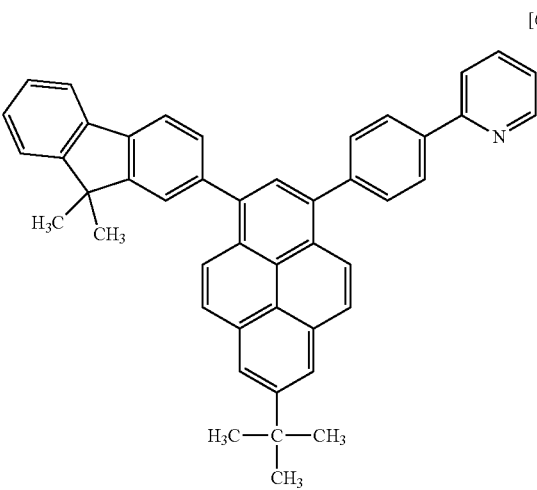
-continued
[68]
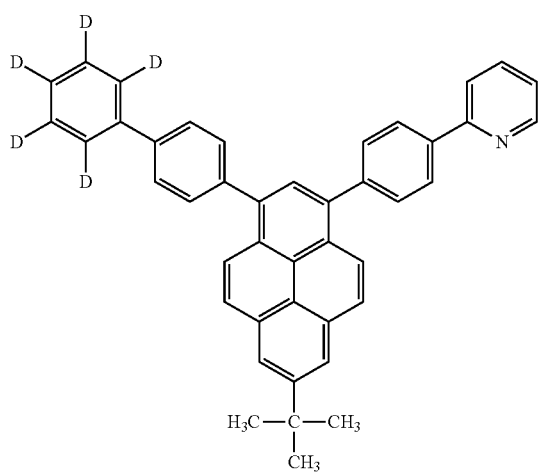
[69]
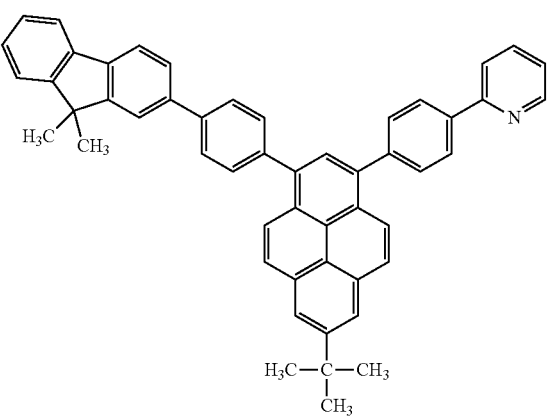
[70]
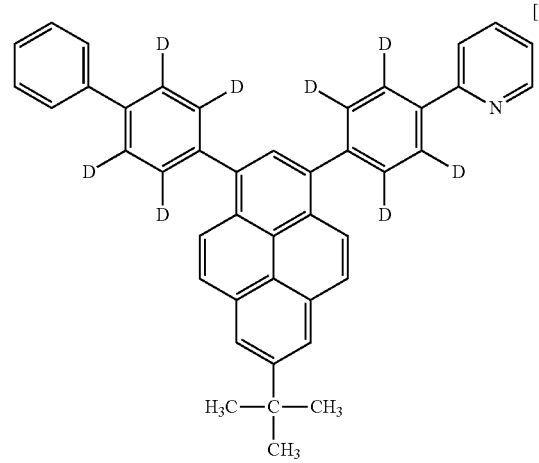

[71]
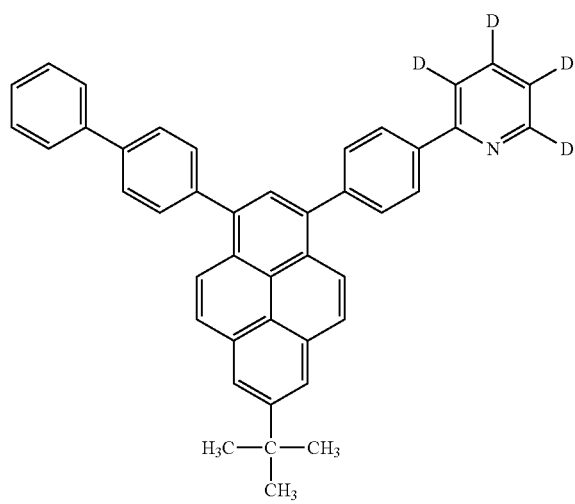
[74]
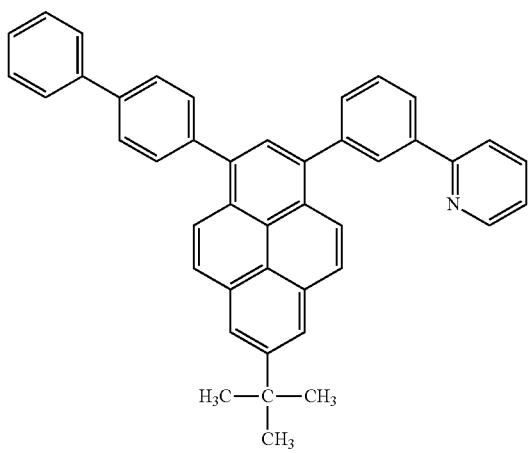
[72]
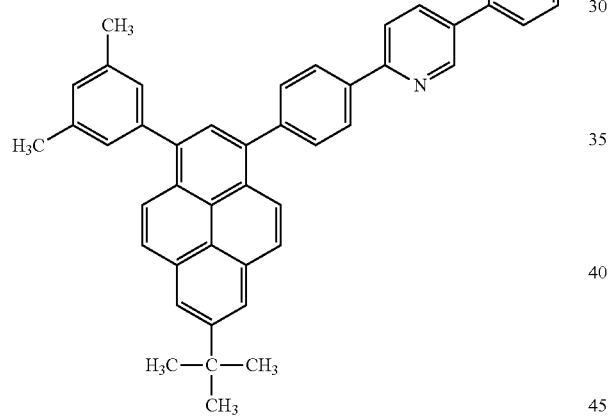
[75]
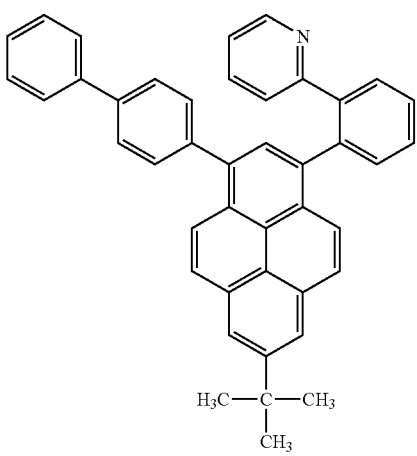
[Chemical formula 8]
[73]
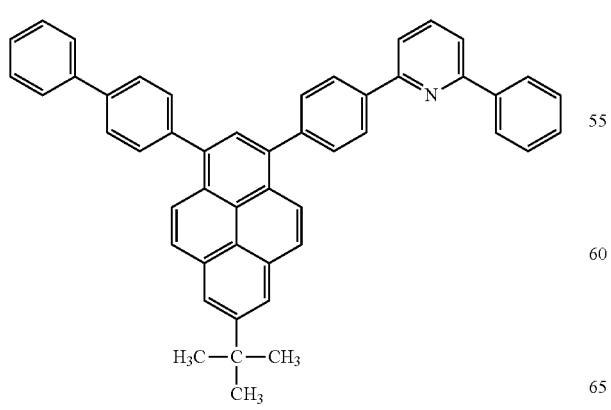
[76]
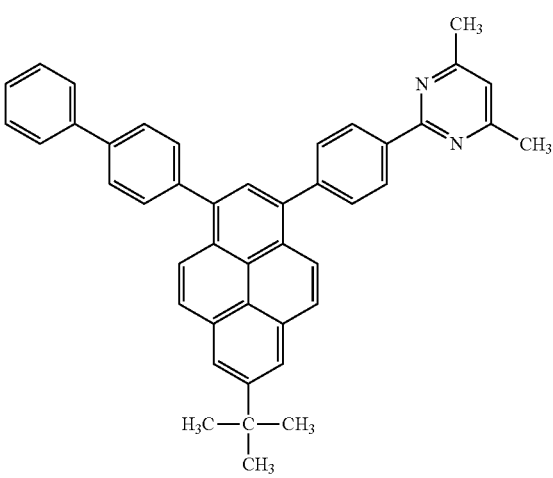

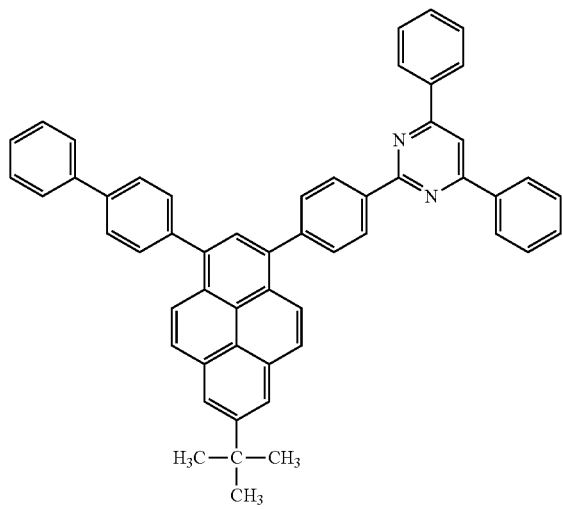
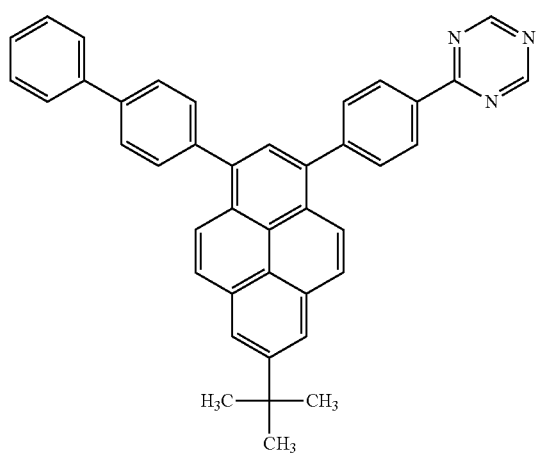

35
-continued
[83]
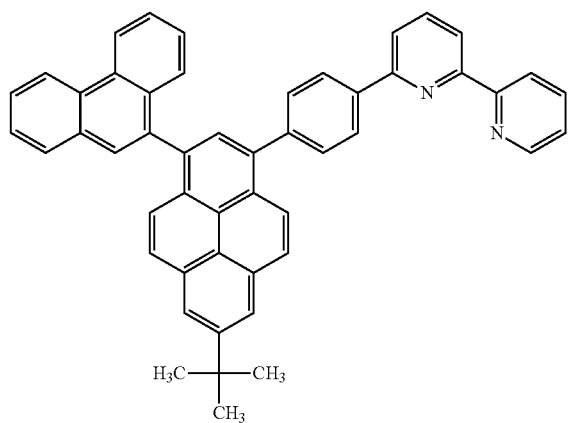
[84]
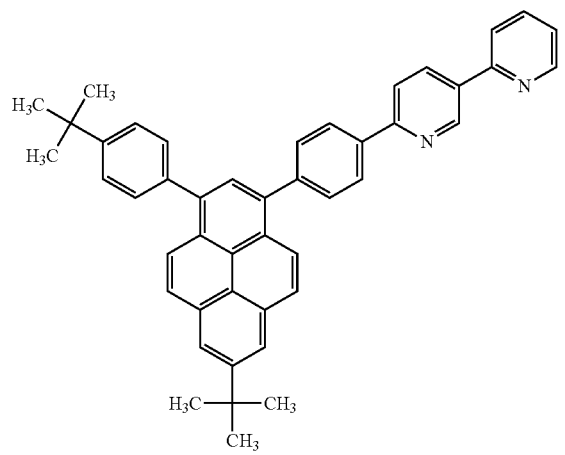
[85]
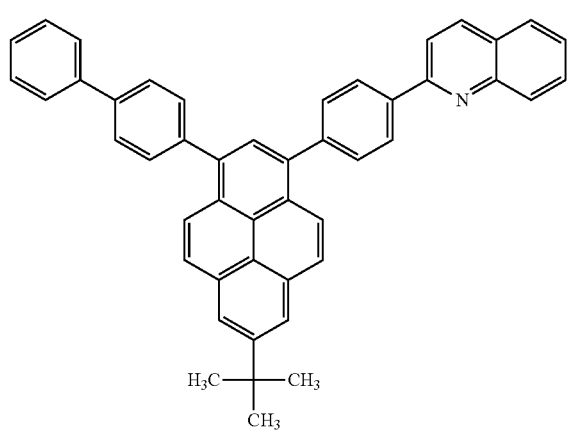
36
-continued
[86]
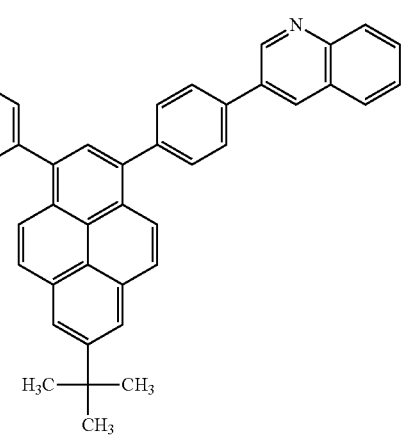
[87]
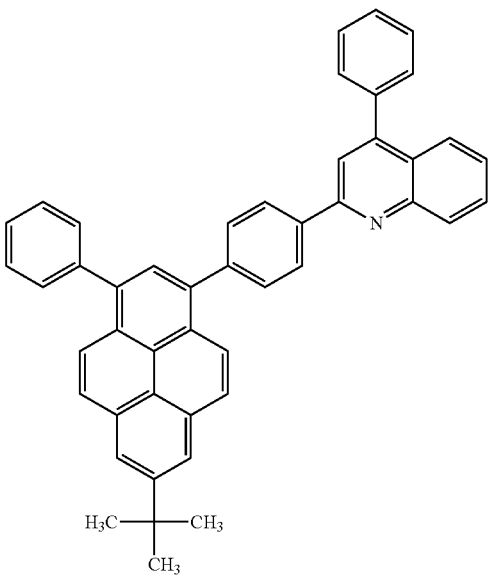
[88]
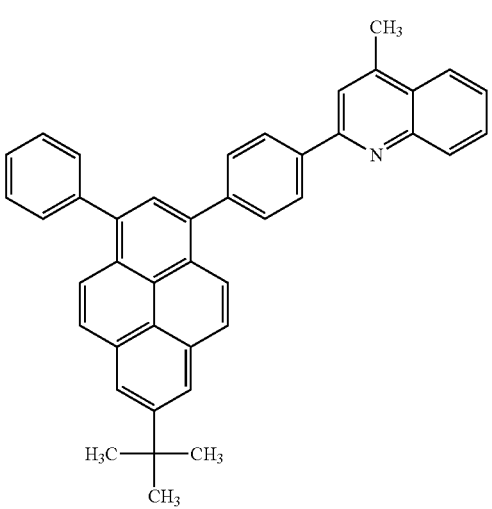

-continued
[89]
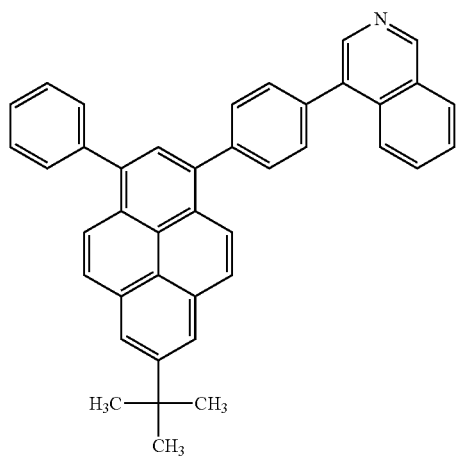
[90]
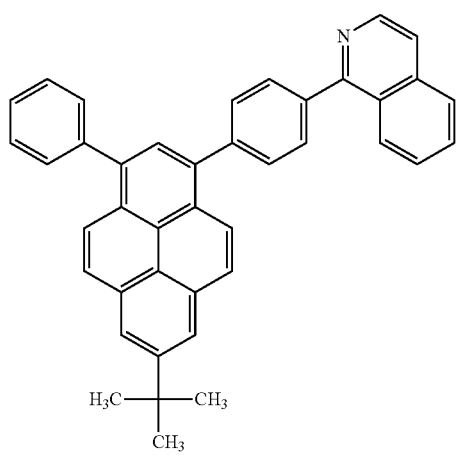
[Chemical formula 9]
[91]
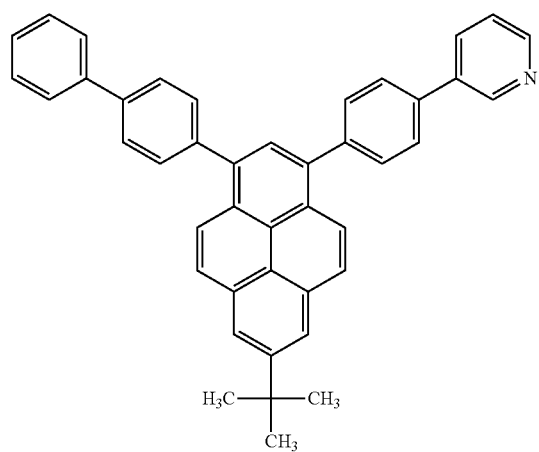
-continued
[92]
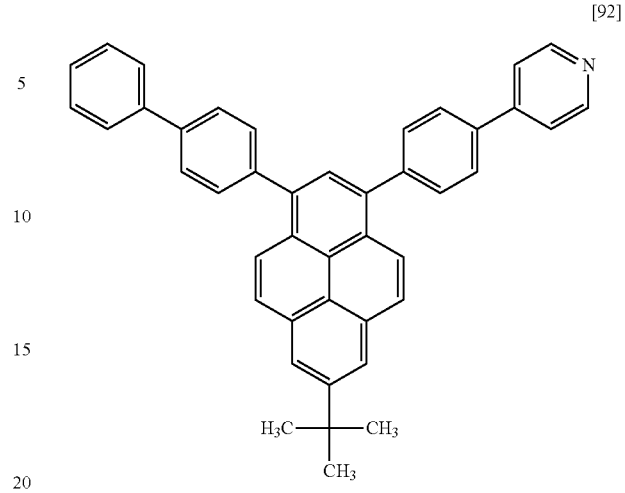
[93]
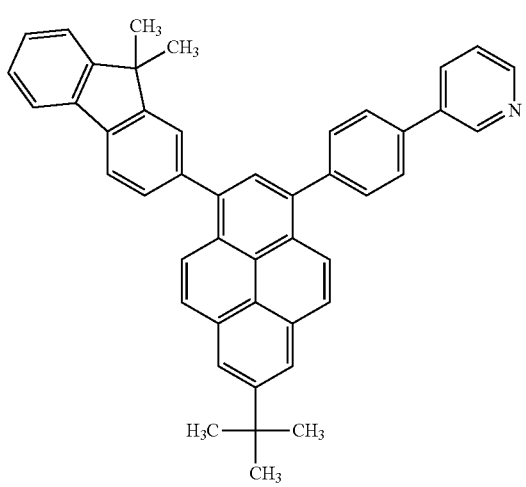
[94]
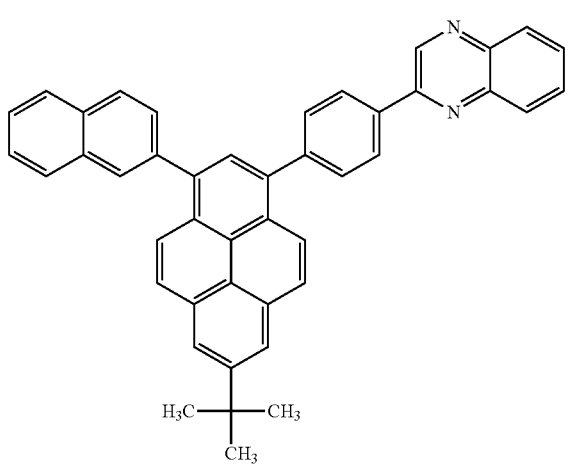

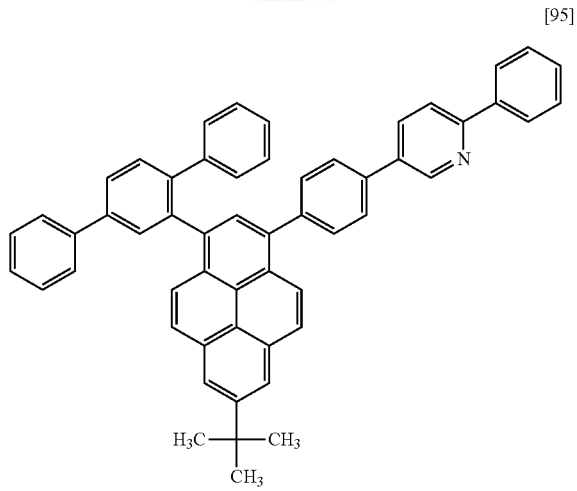
[95]
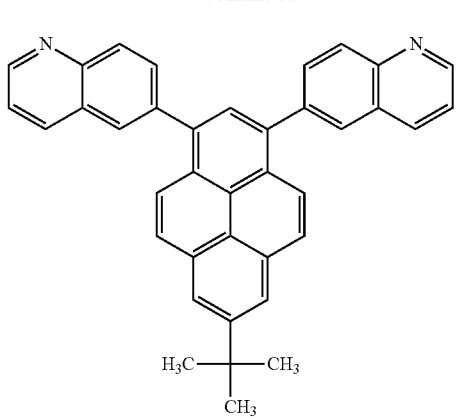
[98]
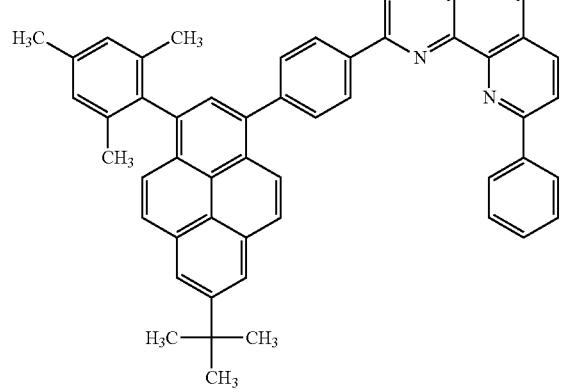
[96]
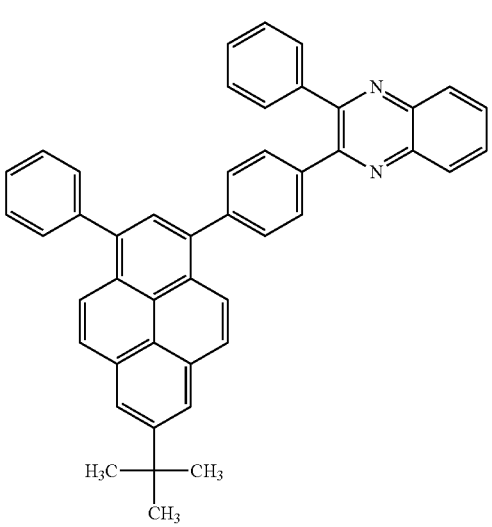
[99]
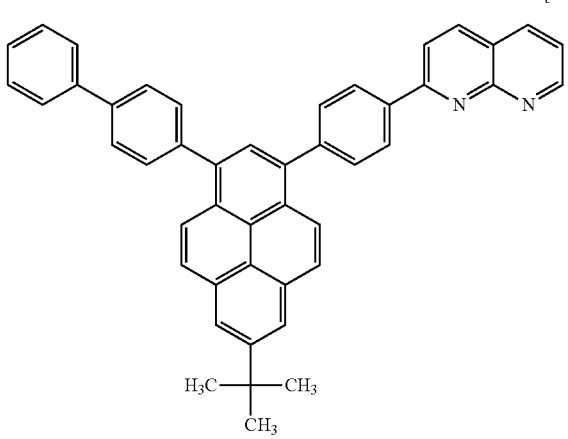
[97]
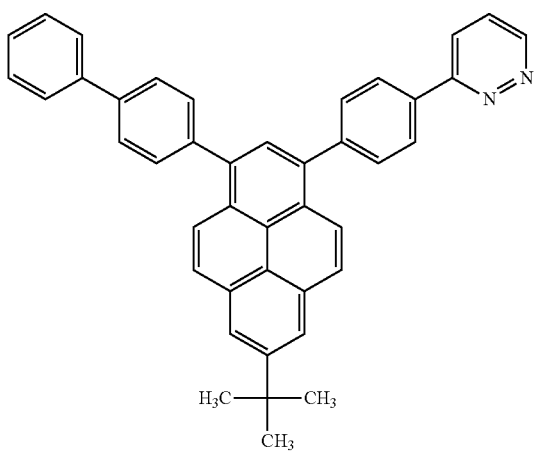
[100]

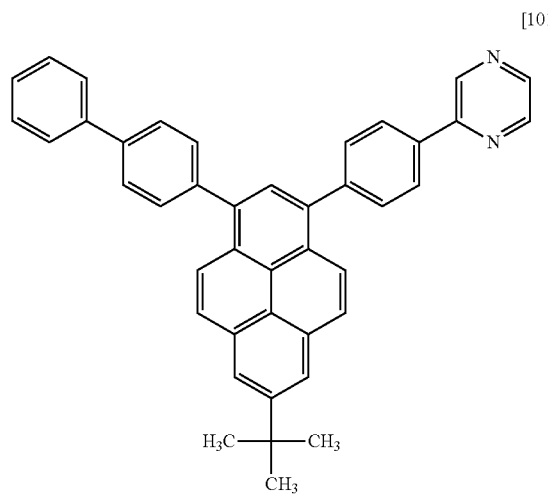
[101]
[102]
[103]
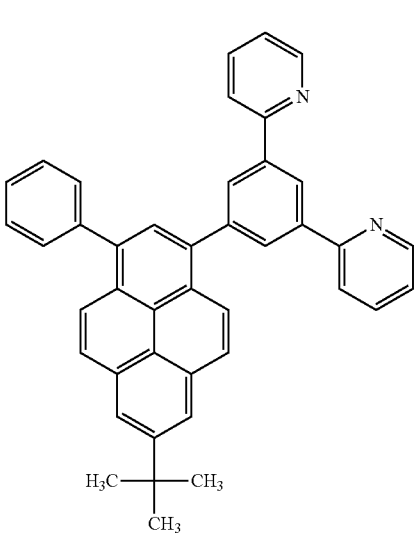
[104]
[105]
[Chemical formula 10]
[106]

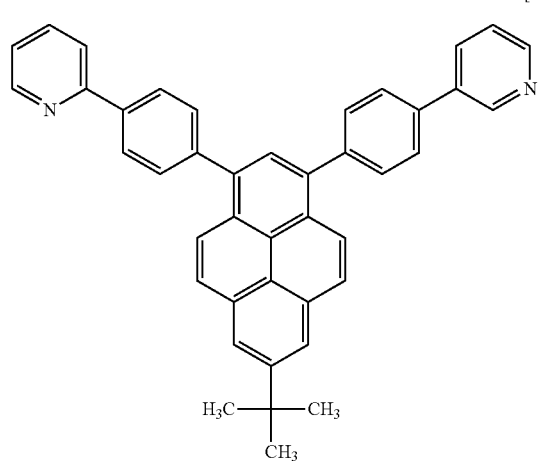
[107]
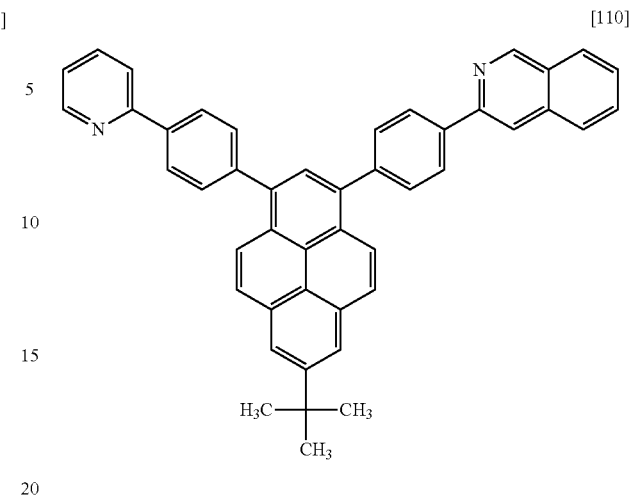
[110]
[108]
[111]
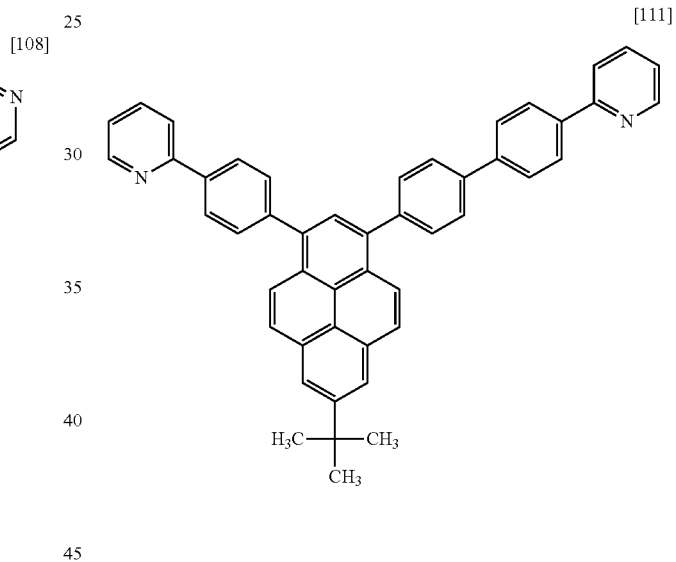
[109]
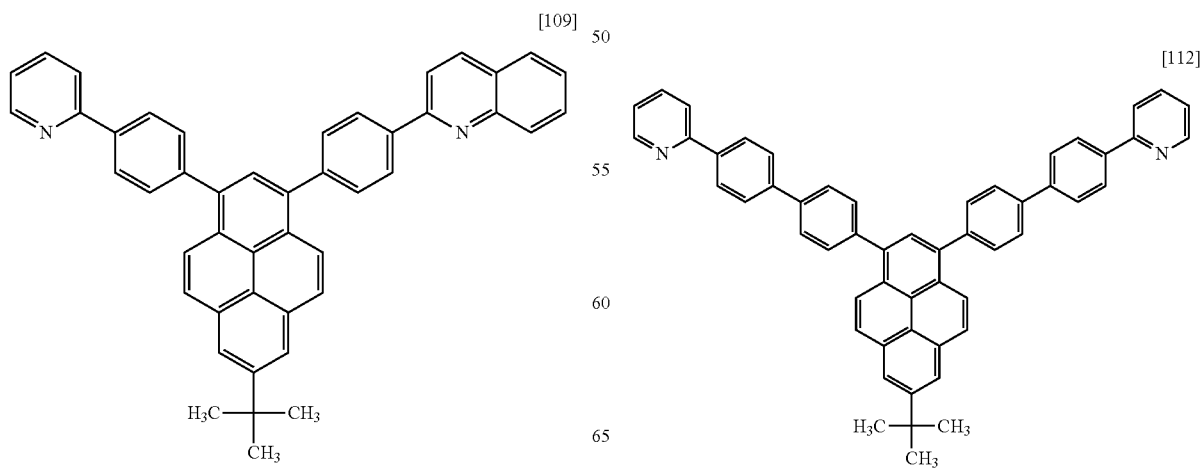
[112]

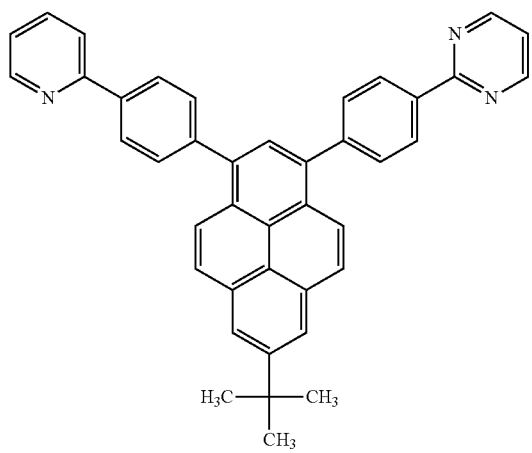
[113]
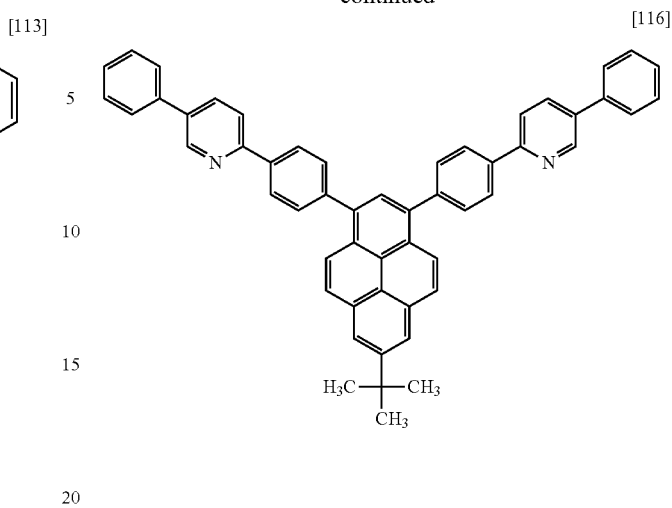
[116]
[114]
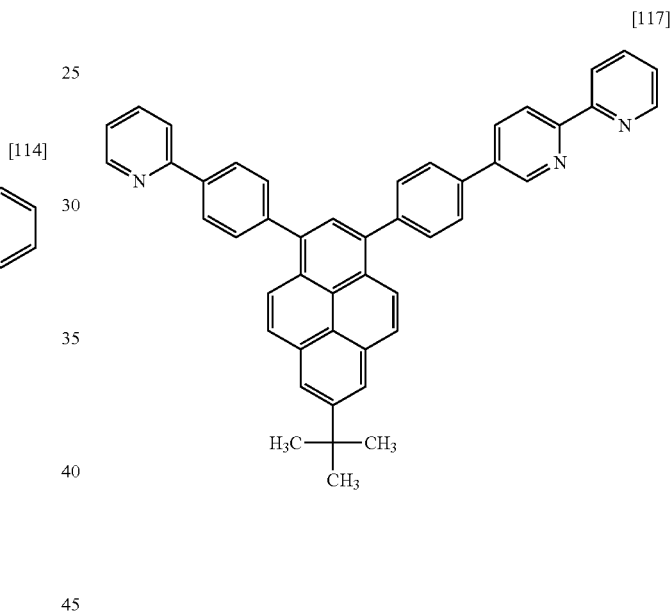
[117]
[115]
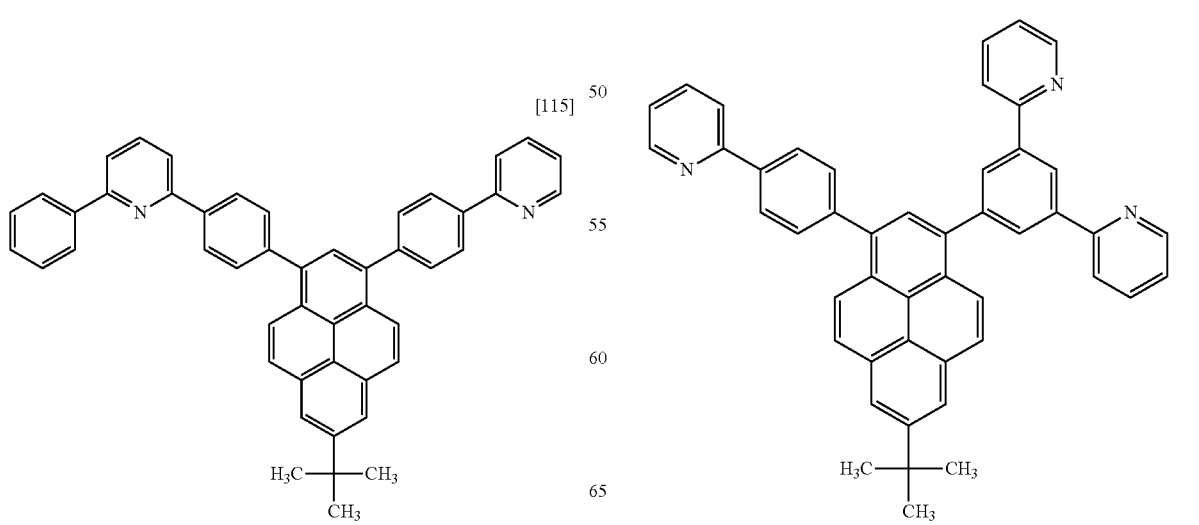
[118]

[119]
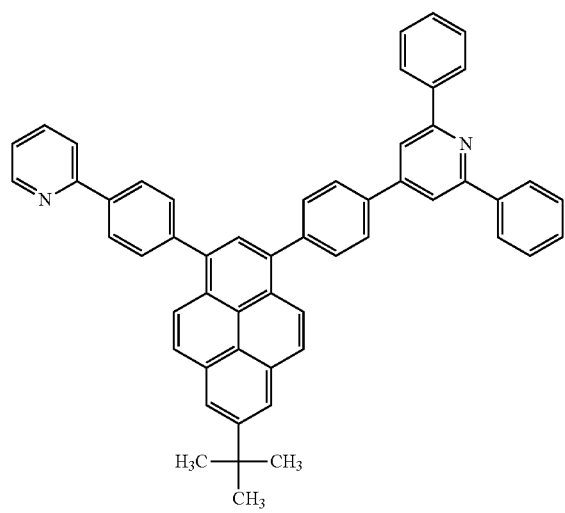
[120]
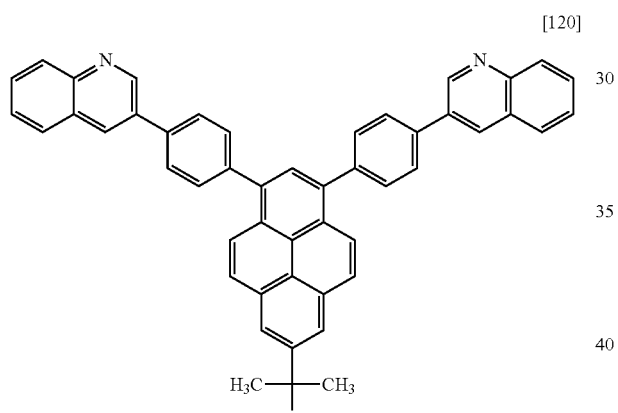
[Chemical formula 11]
[121]
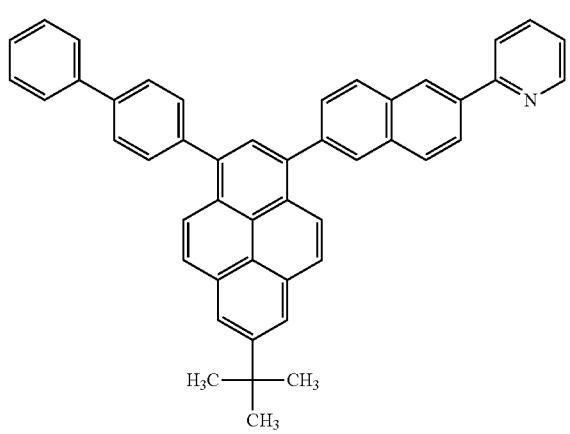
[122]
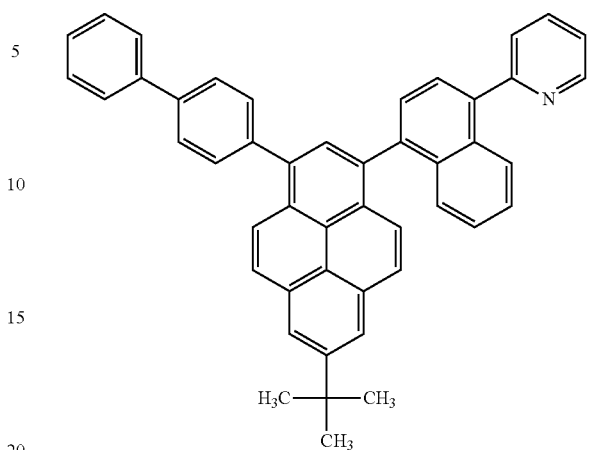
[123]
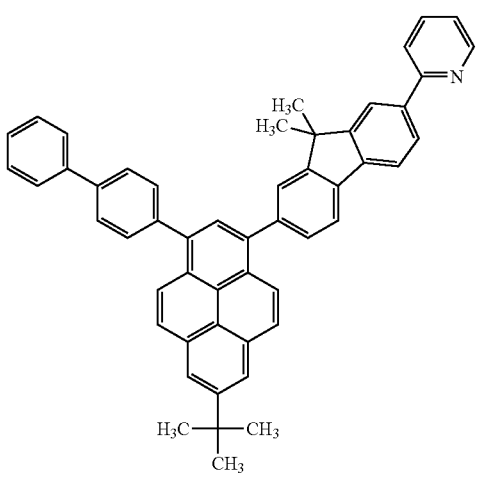
[124]
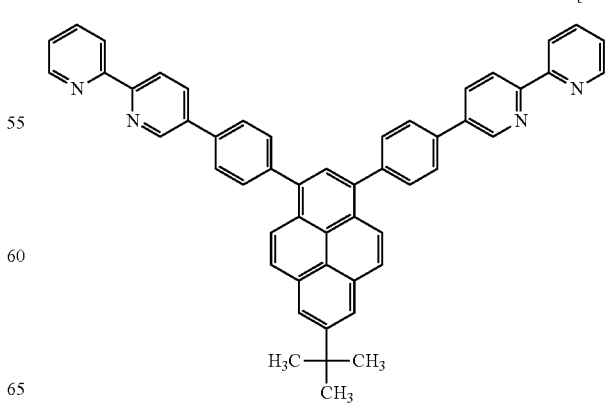

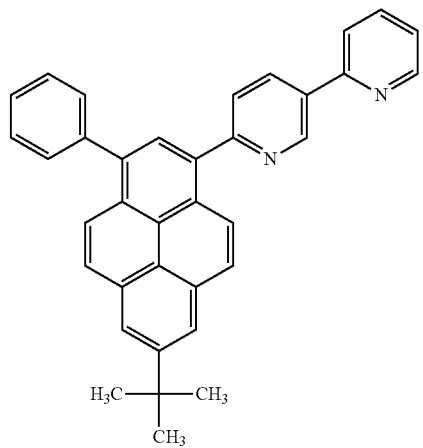
[125]
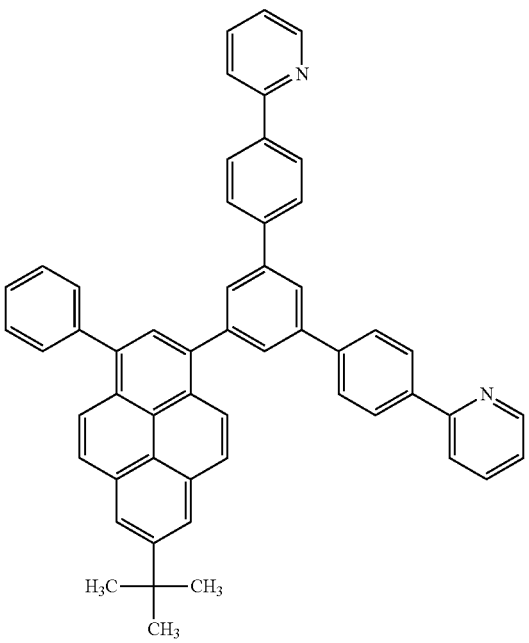
[128]
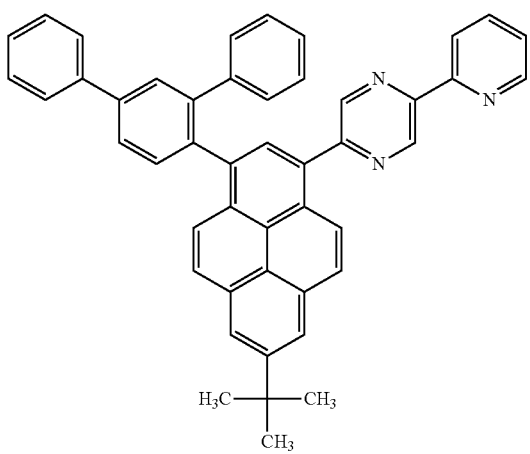
[126]
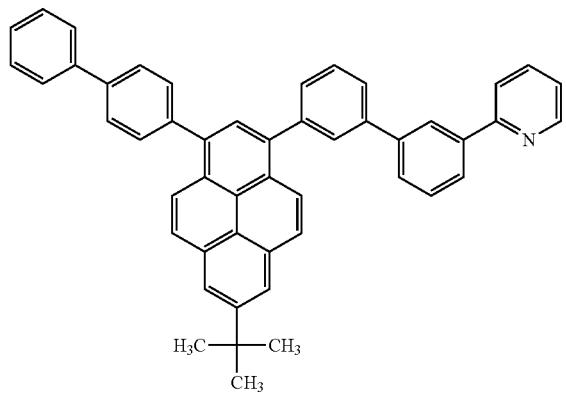
[129]
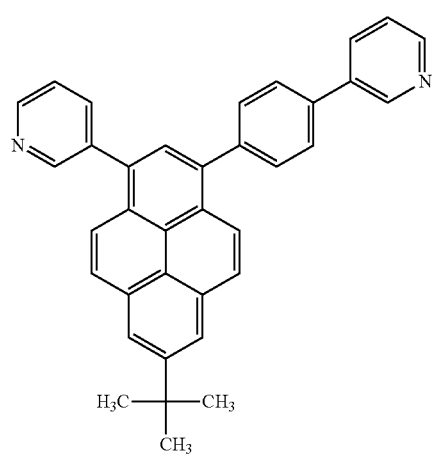
[127]
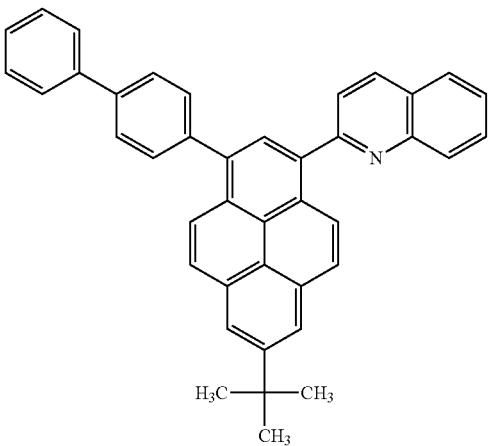
[130]

[131]
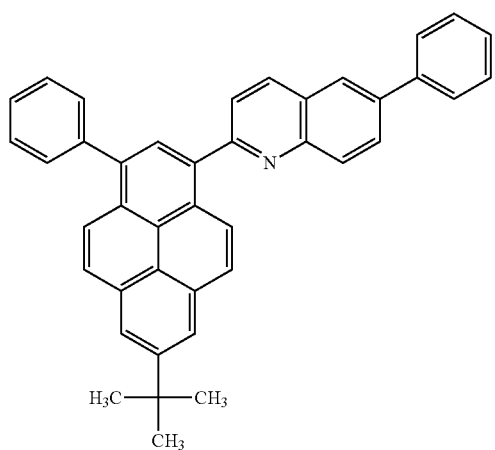
[134]
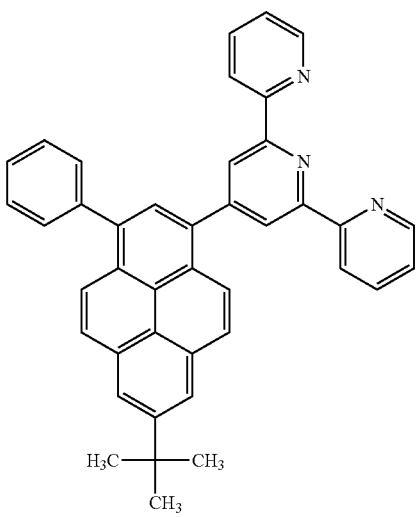
[132]
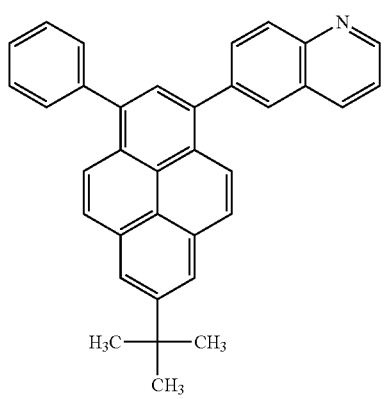
[135]
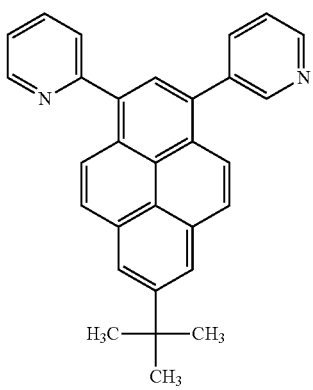
[Chemical formula 12]
[133]
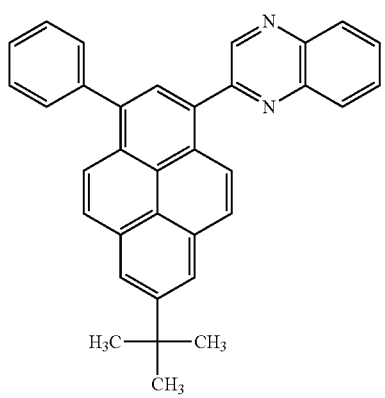
[136]
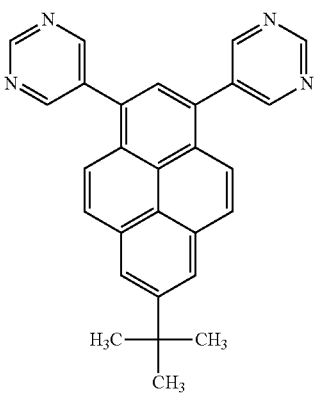

[137]
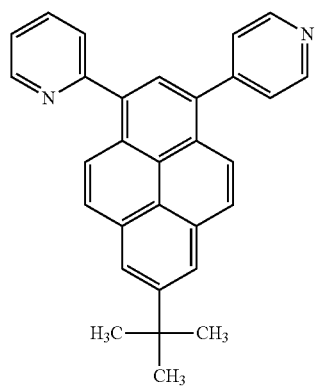
[138]
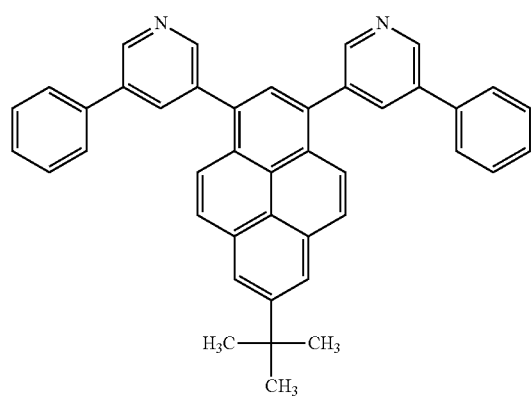
[139]
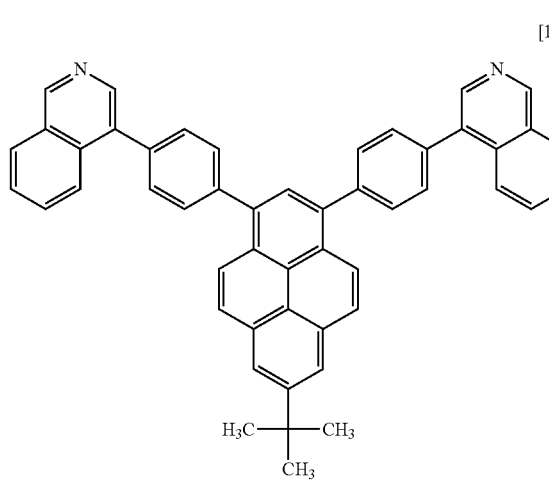
[140]
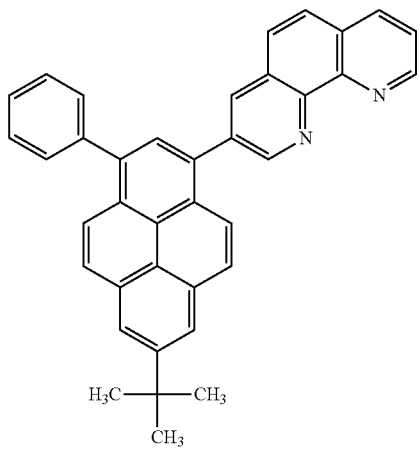
[141]
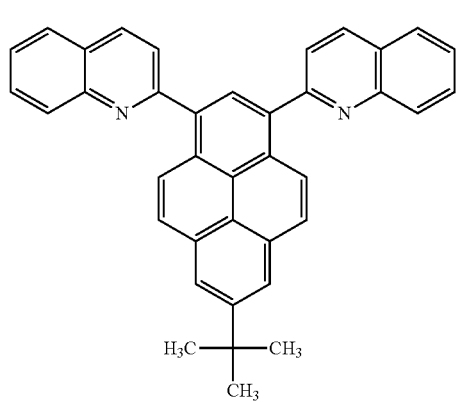
[142]
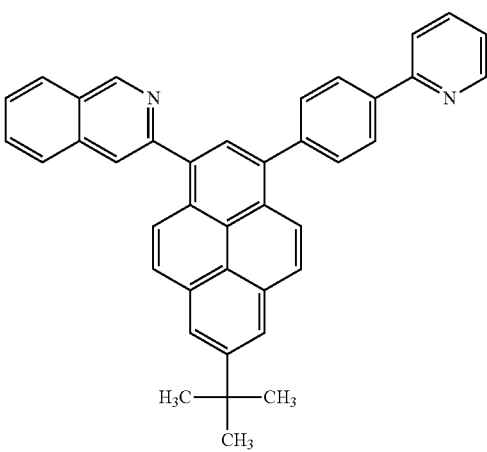

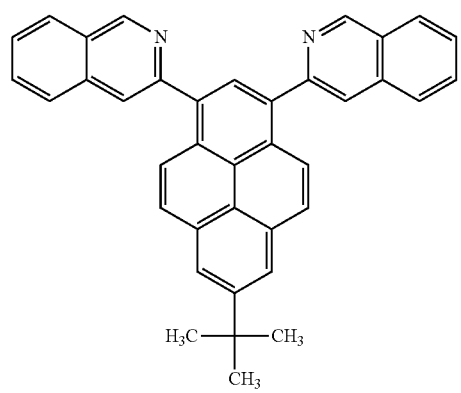
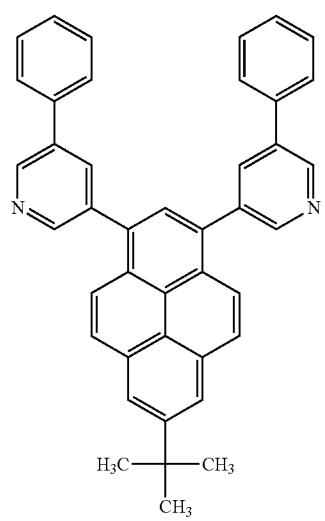
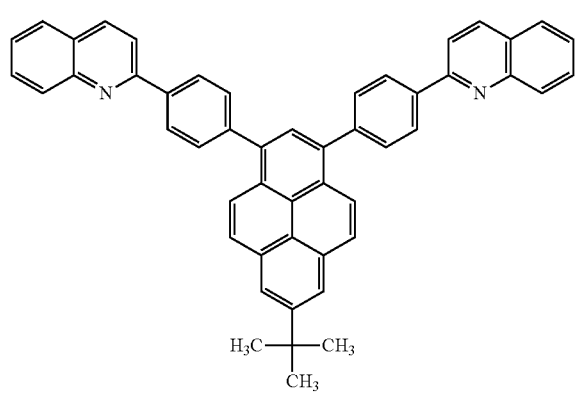
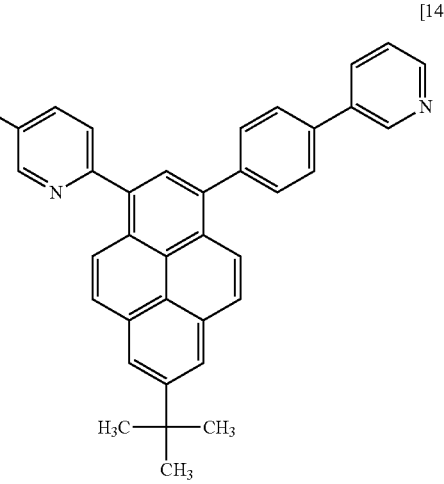
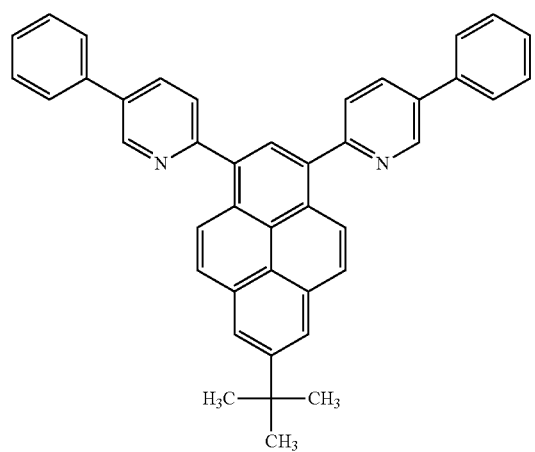
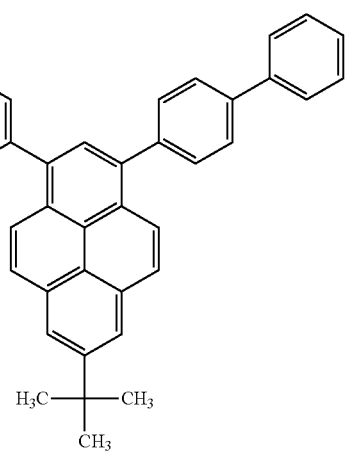

[149]
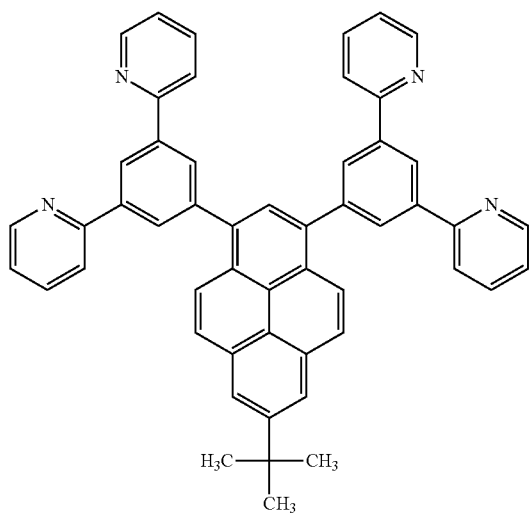
[150]
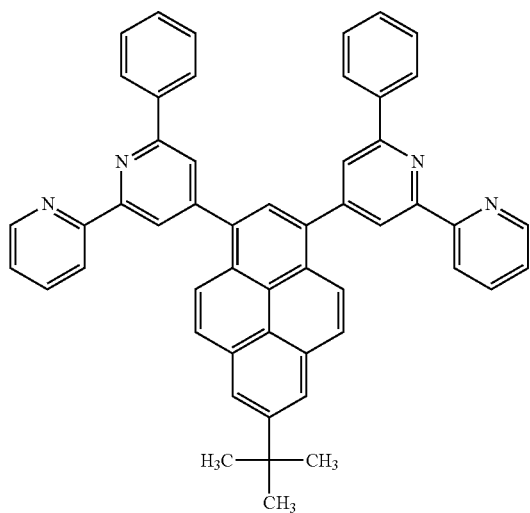
[Chemical formula 13]
[151]
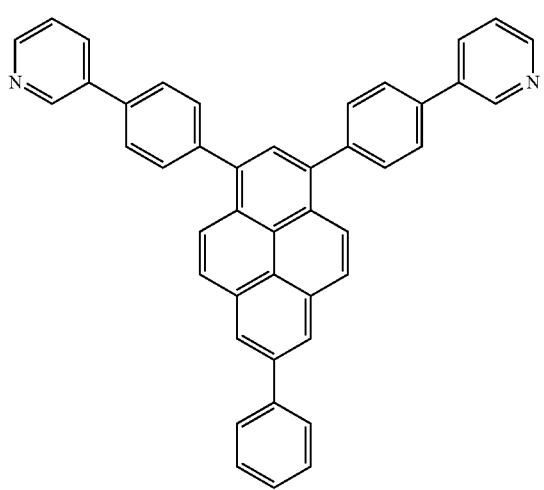
[152]
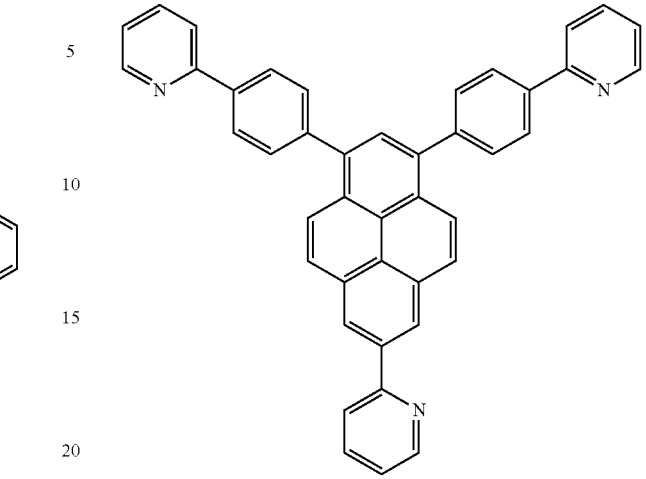
[153]
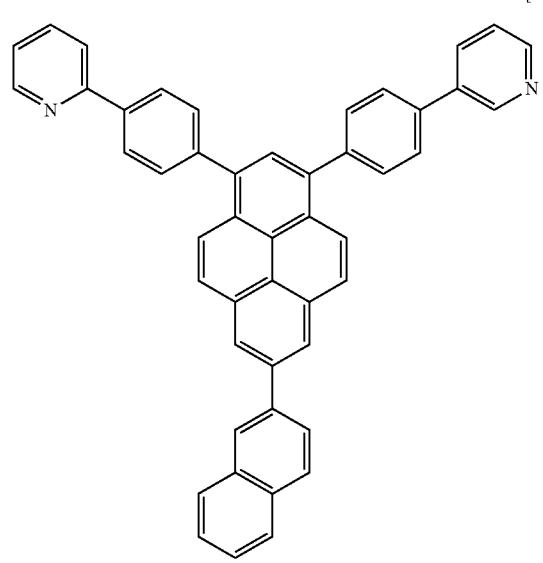
[154]
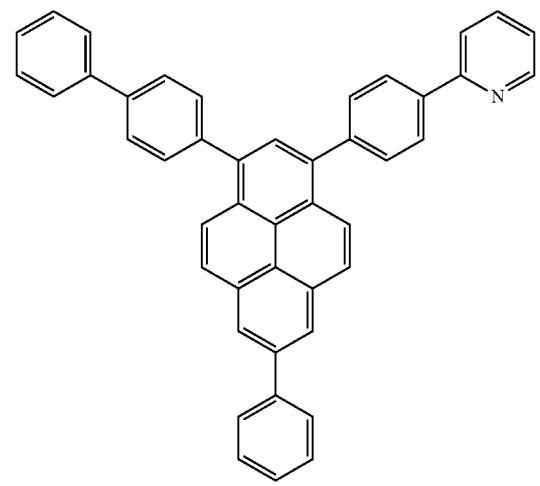

-continued
[155]
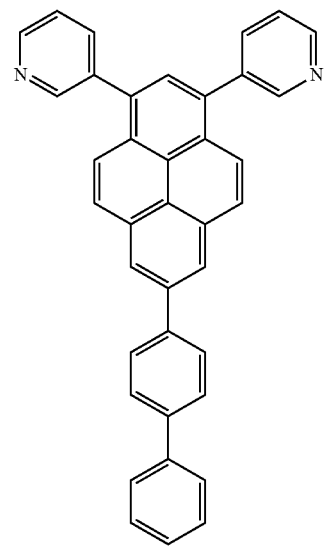
[156]
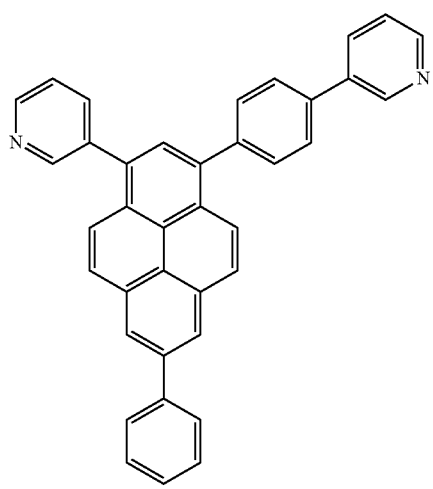
[157]
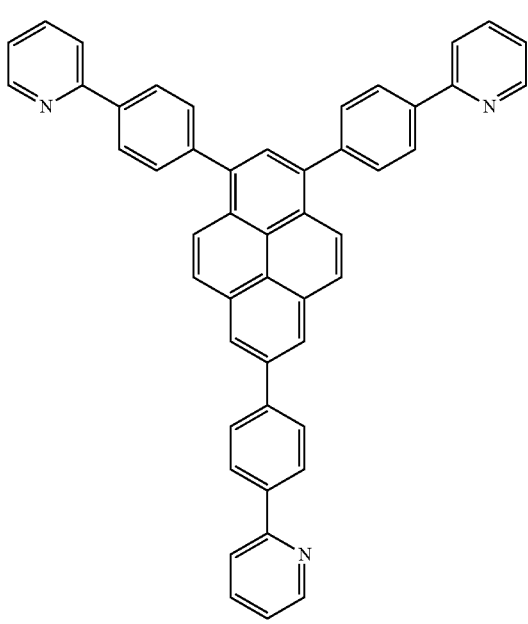
-continued
[158]
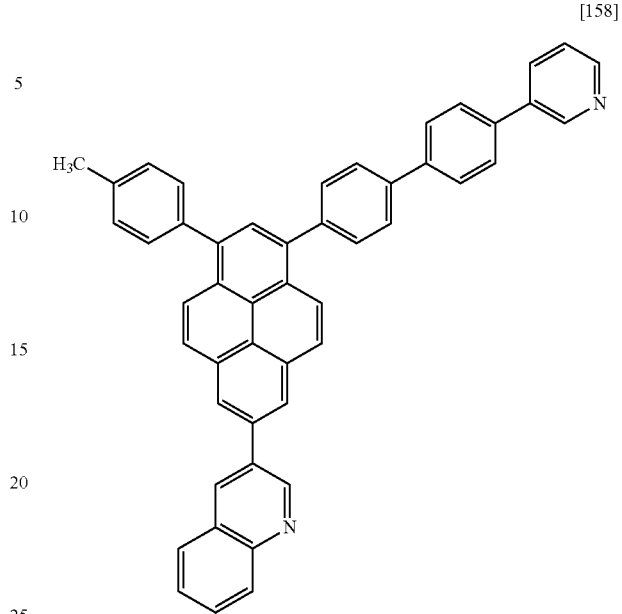
[159]
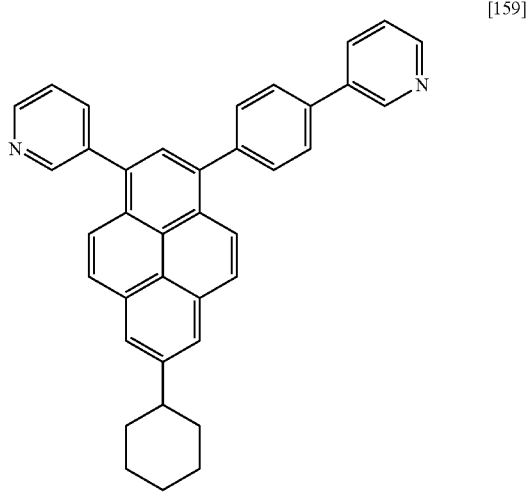
[160]
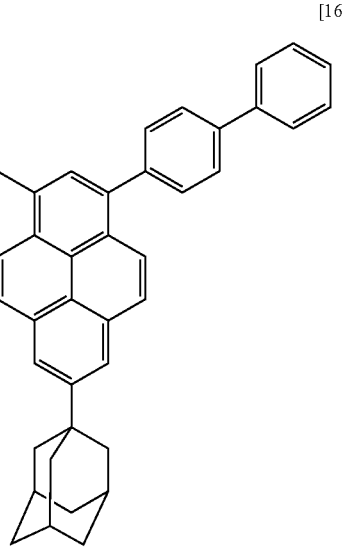

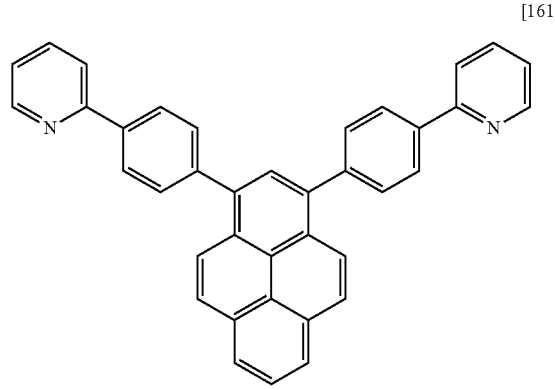
[161]
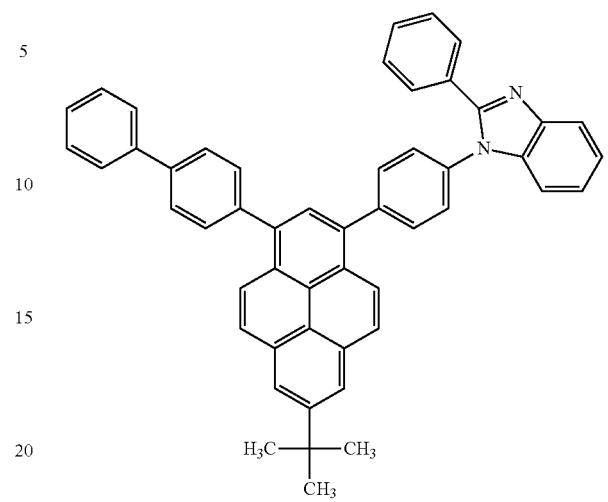
[164]
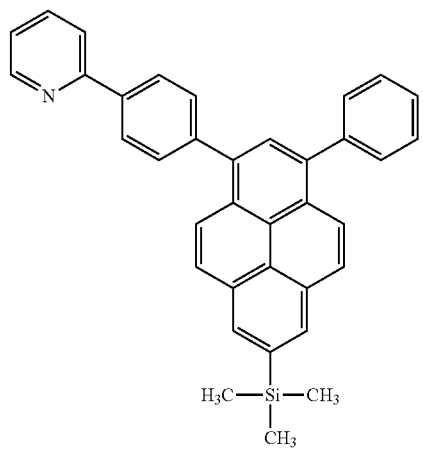
[162]
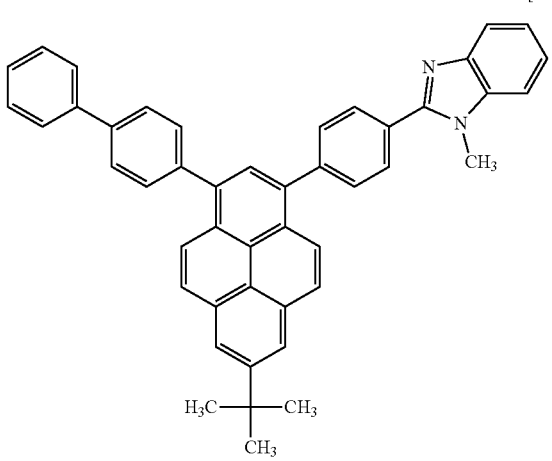
[165]
[Chemical formula 14]
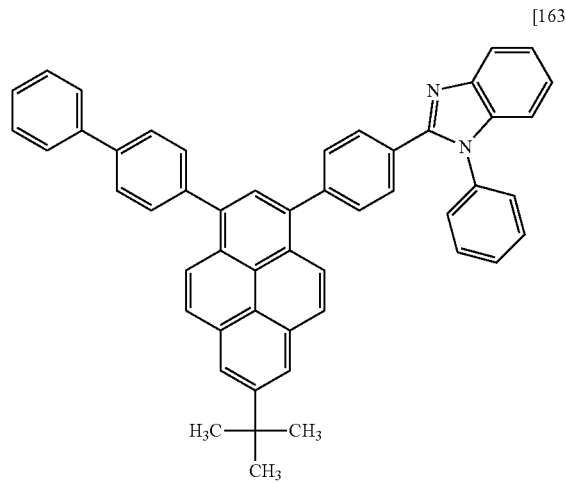
[163]
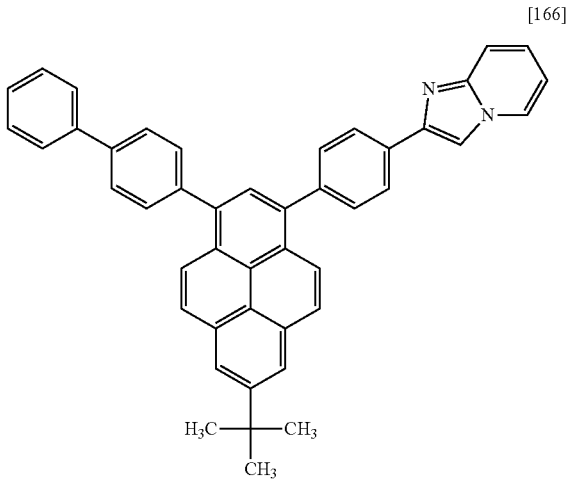
[166]

63
-continued
[167]
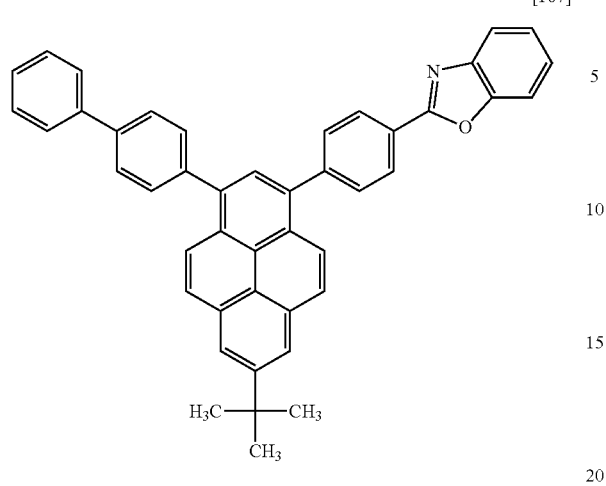
[168]
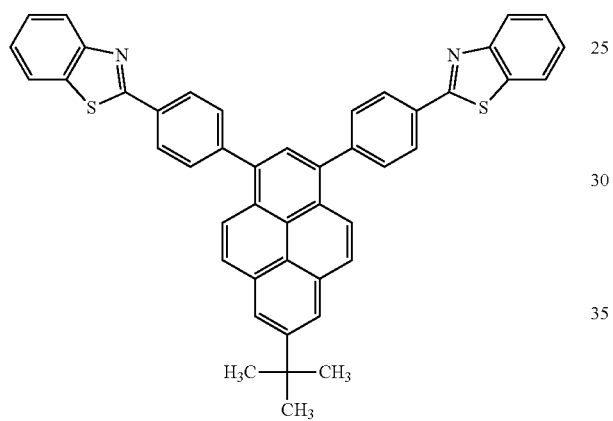
64
-continued
[170]
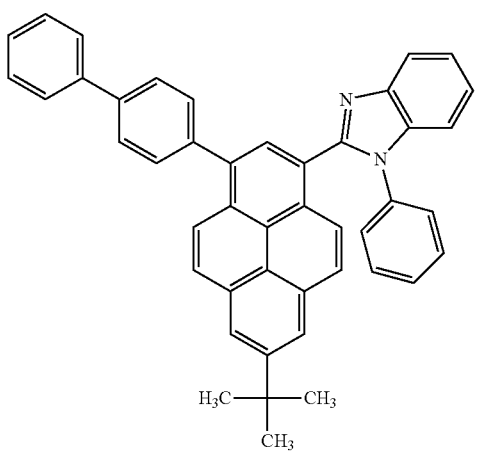
[171]
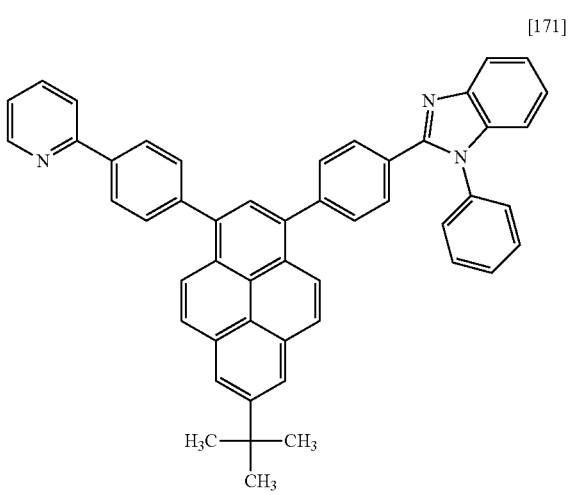
[169]
[172]

[173] 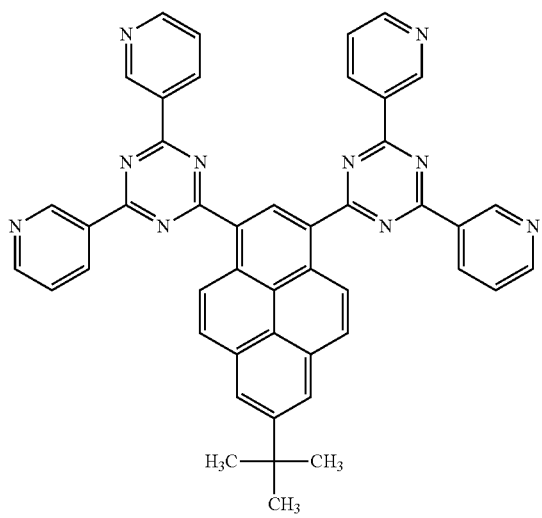

[174] 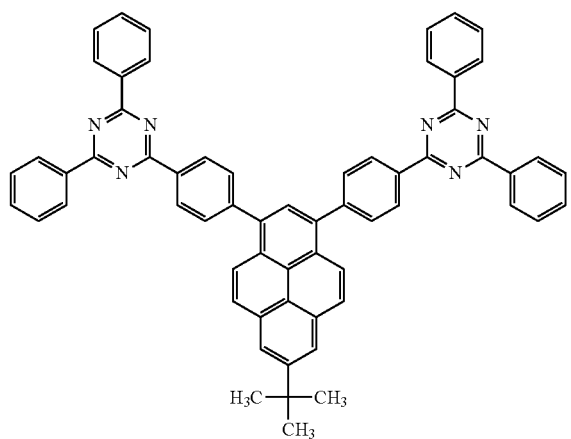

[175] 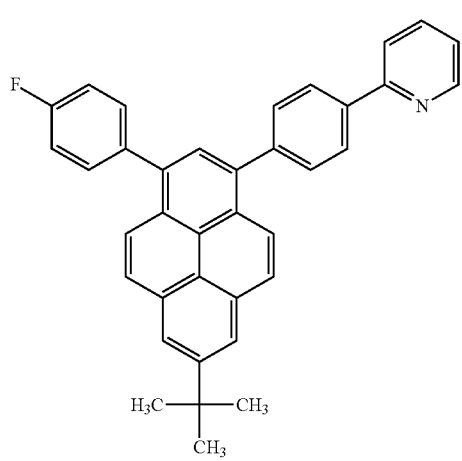

[176] 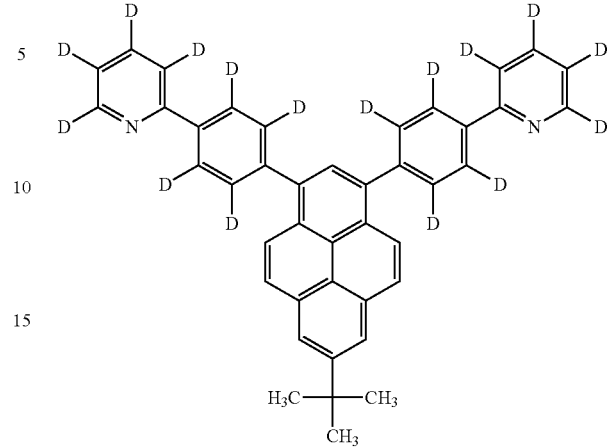

[177] 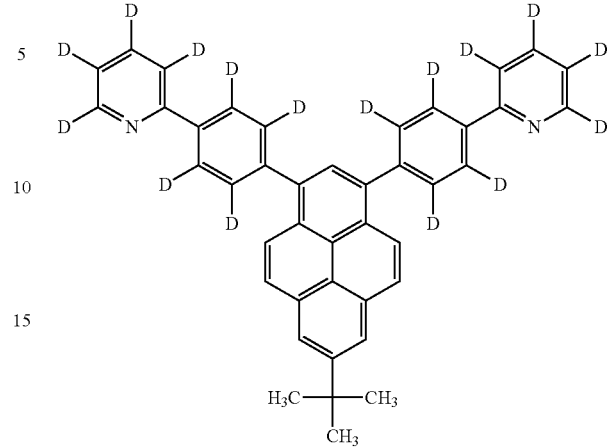

The pyrene compound represented by the general formula (1) in the present invention is used as a light emitting device material. Herein, the light emitting device material in the present invention represents a material used in any layer of light emitting devices, and also includes a material used in a protective film layer of a cathode, in addition to materials used in a hole transporting layer, an emissive layer and/or an electron transporting layer, as described later. Use of the pyrene compound represented by the general formula (1) in the present invention in any layer of light emitting devices can obtain a high luminance efficiency and a light emitting device of a low driving voltage.

Since the pyrene compound represented by the general formula (1) has high electron injection transporting ability, luminance efficiency and thin-film stability, it is preferable that it is used in an emissive layer or an electron transporting layer of a light emitting device. Particularly, since it has excellent electron injection transporting ability, it is preferably used in an electron transporting layer.

Then, embodiments of the light emitting device of the present invention will be described in detail. The light emitting device of the present invention has an anode and a cathode, and an organic layer interposing between the anode and the cathode, the organic layer includes at least an emissive layer, and the emissive layer emits light by an electric energy.

Examples of the lamination constitution of the organic layer include, in addition to a constitution including only of an emissive layer, 1) hole transporting layer/emissive layer/ electron transporting layer, 2) emissive layer/electron transporting layer, and 3) hole transporting layer/emissive layer. In addition, each of the layers may be in the form of a single layer or a plurality of layers. When the hole transporting layer and the electron transporting layer have a plurality of layers, layers on sides contacting with an electrode are each referred to as a hole injection layer and an electron injection layer in some cases, but in the following description, unless otherwise is indicated, a hole injection material is included in a hole transporting material, and an electron injection material is included in an electron transporting material, respectively.

In the light emitting device of the present invention, the anode and the cathode have a role for supplying a sufficient current for light emission of the device, and it is desirable that at least one of them is transparent or translucent in order to take out light. Usually, the anode formed on a substrate is made to be a transparent electrode.

Examples of a material used in the anode includes, but are not particularly limited to, electrically conductive metal oxides such as tin oxide, indium oxide, indium tin oxide (ITO), and indium zinc oxide (IZO), metals such as gold, silver, and chromium, inorganic electrically conductive substances such as copper iodide, and copper sulfide, and electrically conductive polymers such as polythiophene, polypyrrole, and polyaniline as far as the material is a material which can efficiently inject holes into the organic layer, and is transparent or translucent in order to take out light; and it is particularly desirable that ITO glass or Nesa glass is used. These electrode materials may be used alone, or a plurality of materials may be used by lamination or mixing. Since it is favorable that a sufficient current for light emission of the device can be supplied, the resistance of a transparent electrode is not limited, but from the viewpoint of the power consumed of the device, a low resistance is desirable. For example, an ITO substrate having 300Ω/□ or lower functions as a device electrode, but since currently, it has become possible to supply a current to a substrate having around 10Ω/□, it is particularly desirable to use a substrate having a low resistance of 20Ω/□ or lower. The thickness of ITO can be arbitrarily selected according to a resistance value, but ITO is usually used at a thickness between 100 to 300 nm in many cases.

In addition, in order to retain the mechanical strength of the light emitting device, it is preferable to form the light emitting device on a substrate. As the substrate, a glass substrate such as soda glass or alkali-free glass is suitably used. Since it is favorable that the thickness of a glass substrate has a sufficient thickness for retaining the mechanical strength, 0.5 mm or more is sufficient. Regarding the material of glass, since it is preferable that the amount of ions eluted from glass is low, alkali-free glass is preferable. Alternatively, since soda lime glass provided with a barrier coating such as $SiO_2$ is commercially available, it can also be used. Further, as far as the first electrode stably functions, it is not necessary that the substrate is glass and, for example, the anode may be formed on a plastic substrate. Examples of a method of forming an ITO film include, but are not particularly limited to, an electron beam method, a sputtering method and a chemical reaction method.

A material used in the cathode is not particularly limited, as far as it is a substance which can efficiently inject electrons into the emissive layer. Generally, metals such as platinum, gold, silver, copper, iron, tin, aluminum, and indium, or alloys or multilayer lamination of these metals with metals having a low work function such as lithium, sodium, potassium, calcium and magnesium are preferable. Among them, as a main component, aluminum, silver, and magnesium are preferable from the viewpoints of electric resistance value, easiness of making a film, stability of a film, and luminance efficiency. Particularly, when the material is constituted by magnesium and silver, electron injection into the electron transporting layer and the electron injection layer in the present invention becomes easy, and low voltage driving becomes possible, and therefore it is preferable.

Further, as a preferable example, lamination of metals such as platinum, gold, silver, copper, iron, tin, aluminum and indium, or alloys using these metals, inorganic substances such as silica, titania and silicon nitride, and organic polymer compounds such as polyvinyl alcohol, polyvinyl chloride and hydrocarbon-based polymer compound as a protective film layer on the cathode for protecting the cathode can be exemplified. Further, the pyrene compound represented by the general formula (1) can also be utilized as this protective film layer. However, in the case of a device structure for taking out light from the cathode side (top emission structure), the protective film layer is selected from materials having light permeability in a visible light region. Examples of a method of manufacturing these electrodes include, but are not particularly limited to, resistance heating, electron beam, sputtering, ion plating and coating.

The hole transporting layer is formed by a method of laminating or mixing one kind or two or more kinds of hole transporting materials, or a method of using a mixture of a hole transporting material and a polymer binder. Further, an inorganic salt such as iron chloride (III) may be added to the hole transporting material to form a hole transporting layer. It is necessary that the hole transporting material efficiently transports holes from a positive electrode between electrodes to which the electric field has been given, and it is desirable that a hole injection efficiency is high, and injected holes are transported at a good efficiency. For this reason, it is required that the material is a substance having suitable ionization potential, moreover, great hole mobility, further, excellent stability, and generating impurities that become a trap with difficulty at the time of manufacturing and at the time of use. Preferable examples of substances satisfying such conditions include, but are not particularly limited to, heterocyclic compounds such as triphenylamine derivatives including 4,4'-bis (N-(3-methylphenyl)-N-phenylamino)biphenyl, 4,4'-bis(N-(1-naphthyl)-N-phenylamino)biphenyl, and 4,4',-4"-tris(3-methylphenyl(phenyl)amino)triphenylamine, biscarbazole derivatives including bis(N-allylcarbazole) or bis(N-alkylcarbazole), pyrazoline derivatives, stilbene-based compounds, hydrazone-based compounds, benzofuran derivatives and thiophene derivatives, oxadiazole derivatives, phthalocyanine derivatives, and porphyrin derivatives, fullerene derivatives and, as a polymer series, polycarbonate and styrene derivatives having the aforementioned monomers on a side chain, polythiophene, polyaniline, polyfluorene, polyvinylcarbazole and polysilane.

Further, inorganic compounds such as p-type Si, and p-type SiC can also be used. In addition, a compound represented by the following general formula (2), tetrafluorotetracyanoquinodimethane (4F-TCNQ) or molybdenum oxide can also be used.

[Chemical formula 15]

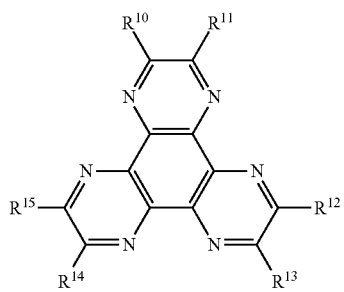

(2)

$R^{10}$ to $R^{15}$ may be the same or different, and are each selected from the group consisting of a halogen, a sulfonyl group, a carbonyl group, a nitro group, a cyano group, and a trifluoromethyl group.

Among them, when a compound (3) (1,4,5,8,9,12-hexaazatriphenylenehexacarbonitrile) is contained in the hole transporting layer or the hole injection layer, lower voltage driving is realized, and therefore it is preferable.

[Chemical formula 16]

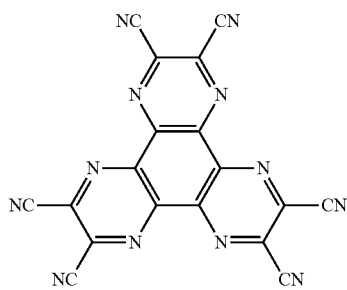

(3)

In the present invention, the emissive layers may be in the form of a single layer or a plurality of layers, each of which is formed of a emissive material (host material, dopant material), and this may be a mixture of the host material and the dopant material, or the host material alone. That is, in the light emitting device of the present invention, only the host material or the dopant material may emit light, or both of the host material and the dopant material emit light, in each emissive layer. From the viewpoints that an electric energy is efficiently utilized, and light emission at high color purity is obtained, it is preferable that the emissive layer includes a mixture of the host material and the dopant material. In addition, the host material and the dopant material may be one kind or a combination of a plurality of kinds, respectively. The dopant material may be contained in a whole host material, or may be partially contained therein. The dopant material may be laminated, or may be dispersed. The dopant material can control an emitted color. Since when the amount of the dopant material is too large, concentration quenching occurs, it is used preferably in an amount of 20% by weight or less, further preferably 10% by weight or less relative to the host material. As a doping method, the dopant material can be co-evaporated with the host material, or the dopant material may be mixed with the host material in advance to be co-evaporated simultaneously.

Since the pyrene compound represented by the general formula (1) has high light emitting ability, it is suitably used as an emissive material. In addition, since the pyrene compound represented by the general formula (1) exhibits strong light emission in an ultraviolet to blue region (300 to 450 nm region), it can be suitably used as a blue emissive material. In addition, when it is used as a host-dopant-based emissive material, the pyrene compound of the present invention may be used as the dopant material, but due to excellent thin-film stability, it is suitably used as the host material.

Specific examples of the emissive material that can be used include, but are not particularly limited to, in addition to the pyrene compound represented by the general formula (1), fused ring derivatives such as anthracene and pyrene, metal chelated oxynoid compounds including tris(8-quinolinolate) aluminum, bisstyryl derivatives such as bisstyrylanthracene derivatives and distyrylbenzene derivatives, tetrapthenylbutadiene derivatives, indene derivative coumarine derivatives, oxadiazole derivatives, pyrrolopyridine derivatives, perinone derivatives, cyclopentadiene derivatives, oxadiazole derivatives, thiadiazolopyridine derivatives, dibenzofuran derivatives, carbazole derivatives, and indolocarbazole derivatives and, as a polymer series, polyphenylenevinylene derivatives, polyparaphenylene derivatives, and polythiophene derivatives, which have hitherto been known as a light emitting body.

It is not necessary that the host material contained in the emissive material is limited to only one kind of the pyrene compound represented by the general formula (1), a plurality of pyrene compounds of the present invention may be used by mixing them, and one or more kinds of other host materials may be used by mixing with the pyrene compound of the present invention. Examples of the host material which can be mixed include, but are not particularly limited to, compounds having a fused aryl ring such as naphthalene, anthracene, phenanthrene, pyrene, chrysene, naphthacene, triphenylene, perylene, fluoranthene, fluorene, and indene, and derivatives thereof, aromatic amine derivatives such as N,N'-dinaphthyl-N,N'-diphenyl-4,4'-diphenyl-1,1'-diamine, metal chelated oxynoid compounds including tris(8-quinolinato)aluminum (III), bisstyryl derivatives such as distyrylbenzene derivatives, tetraphenylbutadiene derivatives, indene derivatives, coumarine derivatives, oxadiazole derivatives, pyrrolopyridine derivatives, perinone derivatives, cyclopentadiene derivatives, pyrrolopyrrole derivatives, thiadiazolopyridine derivatives, dibenzofuran derivatives, carbazole derivatives, indolocarbazole derivatives, and triazine derivatives and, as a polymer series, polyphenylenevinylene derivatives, polyparaphenylene derivatives, polyfluorene derivatives, polyvinylcarbazole derivatives, and polythiophene derivatives. Among them, as a host which is used when the emissive layer performs phosphorescence emission, metal chelated oxynoid compounds, dibenzofuran derivatives, carbazole derivatives, indolocarbazole derivatives, triazine derivatives etc. are suitably used.

Examples of the dopant material include, but are not particularly limited to, compounds having a fused aryl ring such as naphthalene, anthracene, phenanthrene, pyrene, chrysene, triphenylene, perylene, fluoranthene, fluorene, and indene, and derivatives thereof (e.g., 2-(benzothiazol-2-yl)-9,10-diphenylanthracene and 5,6,11,12-tetraphenylnaphthacene), compounds having a heteroaryl ring such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, pyrrolopyridine, and thioxanthene, and derivatives thereof, borane derivatives, distyrylbenzene derivatives, aminostyryl derivatives such as 4,4'-bis(2-(4-diphenylaminophenyl)ethenyl)biphenyl, 4,4'- bis(N-(stilben-4-yl)-N-phenylamino)stilbene, aromatic acetylene derivatives, tetraphenylbutadiene derivatives, stilbene derivatives, aldazine derivatives, pyrromethene derivatives, diketopyrrolo[3,4-c]pyrrole derivatives, coumarine derivatives such as 2,3,5,6-1H,4H-tetrahydro-9-(2'-benzothiazolyl)quinolizino[9,9a,1-gh]coumarine, azole derivatives such as imidazole, thiazole, thiadiazole, carbazole, oxazole, oxadiazole, and triazole, and metal complexes thereof, and aromatic amine derivatives, a representative of which is N,N'-diphenyl-N,N'-di(3-methylphenyl)-4,4'-diphenyl-1,1'-diamine.

In addition, it is preferable that the dopant used when the emissive layer performs phosphorescence emission is a metal complex compound containing at least one metal selected from the group consisting of iridium (Ir), ruthenium (Ru), palladium (Pd), platinum (Pt), osmium (Os), and rhenium (Re). It is preferable that the ligand has a nitrogen-containing aromatic heterocyclic ring such as a phenylpyridine skeleton or a phenylquinoline skeleton. However, the complex is not limited thereto, and a suitable complex is selected in context with emitted color, device performance and host compound to be required.

In the present invention, the electron transporting layer is a layer in which electrons are injected from the cathode and, further, which transports the electrons. It is desired that the electron transporting layer has a high electron injection efficiency, and efficiently transports injected electrons. For this reason, it is required that the electron transporting layer is constituted by a substance having great electron affinity and, moreover, great mobility and, further, excellent stability, and generating impurities that become a trap with difficulty at the time of manufacturing and at the time of use. Particularly, when layers are laminated at a large thickness, since a low-molecular compound is crystallized etc., and the film quality is easily deteriorated, a compound having a molecular weight of 400 or more which retains stable film quality is preferable. However, when transportation balance between holes and electrons is considered, if the electron transporting layer mainly plays a role of being able to inhibiting holes from the anode from flowing to the cathode side without recombination, even when the layer is constituted by a material having not so high electron transporting ability, the effect of improving luminance efficiency becomes equivalent to that when the layer is constituted by a material having high electron transporting ability. Therefore, the electron transporting layer in the present invention also includes a hole inhibition layer which can efficiently inhibit the transfer of holes as the same meaning.

The pyrene compound represented by the general formula (1) is a compound satisfying the aforementioned conditions, and since it has high electron injection transporting ability, it is also suitably used as the electron transporting material.

When the electron transporting layer further includes a donor compound, compatibility with the donor compound in the thin-film state is improved, and therefore higher electron injection transporting ability is exerted. Due to the action of this mixture layer, transportation of electrons from the cathode to the emissive layer is promoted, and both of a high luminance efficiency and a low driving voltage can be realized.

The electron transporting material used in the present invention is not necessarily limited to only one kind of the pyrene compound represented by the general formula (1), and a plurality of the pyrene compounds may be used by mixing them, or one or more kinds of other electron transporting materials may be used by mixing in such a range that the effect of the present invention is not imparted. Examples of the electron transporting material that can be mixed include, but are not particularly limited to, compounds having a fused aryl ring such as naphthalene, anthracene, and pyrene, and derivatives thereof, styryl-based aromatic ring derivatives, a representative of which is 4,4'-bis(diphenylethenyl)biphenyl, perylene derivatives, perinone derivatives, coumarine derivatives, naphthalimide derivatives, quinone derivatives such as anthraquinone and diphenoquinone, phosphorus oxide derivatives, carbazole derivatives and indole derivatives, quinolinol complexes such as tris(8-quinolinolato)aluminum (III), hydroxyazole complexes such as hydroxyphenyloxazole complexes, azomethine complexes, tropolone metal complexes and flavonol metal complexes.

Then, the donor compound will be described. The donor compound in the present invention is a compound which makes easy electron injection into the electron transporting layer from the cathode or the electron injection layer and, further, improves electric conductivity of the electron transporting layer, by improving an electron injection barrier. That is, in the light emitting device of the present invention, it is more preferable that the electron transporting layer is doped with the donor compound in order to improve the electron transporting ability, in addition to the pyrene compound represented by the general formula (1).

Preferable examples of the donor compound in the present invention include an alkali metal, an inorganic salt containing an alkali metal, a complex of an alkali metal and an organic substance, an alkaline earth metal, an inorganic salt containing an alkaline earth metal, or a complex of an alkaline earth metal and an organic substance. Examples of the preferable kind of the alkali metal and the alkaline earth metal include alkali metals such as lithium, sodium and cesium, and alkaline earth metals such as magnesium and calcium, which have a low work function and have the great effect of improving electron transporting ability.

In addition, since evaporation in vacuum is easy, and handling is excellent, the state of inorganic salts or complexes with an organic substance is preferable rather than metal single substances. Further, from the viewpoints of easy handling in the atmospheric air, and easiness in control of the concentration to be added, the state of complexes with an organic substance is more preferable. Examples of the inorganic salts include oxides such as LiO, and $Li_2O$, nitrides, fluorides such as LiF, NaF, and KF, and carbonates such as $Li_2CO_3$, $Na_2CO_3$, $K_2CO_3$, $Rb_2CO_3$, and $Cs_2CO_3$. In addition, preferable examples of the alkali metal or the alkaline earth metal include lithium, from the view point of the low cost of raw materials and easy synthesis. In addition, preferable examples of the organic substance in complexes with an organic substance include quinolinol, benzoquinolinol, flavonol, hydroxyimidazopyridine, hydroxybenzoazole, and hydroxytriazole. Among them, complexes of an alkali metal and an organic substance are preferable, complexes of lithium and an organic substance are more preferable, and lithium quinolinol is particularly preferable.

In addition, when the doping ratio of the donor compound in the electron transporting layer is suitable, the injection ratio of electrons into the electron transporting layer from the cathode or the electron injection layer is increased, and an energy barrier between the cathode and the electron injection layer, or between the electron injection layer and the electron transporting layer is reduced, and a driving voltage is reduced. A suitable doping concentration is different depending on a material or the film thickness of a doping region, the molar ratio of the organic compound and the donor compound is preferably in a range of 100:1 to 1:100, more preferably 10:1 to 1:10.

A method of doping the electron transporting layer with the donor compound to improve electron transporting ability exerts particularly the effect when the thickness of the thin-film layer is great. The method is particularly preferably used when the total thickness of the electron transporting layer and the emissive layer is 50 nm or more. For example, there is a method of utilizing the interference effect for improving luminance efficiency, and this improves efficiency of taking out light by matching the phase of light which is directly radiated from the emissive layer, and the phase of light which is reflected at the cathode. This optimal condition varies depending on the emission wavelength of light, and it results in 50 nm or more of the total thickness of the electron transporting layer and the emissive layer, and in the case of long wavelength light emission such as a red color, the thickness becomes near 100 nm in some cases.

The film thickness of the electron transporting layer to be doped may be part or all of the electron transporting layer, and as the film thickness of the whole electron transporting layer is greater, the greater concentration of doping is better. When part is doped, it is desirable to provide a doping region on at least an electron transporting layer/cathode interface and, the effect of reducing a voltage is obtained even doping is carried out around the cathode interface. On the other hand, in the case where if the emissive layer is doped with the donor compound, it gives an adverse influence of reducing luminance efficiency, it is desirable to provide a non-doped region at an emissive layer/electron transporting layer interface.

Examples of a method of forming each of the aforementioned layers constituting the light emitting device include, but are not particularly limited to, resistance heating evaporation, electron beam evaporation, sputtering, a molecular lamination method, and a coating method, but usually, resistance heating evaporation or electron beam evaporation is preferable from the viewpoint of device property.

The thickness of the organic layer depends on the resistance value of an emissive substance and, therefore, it cannot be limited, but it is preferably 1 to 1000 nm. The film thickness of the emissive layer, the electron transporting layer and the hole transporting layer is preferably 1 nm or more and 200 nm or less, further preferably 5 nm or more and 100 nm or less, respectively.

The light emitting device of the present invention has a function of being able to convert an electric energy into light. Herein, as the electric energy, a direct current is mainly used, but a pulse current or an alternate current can also be used. A current value and a voltage value are not particularly limited, but when the power consumed and life of the device are considered, they should be selected so that the maximum luminance is obtained by a low energy as much as possible.

The light emitting device of the present invention is suitably used as a display which performs display by a matrix and/or segment system.

The matrix system is such that pixels for display are arranged two-dimensionally such as lattice-like arrangement or mosaic-like arrangement, and the population of pixels displays letters and images. The shape and size of the pixel are determined depending on utility. For example, for displaying images and letters on personal computers, monitors and televisions, a square pixel having one side of 300 μm or less is usually used and, in the case of a large display such as a display panel, a pixel having one side of an mm order is used. In the case of monochromatic display, pixels having the same color may be arranged, and in the case of color display, pixels having red, green and blue are arranged to perform display. In this case, typically, there are a delta type and a stripe type. A method of driving this matrix may be a passive matrix driving method and an active matrix. The passive matrix driving has a simple structure, but when operation property is considered, the active matrix is more excellent in some cases, and it is necessary that this is used depending on utility.

The segment system in the present invention is a system by which a pattern is formed so as to display pre-determined information, and a region determined by arrangement of this pattern is made to emit light. Examples thereof include display of time and temperature in a digital watch and a thermometer, display of the operation state of audio instruments and electromagnetic cooking equipments, panel displays of automobiles and, the matrix display and the segment display may be present in the same panel.

The light emitting device of the present invention can also be preferably used as backlight of various instruments etc. Backlight is used mainly for the purpose of improving visibility of display equipments which do not spontaneously emit light, and is used in liquid crystal display equipments, clocks, audio equipments, automobile panels, display plates, signs etc. Particularly, the light emitting device of the present invention is preferably used in backlight for liquid crystal display equipments, inter alia, for personal computers which are studied to be thinned, and can provide backlight thinner and lighter than conventional backlight.

EXAMPLES

The present invention will be described by way of Examples, but the present invention is not limited thereto. In addition, the number of a compound in each of Examples described below indicates the number of the aforementioned compound.

Synthesis Example 1

Synthesis of Compound [1]

A mixed solution of 4.1 g of pyrene, 2 g of t-butyl chloride and 33 ml of dichloromethane was cooled to 0° C. under a nitrogen stream, and 2.7 g of aluminum chloride was added. After this mixed solution was stirred at room temperature for 3 hours, 30 ml of water was added, and this was extracted with 30 ml of dichloromethane. The organic layer was washed with 20 ml of water two times, dried with magnesium sulfate, and evaporated. This was purified by silica gel column chromatography, and vacuum-dried to obtain 3 g (content 65%) of 2-t-butylpyrene.

Then, a mixed solution of 3 g (content 65%) of 2-t-butylpyrene, 50 ml of dichloromethane and 15 ml of methanol was cooled to 0° C. under a nitrogen stream, and 3.3 g of benzyltrimethylammonium tribromide dissolved in 10 ml of dichloromethane was added dropwise. After this mixed solution was stirred at room temperature for 2 hours, 50 ml of water was added, and this was extracted with 50 ml of dichloromethane. The organic layer was washed with 50 ml of water two times, dried with magnesium sulfate, and evaporated. To the resulting solid was added 10 ml of methanol, and the mixture was stirred for 10 minutes, and filtered. Further, 30 ml of hexane was added, and the mixture was stirred for 30 minutes, and filtered. After the resultant was vacuum dried, 2.3 g of 1-bromo-7-t-butylpyrene was obtained.

Then, a mixed solution of 2.3 g (content 79.2%) of 1-bromo-7-t-butylpyrene, 1.1 g of phenylboronic acid, 3.8 g of tripotassium phosphate, 0.58 g of tetrabutylammonium bromide, 12 mg of palladium acetate and 30 ml of dimethylformamide was heated and stirred at 130° C. for 2 hours under a nitrogen stream. After the mixture was cooled to room temperature, 30 ml of water was added, and this was extracted with 50 ml of dichloromethane. The organic layer was washed with 20 ml of water two times, dried with magnesium sulfate, and evaporated. This was purified by silica gel column chromatography, and vacuum-dried to obtain 1.5 g of 7-t-butyl-1-phenylpyrene.

Then, a mixed solution of 1.5 g of 7-t-butyl-1-phenylpyrene, 25 ml of dichloromethane and 8 ml of methanol was cooled to 0° C. under a nitrogen stream, and 1.7 g of benzyltrimethylammonium tribromide dissolved in 5 ml of dichloromethane was added dropwise. After this mixed solution was stirred at room temperature for 2 hours, 20 ml of water was added, and this was extracted with 20 ml of dichloromethane. The organic layer was washed with 20 ml of water two times, dried with magnesium sulfate, and evaporated. To the resulting solid was added 10 ml of methanol, and this was allowed to stand overnight. The precipitated solid was filtered, and vacuum-dried to obtain 1.9 g of 1-bromo-7-t-butyl-3-phenylpyrene.

Then, a mixed solution of 1.9 g of 1-bromo-7-t-butyl-3-phenylpyrene, 0.57 g of 3-pyridineboronic acid, 10 mg of palladium acetate, 24 mg of triphenylphosphine, 4.4 ml of an aqueous 2M sodium carbonate solution and 23 ml of dimethoxyethane was heated and stirred for 5 hours under a nitrogen stream and under refluxing. After the mixture was cooled to room temperature, 40 ml of water was added, and this was filtered. After the resultant was washed with 40 ml of methanol, this was purified by silica gel chromatography, and vacuum-dried to obtain 1.4 g of a pale yellowish white crystal.

$^1$H-NMR analysis results of the resulting powder were as follows, and it was confirmed that the yellowish white crystal obtained above is Compound [1].

$^1$H-NMR (CDCl$_3$ (d=ppm)): 1.61 (s, 9H), 7.30-8.81 (m, 16H).

In addition, Compound [1] was used as a light emitting device material after sublimation purification was performed at about 230° C. under a pressure of $1 \times 10^{-3}$ Pa using an oil diffusion pump. The HPLC purity (area % at a measurement wavelength 254 nm) was 99.4% before sublimation purification, and 99.6% after sublimation purification.

Synthesis Example 2

Synthesis of Compound [10]

A mixed solution of 150 g of pyrene, 75.52 g of t-butyl chloride and 742 ml of dichloromethane was cooled to 0° C. under a nitrogen stream, and 98.9 g of aluminum chloride was added. After this mixed solution was stirred at room temperature for 3 hours, 1100 ml of water was added, and this was extracted with 1100 ml of dichloromethane. The organic layer was washed with 750 ml of water three times, dried with magnesium sulfate, and evaporated, and this was purified by methanol washing, and filtered. After the resultant was vacuum dried, 272 g (content 79.2%) of 2-t-butylpyrene was obtained.

Then, to a mixed solution of 77.15 g (content 79.2%) of 2-t-butylpyrene, and 1380 ml of tetrahydrofuran was added 123 g of N-bromosuccinimide under a nitrogen stream. This mixed solution was stirred at 30° C. for about 8 hours, and this was filtered. After the resulting solid was washed with methanol, recrystallization with 1500 ml of toluene was carried out, and the resultant was vacuum dried to obtain 57.3 g of 1,3-dibromo-7-t-butylpyrene.

Then, a mixed solution of 20.0 g of 1,3-dibromo-7-t-butylpyrene, 16.52 g of 4-chlorophenylboronic acid, 0.034 g of bis(triphenylphosphine)dichloropalladium, 106 ml of an aqueous 2M sodium carbonate solution and 240 ml of 1,2-dimethoxyethane was heated and stirred for about 5 hours under a nitrogen stream and under refluxing, and this was cooled to 5° C. After 240 ml of water was added, and the precipitated solid was filtered, the solid was washed with 125 ml of water two times and 125 ml of methanol once. After the solid was vacuum dried, the gray solid was dissolved in 48 ml of toluene, 2 g of active carbon was added, this was stirred for about 15 minutes, and the active carbon was filtered. After the resulting filtrate was evaporated, 100 ml of hexane was added, and the mixture was stirred for about 1 hour, and filtered. After the resultant was vacuum dried, 7.7 g of 7-t-butyl-1,3-bis(4-chlorophenyl)pyrene was obtained.

Then, a mixed solution of 7.0 g of 7-t-butyl-1,3-bis(4-chlorophenyl)pyrene, 5.4 g of 3-pyridineboronic acid, 0.34 g of bis(dibenzylideneacetone)palladium, 0.26 g of tricyclohexylphosphine tetrafluoroborate, 53 ml of an aqueous 1.27 M tripotassium phosphate solution and 51 ml of 1,4-dioxane was heated and stirred for about 8 hours under a nitrogen stream and under refluxing. After the mixture was cooled to room temperature, 100 ml of water was added, and this was extracted with 300 ml of toluene. The organic layer was washed with 100 ml of an aqueous sodium chloride solution two times, dried with magnesium sulfate, evaporated, and purified by silica gel column chromatography. The pale yellow solid obtained by evaporation was washed with 50 ml of toluene, and 50 ml of methanol, and filtered. After vacuum drying, 7.2 g of a pale yellowish white crystal was obtained.

$^1$H-NMR analysis results of the resulting powder were as follows, and it was confirmed that the pale yellowish white crystal obtained above is Compound [10].

$^1$H-NMR (CDCl$_3$ (d=ppm)): 1.61 (9H, s), 7.43 (2H, dd, J=4.6 Hz, 7.8 Hz), 7.77-7.85 (8H, m), 7.99-8.02 (3H, m), 8.07 (2H, d, J=9.5 Hz), 8.24 (2H, d, J=9.5 Hz), 8.24 (2H, s), 8.65 (2H, dd, J=1.1 Hz, 4.9 Hz), 9.00 (2H, d, J=1.9 Hz).

In addition, Compound [10] was used as a light emitting device material after sublimation purification, at about 290° C. under a pressure of $1 \times 10^{-3}$ Pa using an oil diffusion pump. The HPLC purity (area % at a measurement wavelength 254 nm) was 99.8% before sublimation purification, and 99.9% after sublimation purification.

Synthesis Example 3

Synthesis of Compound [107]

To a mixed solution of 120 g (content 79.2%) of 2-t-butylpyrene, and 3000 ml of tetrahydrofuran was added 69.66 g of N-bromosuccinimide under a nitrogen stream. This mixed solution was stirred at 30° C. for about 3 hours, and concentrated, 500 ml of methanol was added, and the mixture was stirred for about 1 hour, and filtered. To the resulting solid was added 500 ml of hexane, and the mixture was heated and stirred for about 1 hour, and filtered. After the resultant was vacuum dried, 106.9 g of 1-bromo-7-t-butylpyrene was obtained.

Then, a mixed solution of 106.9 g of 1-bromo-7-t-butylpyrene, 54.5 g of 4-chlorophenylboronic acid, 0.223 g of bis(triphenylphosphine)dichloropalladium, 350 ml of an aqueous 2M sodium carbonate solution and 1586 ml of 1,2-dimethoxyethane was heated and stirred for about 5 hours under a nitrogen stream and under refluxing. After the mixture was cooled to room temperature, 640 ml of water was added, and this was extracted with 1170 ml of toluene. The organic layer was washed with 640 ml of water two times, dried with magnesium sulfate, and evaporated, 270 ml of toluene and 1350 ml of methanol were added, and the mixture was stirred for about 2 hours, and filtered. After the resultant was vacuum dried, 105.16 g of 7-t-butyl-1-(4-chlorophenyl)pyrene was obtained.

Then, to a mixed solution of 100.6 g of 7-t-butyl-1-(4-chlorophenyl)pyrene, and 1638 ml of tetrahydrofuran was added 53.5 g of N-bromosuccinimide under a nitrogen stream. This mixed solution was stirred at 30° C. for about 5 hours, and concentrated, 984 ml of methanol was added, and the mixture was stirred for about 1 hour, and filtered. To the resulting solid was added 539 ml of hexane, and the mixture was heated and stirred for about 1 hour, and filtered. After the resultant was vacuum dried, 112.0 g of 1-bromo-7-t-butyl-3-(4-chlorophenyl)pyrene was obtained.

Then, a mixed solution of 10.0 g of 1-bromo-7-t-butyl-3-(4-chlorophenyl)pyrene, 6.9 g of 4-(2-pyridylphenyl)boronic acid pinacolato ester, 0.016 g of bis(triphenylphosphine)palladium dichloride, 33 ml of an aqueous 1.5M sodium carbonate solution and 112 ml of 1,2-dimethoxyethane was heated and stirred for about 5 hours under a nitrogen stream and under refluxing. After the mixture was cooled to room temperature, 223 ml of water was added, and this was extracted with 236 ml of ethyl acetate. The organic layer was washed with 640 ml of an aqueous sodium chloride solution two times, dried with magnesium sulfate, and evaporated, 200 ml of 2-propanol was added, and the mixture was stirred for about 2 hours, and filtered. After the resultant was vacuum dried, 10.5 g of 1-(4-(2-pyridyl)phenyl)-3-(4-chlorophenyl)-7-t-butylpyrene was obtained.

Then, a mixed solution of 6.5 g of 1-(4-(2-pyridyl)phenyl)-3-(4-chlorophenyl)-7-t-butylpyrene, 1.68 g of 3-pyridineboronic acid, 0.143 g of bis(dibenzylideneacetone)palladium, 0.11 g of tricyclohexylphosphine tetrafluoroborate, 17 ml of an aqueous 1.27M tripotassium phosphate solution and 63 ml of 1,4-dioxane was heated and stirred for about 6 hours under a nitrogen stream and under refluxing. After the mixture was cooled to room temperature, 34 ml of water was added, and this was extracted with 70 ml of ethyl acetate. The organic layer was washed with 34 ml of an aqueous sodium chloride solution two times, dried with magnesium sulfate, and evaporated, 18 ml of ethyl acetate, and 72 ml of hexane were added, and the mixture was stirred for about 2 hours, and filtered. The resultant was purified by silica gel column chromatography, the pale yellow solid obtained by evaporation was recrystallized with 40 ml of ethyl acetate, and the solid obtained by filtration was vacuum-dried to obtain 4.1 g of a white crystal.

$^1$H-NMR analysis results of the resulting powder were as follows, and it was confirmed that the white crystal obtained above is Compound [107].

$^1$H-NMR(CDCl$_3$ (d=ppm)): 1.60 (9H, s), 7.23-7.31 (1H, m), 7.43 (1H, ddd, J=1.1 Hz, 4.9 Hz, 7.8 Hz), 7.77-7.90 (8H, m), 7.98-8.11 (4H, m), 8.16-8.29 (6H, m), 8.65 (1H, dd, J=1.6 Hz, 4.6 Hz), 8.76 (1H, dt, J=0.5 Hz, 4.6 Hz), 9.00 (1H, dd, J=0.5 Hz, 2.2 Hz).

In addition, Compound [107] was used as a light emitting device material after sublimation purification at about 300° C. under a pressure of 1×10$^{-3}$ Pa using an oil diffusion pump. The HPLC purity (area % at a measurement wavelength 254 nm) was 99.4% before sublimation purification, and 99.9% after sublimation purification.

Synthesis Example 4

Synthesis of Compound [91]

A mixed solution of 9.4 g of 1-bromo-7-t-butyl-3-(4-chlorophenyl)pyrene, 4.58 g of 4-biphenylboronic acid, 0.015 g of bis(triphenylphosphine)palladium dichloride, 23 ml of an aqueous 2M sodium carbonate solution and 105 ml of 1,2-dimethoxyethane was heated and stirred for about 4 hours under a nitrogen stream and under refluxing. After the mixture was cooled to room temperature, 141 ml of water was added, and this was extracted with 164 ml of toluene. The organic layer was washed with 141 ml of an aqueous sodium chloride solution two times, dried with magnesium sulfate, and evaporated, 33 ml of toluene and 132 ml of hexane were added, and the mixture was stirred for about 2 hours, and filtered. After the resultant was vacuum dried, 10.5 g of 1-(4-biphenyl)-3-(4-chlorophenyl)-7-t-butylpyrene was obtained.

Then, a mixed solution of 10.0 g of 1-(4-biphenyl)-3-(4-chlorophenyl)-7-t-butylpyrene, 2.6 g of 3-pyridineboronic acid, 0.22 g of bis(dibenzylideneacetone)palladium, 0.17 g of tricyclohexylphosphine tetrafluoroborate, 26 ml of an aqueous 1.27M tripotassium phosphate solution and 110 ml of 1,4-dioxane was heated and stirred for about 4 hours under a nitrogen stream and under refluxing. After the mixture was cooled to room temperature, 30 ml of water was added, and this was extracted with 100 ml of toluene. The organic layer was washed with 30 ml of an aqueous sodium chloride solution two times, dried with magnesium sulfate, and evaporated, 32 ml of toluene and 96 ml of hexane were added, and the mixture was stirred for about 2 hours, and filtered. The resultant was purified by silica gel column chromatography, the pale yellow solid obtained by evaporation was dissolved in 29 ml of toluene, 87 ml of methanol was added, and the mixture was stirred for about 2 hours, and filtered. The resulting solid was vacuum dried to obtain 8.9 g of a white crystal.

$^1$H-NMR analysis results of the resulting powder were as follows, and it was confirmed that the white crystal obtained above is Compound [91].

$^1$H-NMR (CDCl$_3$ (d=ppm)): 1.60 (9H, s), 7.35-7.46 (2H, m), 7.51 (2H, t, J=7.0 Hz), 7.70-7.85 (8H, m), 7.98-8.08 (4H, m), 8.22-8.30 (6H, m), 8.65 (1H, dd, J=1.6 Hz, 4.6 Hz), 9.00 (1H, d, J=1.9 Hz).

In addition, Compound [91] was used as a light emitting device material after sublimation purification at about 270° C. under a pressure of 1×10$^{-3}$ Pa using an oil diffusion pump. The HELC purity (area % at a measurement wavelength 254 nm) was 99.8% before sublimation purification, and 99.9% after sublimation purification.

Synthesis Example 5

Synthesis of Compound [63]

A mixed solution of 7.08 g of 1-bromo-7-t-butylpyrene, 4.57 g of 4-biphenylboronic acid, 0.075 g of bis(dibenzylideneacetone)palladium, 23 ml of an aqueous 2M sodium carbonate solution and 105 ml of 1,2-dimethoxyethane was heated and stirred for about 6 hours under a nitrogen stream and under refluxing. After the mixture was cooled to room temperature, 177 ml of water was added, and this was extracted with 200 ml of toluene. The organic layer was washed with 177 ml of an aqueous sodium chloride solution two times, dried with magnesium sulfate, and evaporated, 52 ml of methanol was added, and the mixture was stirred for about 2 hours, and filtered. After the mixture was vacuum dried, 8.65 g of 1-(4-biphenyl)-7-t-butylpyrene was obtained.

Then, to a mixed solution of 8.65 g of 1-(4-biphenylyl)-7-t-butylpyrene, and 126 ml of tetrahydrofuran was added 4.1 g of N-bromosuccinimide under a nitrogen stream. This mixed solution was stirred at 30° C. for about 3 hours, and concentrated, 126 ml of methanol was added, and the mixture was stirred for about 1 hour, and filtered. To the resulting solid was added 30 ml of tetrahydrofuran, the mixture was heated and dissolved, 180 ml of methanol was added, and the mixture was stirred for about 1 hour, and filtered. After the resultant was purified by silica gel column chromatography, the solid obtained by evaporation was washed with 126 ml of methanol, and vacuum dried to obtain 8.8 g of 1-bromo-3-(4-biphenylyl)-7-t-butylpyrene.

Then, a mixed solution of 4.33 g of 1-bromo-3-(4-biphenylyl)-7-t-butylpyrene, 2.76 g of 4-(2-pyridylphenyl)boronic acid pinacolato ester, 0.035 g of bis(dibenzylideneacetone) palladium, 60 ml of an aqueous 1.5M sodium carbonate solution and 44 ml of 1,2-dimethoxyethane was heated and stirred for about 6 hours under a nitrogen stream and under refluxing. After the mixture was cooled to room temperature, 120 ml of water was added, and this was extracted with 140 ml of toluene. The organic layer was washed with 120 ml of an aqueous sodium chloride solution two times, dried with magnesium sulfate, evaporated, and the resultant was purified by silica gel column chromatography. After the pale yellow solid obtained by evaporation was heated and dissolved in 30 ml of toluene, 150 ml of hexane was added, and the mixture was stirred for about 2 hours, and filtered. The resulting solid was vacuum dried to obtain 3.55 g of a white crystal.

$^1$H-NMR analysis results of the resulting powder were as follows, and it was confirmed that the white crystal obtained above is Compound [63].

$^1$H-NMR (CDCl$_3$ (d=ppm)): 1.60 (9H, s), 7.22-7.31 (1H, m), 7.36-7.44 (1H, m), 7.51 (2H, t, J=6.7 Hz), 7.70-7.90 (10H, m), 8.04 (2H, t, J=2.4 Hz), 8.07 (1H, d, J=2.2 Hz), 8.16-8.30 (6H, m), 8.76 (1H, d, J=4.9 Hz).

In addition, Compound [63] was used as a light emitting device material after sublimation purification at about 260° C. under a pressure of 1×10$^{-3}$ Pa using an oil diffusion pump. The HPLC purity (area % at a measurement wavelength 254 nm) was 99.8% before sublimation purification, and 99.9% after sublimation purification.

Synthesis Example 6

Synthesis of Compound [106]

A mixed solution of 15.0 g of 1,3-dibromo-7-t-butylpyrene, 22.3 g of 4-(2-pyridylphenyl)boronic acid pinacolato ester, 0.25 g of bis(triphenylphosphine)palladium dichloride, 107 ml of an aqueous 1.5M sodium carbonate solution and 180 ml of 1,2-dimethoxyethane was heated and stirred for about 6 hours under a nitrogen stream and under refluxing. After the mixture was cooled to room temperature, 151 ml of water was added, and this was extracted with 204 ml of toluene. The organic layer was washed with water three times, dried with magnesium sulfate, and evaporated, 30 ml of toluene and 120 ml of hexane were added, and the mixture was stirred for about 2 hours, and filtered. After the resultant was purified by silica gel column chromatography, the pale yellow solid obtained by evaporation was dissolved in 57 ml of toluene, 171 ml of methanol was added, and the mixture was stirred for about 2 hours, and filtered. The resulting solid was vacuum dried to obtain 18.25 g of a white crystal.

$^1$H-NMR analysis results of the resulting powder were as follows, and it was confirmed that the white crystal obtained above is Compound [106].

$^1$H-NMR (CDCl$_3$ (d=ppm)): 1.59 (9H, s), 7.17-7.31 (2H, m), 7.68-7.89 (8H, m), 8.05 (2H, d, J=9.2 Hz), 8.05 (1H, s), 8.13-8.28 (8H, m), 8.76 (2H, d, J=5.1 Hz).

In addition, Compound [106] was used as a light emitting device material after sublimation purification at about 290° C. under a pressure of 1×10$^{-3}$ Pa using an oil diffusion pump.

The HPLC purity (area % at measurement wavelength 254 nm) was 99.8% before sublimation purification, and 99.9% after sublimation purification.

Synthesis Example 7

Synthesis of Compound [144]

A mixed solution of 2.0 g of 1,3-dibromo-7-t-butylpyrene, 3.5 g of 4-(2-quinolinylphenyl)boronic acid pinacol ester, 34 mg of bis(triphenylphosphine)dichloropalladium, 11 mL of an aqueous 2M sodium carbonate solution and 24 mL of 1,2-dimethoxyethane was heated and stirred for 5 hours under a nitrogen stream and under refluxing. After the mixture was cooled to room temperature, 50 mL of water was added, and this was stirred at room temperature for 1 hour. The precipitated solid was filtered, and washed with 70 mL of methanol. The resulting solid was purified by silica gel chromatography, recrystallized with 30 mL of toluene, and filtered. The resulting solid was vacuum dried to obtain 2.2 g of a pale yellow powder.

$^1$H-NMR analysis results of the resulting powder were as follows, and it was confirmed that the pale yellow powder obtained above is Compound [144].

$^1$H-NMR (CDCl$_3$ (d=ppm)): 1.60 (9H, s), 7.57 (2H, t, J=6.8 Hz), 7.77 (2H, dt, J=1.4 Hz, 8.4 Hz), 7.88 (6H, d, J=8.4 Hz), 7.99-8.11 (5H, m), 8.21-8.33 (7H, m), 8.25 (1H, s), 8.39 (4H, d, J=8.4 Hz).

In addition, Compound [144] was used as a light emitting device material after sublimation purification at 320° C. under a pressure of 1×10$^{-3}$ Pa using an oil diffusion pump. The HPLC purity (area % at a measurement wavelength 254 nm) was 99.8% before sublimation purification, and 99.9% after sublimation purification.

Synthesis Example 8

Synthesis of Compound [93]

According to the same manner as in Synthesis Example 4 except that 9,9-dimethylfluoren-2-yl boronic acid was used in place of 4-biphenylboronic acid, synthesis was performed to obtain a pale yellowish white crystal. $^1$H-NMR analysis results of the resulting powder were as follows, and it was confirmed that the pale yellowish white crystal obtained above is Compound [93].

$^1$H-NMR (CDCl$_3$ (d=ppm)): 1.58 (3H, s), 1.59 (3H, s), 1.60 (9H, s), 7.35-7.51 (4H, m), 7.66 (1H, dd, J=1.6 Hz, 7.8 Hz), 7.73-7.92 (7H, m), 7.98-8.08 (4H, m), 8.20-8.30 (4H, m), 8.65 (1H, dd, J=1.6 Hz, 4.9 Hz), 9.00 (1H, d, J=1.9 Hz).

In addition, Compound [93] was used as a light emitting device material after sublimation purification at about 260° C. under a pressure of 1×10$^{-3}$ Pa using an oil diffusion pump. The HPLC purity (area % at a measurement wavelength 254 nm) was 99.5% before sublimation purification, and 99.7% after sublimation purification.

Synthesis Example 9

Synthesis of Compound [67]

A mixed solution of 10.0 g of 1-bromo-7-t-butyl-3-(4-chlorophenyl)pyrene, 5.86 g of 9,9-dimethylfluoren-2-yl boronic acid, 0.016 g of bis(triphenylphosphine)palladium dichloride, 33 ml of an aqueous 1.5M sodium carbonate solution and 112 ml of 1,2-dimethoxyethane was heated and stirred for 3 hours under a nitrogen stream and under refluxing. After the mixture was cooled to room temperature, 223 ml of water was added, and this was extracted with 236 ml of toluene. The organic layer was washed with 640 ml of an aqueous sodium chloride solution two times, dried with magnesium sulfate, and evaporated, 50 ml of 2-propanol was added, and the mixture was stirred for 2 hours, and filtered. After the mixture was vacuum dried, 9.5 g of 1-(4-chlorophenyl)-3-(9,9-dimethylfluoren-2-yl)-7-t-butylpyrene was obtained.

Then, a mixed solution of 4 g of 1-(4-chlorophenyl)-3-(9,9-dimethylfluoren-2-yl)-7-t-butylpyrene, 1.81 g of bis(pinacolato)diboron, 1.2 g of potassium acetate, 72 mg of bis(dibenzylideneacetone)palladium, 225 mg of S-Phos and 24 ml of 1,4-dioxane was heated and stirred for 4 hours under a nitrogen stream and under refluxing. After the mixture was cooled to room temperature, 932 mg of 2-bromopyridine dissolved in 6 ml of 1,4-dioxane, and 6 ml of an aqueous 5M tripotassium phosphate solution were added, and the mixture was heated and stirred for 4 hours under a nitrogen stream and under refluxing. After the mixture was cooled to room temperature, 30 ml of water was added, this was extracted with 100 ml of toluene. The organic layer was washed with 30 ml of an aqueous sodium chloride solution two times, dried with magnesium sulfate, evaporated, and the resultant was purified by silica gel column chromatography. After vacuum drying of the solid obtained by evaporation, 1.1 g of a pale yellowish white crystal was obtained.

$^1$H-NMR analysis results of the resulting powder were as follows, and it was confirmed that the pale yellowish white crystal obtained above is Compound [67].

$^1$H-NMR (CDCl$_3$ (d=ppm)): 1.58 (6H, s), 1.60 (9H, s), 7.26-7.31 (1H, m), 7.31-7.43 (2H, m), 7.46-7.51 (1H, m), 7.67 (1H, dd, J=1.4 Hz, 7.6 Hz), 7.72-7.92 (7H, m), 8.01-8.08 (3H, m), 8.17-8.30 (6H, m), 8.76 (1H, d, J=4.6 Hz).

In addition, Compound [67] was used as a light emitting device material after sublimation purification at about 260° C. under a pressure of 1×10$^{-3}$ Pa using an oil diffusion pump. The HPLC purity (area % at a measurement wavelength 254 nm) was 99.4% before sublimation purification, and 99.8% after sublimation purification.

Synthesis Example 10

Synthesis of Compound [86]

According to the same manner as in Synthesis Example 4 except that 3-quinolineboronic acid was used in place of 3-pyridineboronic acid, synthesis was performed to obtain a pale yellowish white crystal. $^1$H-NMR analysis results of the resulting powder were as follows, and it was confirmed that the pale yellowish white crystal obtained above is Compound [86].

$^1$H-NMR (CDCl$_3$ (d=ppm)): 1.60 (9H, s), 7.38-7.72 (1H, m), 7.51 (2H, t, J=6.2 Hz), 7.61 (1H, t, J=8.4 Hz), 7.69-7.90 (7H, m), 7.91-7.96 (4H, m), 8.02-8.09 (4H, m), 8.18 (1H, d, J=8.6 Hz), 8.21-8.32 (4H, m), 8.44 (1H, d, J=1.6 Hz), 9.33 (1H, d, J=2.2 Hz).

In addition, Compound [86] was used as a light emitting device material after sublimation purification at about 300° C. under a pressure of 1×10$^{-3}$ Pa using an oil diffusion oil. The HPLC purity (area % at a measurement wavelength 254 nm) was 99.6% before sublimation purification, and 99.7% after sublimation purification.

Synthesis Example 11

Synthesis of Compound [120]

According to the same manner as in Synthesis Example 2 except that 3-quinolineboronic acid was used in place of 3-pyridineboronic acid, synthesis was performed to obtain a white crystal. $^1$H-NMR analysis results of the resulting powder were as follows, and it was confirmed that the white crystal obtained above is Compound [120].

$^1$H-NMR (CDCl$_3$ (d=ppm)): 1.60 (9H, s), 7.61 (2H, dt, J=0.8 Hz, 7.0 Hz), 7.75 (2H, t, J=6.8 Hz), 7.82-7.96 (10H, m), 8.07 (1H, s), 8.08 (2H, d, J=9.5 Hz), 8.19 (2H, d, J=7.8 Hz), 8.22-8.30 (4H, m), 8.44 (2H, d, J=4.9 Hz), 9.33 (2H, d, J=2.4 Hz).

In addition, Compound [120] was used as a light emitting device material after sublimation purification at about 340° C. under a pressure of 1×10$^{-3}$ Pa using an oil diffusion pump. The HPLC purity (area % at a measurement wavelength 254 nm) was 99.7% before sublimation purification, and 99.8% after sublimation purification.

Synthesis Example 12

Synthesis of Compound [177]

According to the same manner as in Synthesis Example 6 except that 3-(2-pyridylphenyl)boronic acid pinacolato ester was used in place of 4-(2-pyridylphenyl)boronic acid pinacolato ester, synthesis was performed to obtain a pale yellowish white crystal. $^1$H-NMR analysis results of the resulting powder were as follows, and it was confirmed that the pale yellowish white crystal obtained above is Compound [177].

$^1$H-NMR (CDCl$_3$ (d=ppm)): 1.59 (9H, s), 7.21-7.28 (2H, m), 7.63-7.85 (8H, m), 8.07 (4H, dd, J=9.5 Hz, 18.6 Hz), 8.12 (1H, dt, J=1.6 Hz, 7.6 Hz), 8.20-8.30 (6H, m), 8.71 (2H, d, J=4.9 Hz).

In addition, Compound [177] was used as a light emitting device material after sublimation purification at about 240° C. under a pressure of 1×10$^{-3}$ Pa using an oil diffusion pump. The HPLC purity (area % at a measurement wavelength 254 nm) was 99.7% before sublimation purification, and 99.9% after sublimation purification.

Synthesis Example 13

Synthesis of Compound [111]

A mixed solution of 3.0 g of 1-(4-(2-pyridyl)phenyl)-3-(4-chlorophenyl)-7-t-butylpyrene, 1.78 g of 4-(2-pyridylphenyl)

boronic acid pinacolato ester, 66 mg of bis(dibenzylideneacetone)palladium, 50 mg of tricyclohexylphosphine tetrafluoroborate, 7.6 ml of an aqueous 1.27M tripotassium phosphate solution and 20 ml of 1,4-dioxane was heated and stirred for 3 hours under a nitrogen stream and under refluxing. After the mixture was cooled to room temperature, 40 ml of methanol was added, and this was filtered. The resulting solid was recrystallized with 40 ml of toluene, and filtered, and the resulting solid was vacuum dried to obtain 3.2 g of a pale yellowish white crystal.

$^1$H-NMR analysis results of the resulting powder were as follows, and it was confirmed that the pale yellowish white crystal obtained above is Compound [111].

$^1$H-NMR (CDCl$_3$ (d=ppm)): 1.60 (9H, s), 7.22-7.31 (2H, m), 7.73-7.92 (12H, m), 8.02-8.10 (3H, m), 8.11-8.30 (8H, m), 8.75 (2H, t, J=5.9 Hz).

In addition, Compound [111] was used as a light emitting device material after sublimation purification at about 300° C. under a pressure of $1 \times 10^{-3}$ Pa using an oil diffusion pump. The HPLC purity (area % at a measurement wavelength 254 nm) was 99.4% before sublimation purification, and 99.9% after sublimation purification.

Example 1

A glass substrate (manufactured by GEOMATEC Co., Ltd., 11Ω/□, sputtered product) on which an ITO transparent electrically conductive film had been deposited in a thickness of 150 nm was cut into 38×46 mm, and this was subjected to etching. The resulting substrate was ultrasound-washed with "SEMICOCLEAN 56" (trade name, manufactured by Furuuchi Chemical Corporation) for 15 minutes, and washed with ultrapure water. This substrate was treated with UV-ozone for 1 hour immediately before manufacturing of a device, and placed in a vacuum evaporation equipment, and the air was evacuated until the degree of vacuum in the equipment became $5 \times 10^{-4}$ Pa or lower. By a resistance heating method, first, as a hole injection material, copper phthalocyanine was evaporated in a thickness of 10 nm and, as a hole transporting material, 4,4'-bis(N-(1-naphthyl)-N-phenylamino)biphenyl was evaporated in a thickness of 50 nm. Then, Compound (H-1) as a host material, and Compound (D-1) as a dopant material were evaporated as an emissive material in a thickness of 40 nm so that the doping concentration became 5% by weight. Then, a layer in which Compound [1] and a donor compound (lithium fluoride) had been mixed was evaporated and laminated as an electron transporting layer in a thickness of 20 nm at a ratio of evaporation rate of 1:1 (=0.05 nm/s:0.05 nm/s).

Then, after lithium fluoride was evaporated in a thickness of 0.5 nm, aluminum was evaporated in a thickness of 1000 nm to make a cathode, and a 5×5 mm square device was manufactured. The film thickness referred herein is a value displayed by a quartz oscillation-type film thickness monitor. When this light emitting device was direct-current driven at 10 mA/cm$^2$, high efficiency blue light emission at a driving voltage of 4.8 V and an external quantum efficiency of 5.0% was obtained.

[Chemical formula 17]

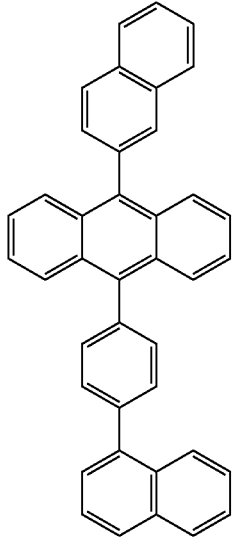

(H-1)

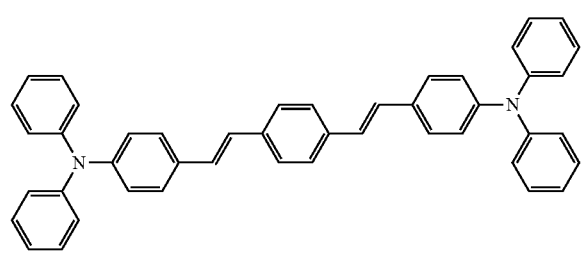

(D-1)

Examples 2 to 9

According to the same manner as in Example 1 except that materials described in Table 1 were used as the host material, the dopant material and the electron transporting layer, light emitting devices were manufactured. Results are shown in Table 1. In addition, in Table 1, 2E-1 is the following compound.

[Chemical formula 18]

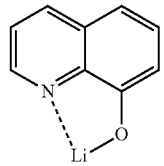

(2E-1)

Comparative Examples 1 to 6

According to the same manner as in Example 1 except that materials described in Table 1 were used as the host material, the dopant material, and the electron transporting material, light emitting devices were manufactured. Results are shown in Table 1. In addition, in Table 1, E-1, and E-2 are the following compounds.

[Chemical formula 19]

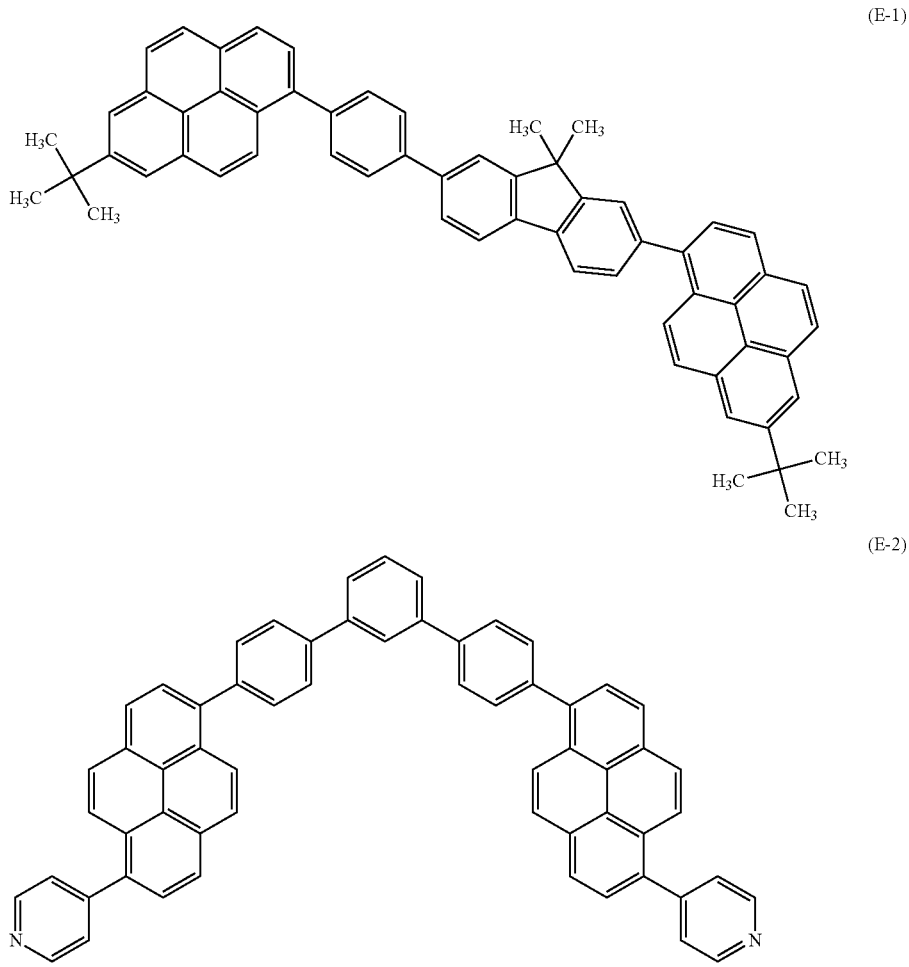

(E-1)

(E-2)

TABLE 1

| | Light emitting material | | | Electron transporting layer | | Cathode | External quantum | Driving voltage |
|---|---|---|---|---|---|---|---|---|
| | Host material | Dopant material | Emitting color | Compound | Donor compound | Metal | efficiency (%) | (V) |
| Example 1 | H-1 | D-1 | Blue | Compound [1] | Lithium fluoride | Al | 5.0 | 4.8 |
| Example 2 | | | Blue | Compound [1] | none | Al | 4.2 | 4.9 |
| Example 3 | | | Blue | Compound [53] | Lithium fluoride | Al | 5.0 | 4.9 |
| Example 4 | | | Blue | Compound [53] | none | Al | 4.1 | 5.0 |
| Example 5 | | | Blue | Compound [56] | Lithium fluoride | Al | 5.5 | 4.4 |
| Example 6 | | | Blue | Compound [56] | none | Al | 5.0 | 4.7 |
| Example 7 | | | Blue | Compound [1] | 2E-1 | Al | 5.7 | 4.2 |
| Example 8 | | | Blue | Compound [53] | 2E-1 | Al | 5.6 | 4.3 |
| Example 9 | | | Blue | Compound [56] | 2E-1 | Al | 5.9 | 4.0 |
| Comparative Example 1 | | | Blue | E-1 | Lithium fluoride | Al | 3.2 | 6.4 |
| Comparative Example 2 | | | Blue | E-1 | 2E-1 | Al | 3.4 | 6.2 |
| Comparative Example 3 | | | Blue | E-1 | none | Al | 2.5 | 7.8 |
| Comparative Example 4 | | | Blue | E-2 | Lithium fluoride | Al | 3.8 | 5.6 |
| Comparative Example 5 | | | Blue | E-2 | 2E-1 | Al | 3.9 | 5.5 |
| Comparative Example 6 | | | Blue | E-2 | none | Al | 3.0 | 5.8 |

Examples 10 to 20

According to the same manner as in Example 1 except that materials described in Table 2 were used as the host material, the dopant material, and the electron transporting layer, light emitting devices were manufactured. Results are shown in Table 2. In addition, in Table 2, H-2 to H-8, and D-2 to D-10 are the following compounds.

[Chemical formula 20]

(H-2)

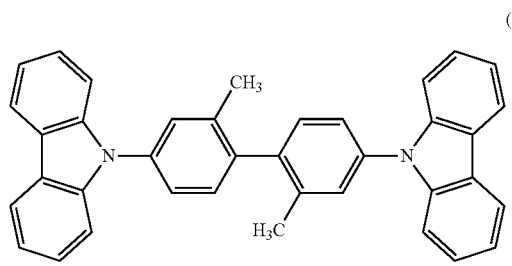

(H-3)

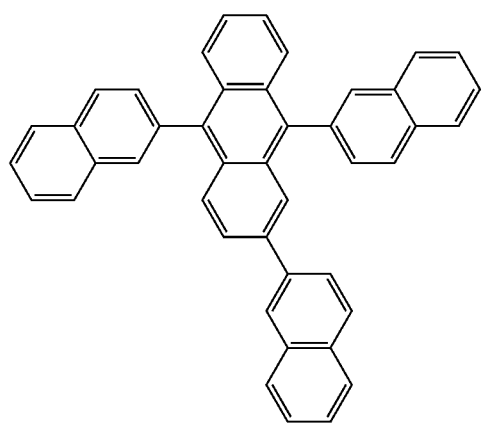

(H-4)

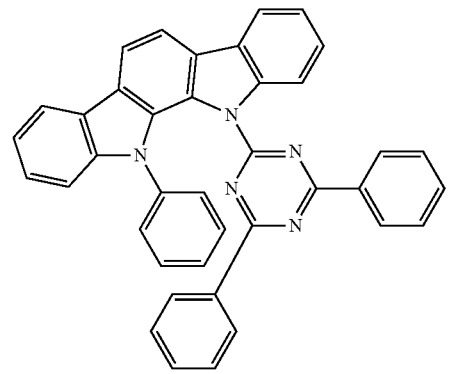

(H-5)

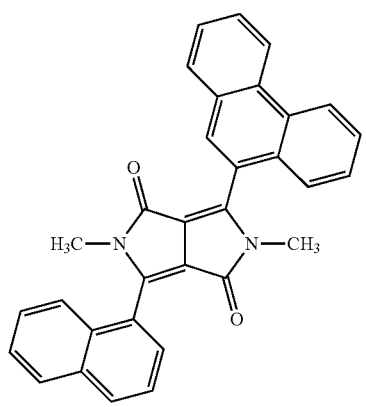

(H-6)

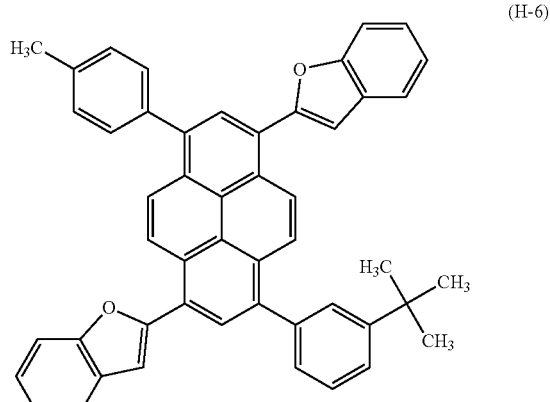

(H-7)

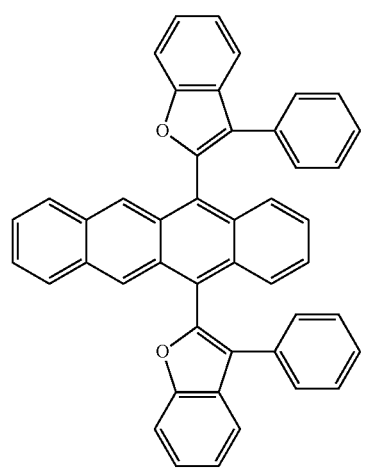

(H-8)

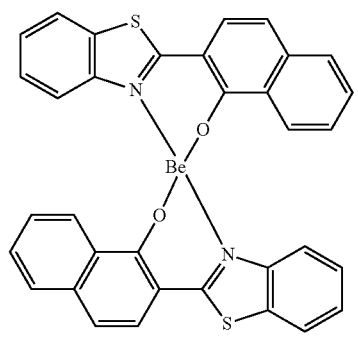

[Chemical formula 21]

(D-2)

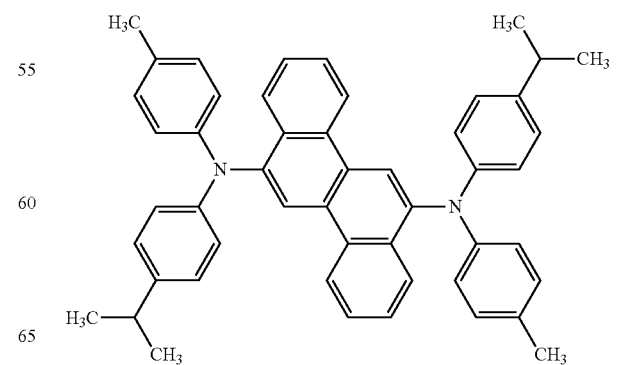

(D-3)
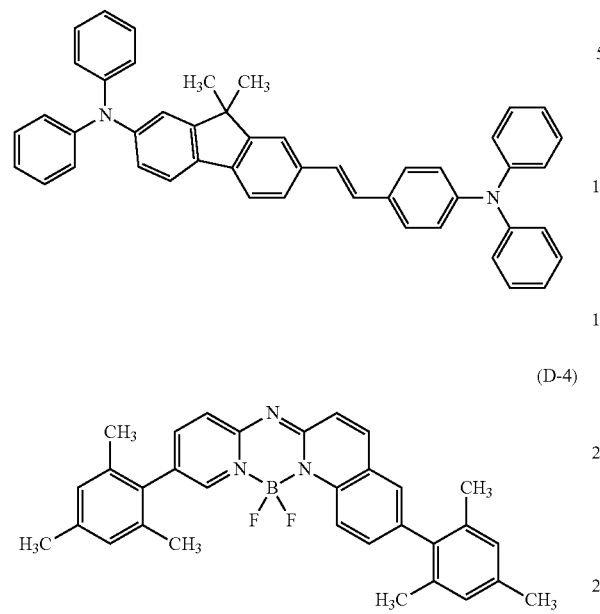
(D-4)
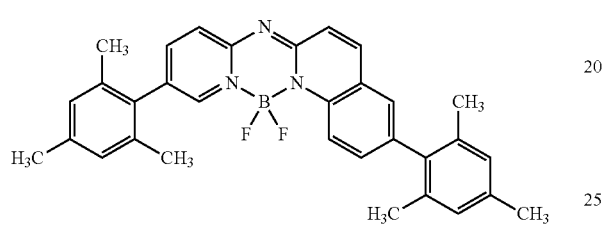
(D-5)
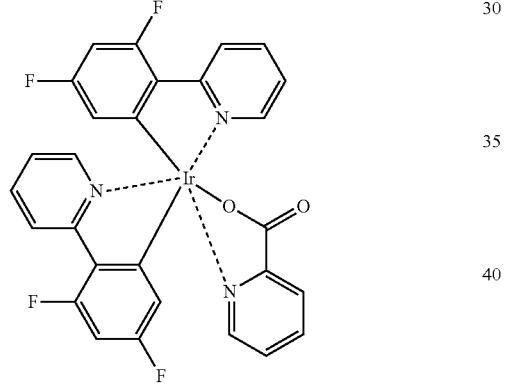
(D-6)
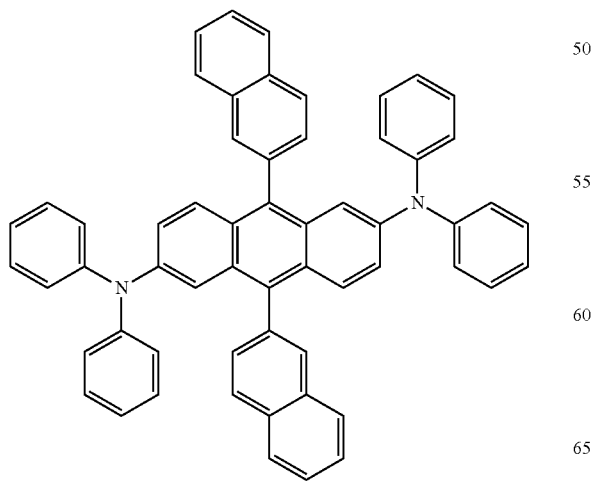
(D-7)
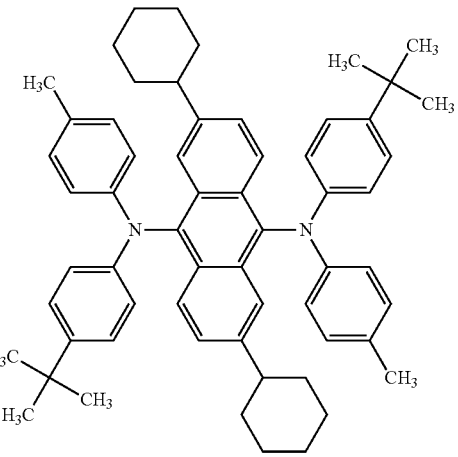
(D-8)
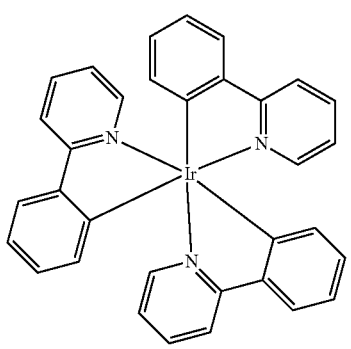
(D-9)
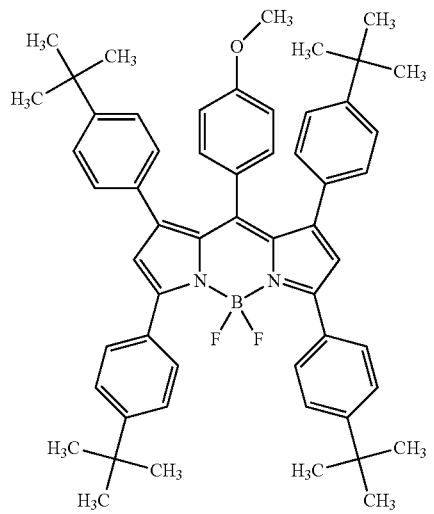

-continued

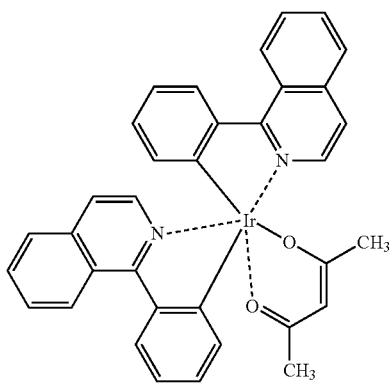

(D-10)

to make a cathode, and a 5×5 mm square device was manufactured. The film thickness referred herein is a value displayed by a quartz oscillation-type film thickness monitor. When this light emitting device was direct current-driven at 10 mA/cm$^2$, high efficiency blue light emission at a driving voltage of 3.9V and an external quantum efficiency of 6.2% was obtained.

Examples 22 and 23

According to the same manner as in Example 21 except that materials described in Table 3 were used as the host material, the dopant material and the electron transporting layer, light emitting devices were manufactured. Results are shown in Table 3.

TABLE 2

| | Light emitting material | | | Electron transporting layer | | Cathode | External quantum | Driving voltage |
|---|---|---|---|---|---|---|---|---|
| | Host material | Dopant material | Emitting color | Compound | Donor compound | Metal | efficiency (%) | (V) |
| Example 10 | H-1 | D-2 | Blue | Compound [1] | 2E-1 | Al | 5.9 | 4.2 |
| Example 11 | | D-3 | Blue | | | Al | 5.8 | 4.1 |
| Example 12 | | D-4 | Blue | | | Al | 5.7 | 4.2 |
| Example 13 | H-2 | D-5 | Blue | | | Al | 7.2 | 4.9 |
| Example 14 | H-3 | D-6 | Green | Compound [1] | 2E-1 | Al | 7.3 | 4.5 |
| Example 15 | | D-7 | Green | | | Al | 7.2 | 4.5 |
| Example 16 | H-4 | D-8 | Green | | | Al | 11.3 | 5.0 |
| Example 17 | H-5 | D-9 | Red | Compound [1] | 2E-1 | Al | 5.0 | 4.6 |
| Example 18 | H-6 | | Red | | | Al | 6.2 | 4.5 |
| Example 19 | H-7 | | Red | | | Al | 6.0 | 4.5 |
| Example 20 | H-8 | D-10 | Red | | | Al | 10.1 | 5.1 |

Example 21

A glass substrate (manufactured by GEOMATEC Co., Ltd., 11Ω/□, sputtered product) on which an ITO transparent electrically conductive film had been deposited in a thickness of 165 nm was cut into 38×46 mm, and this was subjected to etching. The resulting substrate was ultrasound-washed with "SEMICOCLEAN 56" (trade name, manufactured by Furuuchi Chemical Corporation) for 15 minutes, and washed with ultrapure water. This substrate was treated with UV-ozone for 1 hour immediately before manufacturing of a device, and placed in a vacuum evaporation equipment, and the air was evacuated until the degree of vacuum in the equipment became 5×10$^{-4}$ Pa or lower. By a resistance heating method, first, as a hole injection material, 1,4,5,8,9,12-hexaazatriphenylenehexacarbonitrile was evaporated in a thickness of 10 nm and, as a hole transporting material, 4,4'-bis(N-(1-naphthyl)-N-phenylamino)biphenyl was evaporated in a thickness of 50 nm. Then, Compound (H-1) as a host material, and Compound (D-2) as a dopant material were evaporated as an emissive material in a thickness of 40 nm so that the doping concentration became 5% by weight. Then, a layer in which Compound [1] and a donor compound (2E-1: lithium quinolinol) had been mixed was laminated as an electron transporting layer in a thickness of 10 nm at a ratio of evaporation rate of 1:1 (=0.05 nm/s:0.05 nm/s).

Then, after lithium quinolinol was evaporated in a thickness of 1 nm, a co-evaporated film of magnesium and silver was evaporated in a thickness of 100 nm at a ratio of evaporation rate of magnesium:silver=10:1 (=0.5 nm/s 0.05 nm/s)

Comparative Examples 7 to 12

According to the same manner as in Example 21 except that materials described in Table 3 were used as the electron transporting layer, light emitting devices were manufactured. Results are shown in Table 3. In addition, in Table 3, E-3 to E-8 are the following compounds.

[Chemical formula 22]

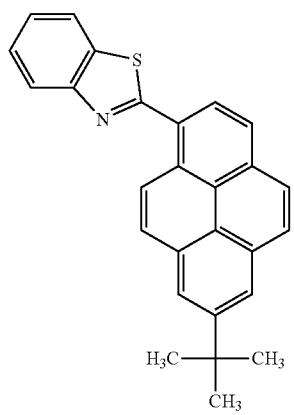

(E-3)

(E-4)
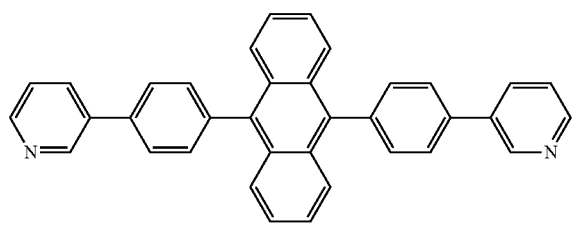

(E-5)
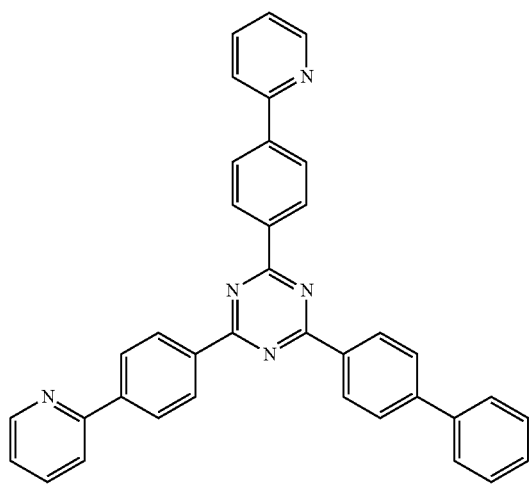

(E-6)
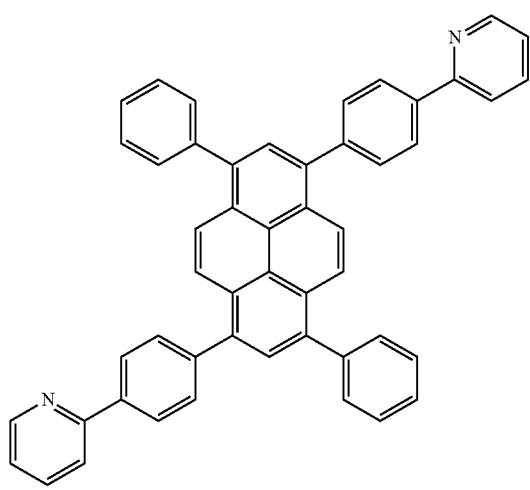

(E-7)
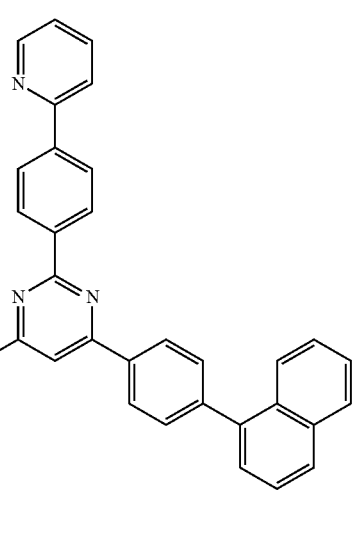

(E-8)
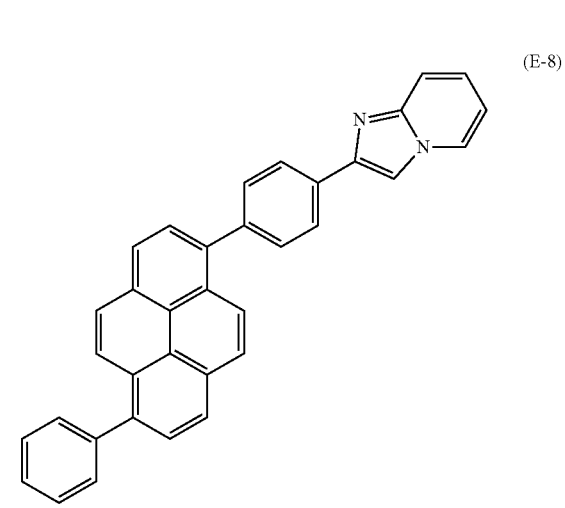

TABLE 3

| | Light emitting material | | | Electron transporting layer | | Cathode | External quantum efficiency (%) | Driving voltage (V) |
|---|---|---|---|---|---|---|---|---|
| | Host material | Dopant material | Emitting color | Compound | Donor compound | Metal | | |
| Example 21 | H-1 | D-2 | Blue | Compound [1] | 2E-1 | Mg/Ag | 6.2 | 3.9 |
| Example 22 | | | Blue | Compound [53] | 2E-1 | Mg/Ag | 6.1 | 4.0 |
| Example 23 | | | Blue | Compound [56] | 2E-1 | Mg/Ag | 6.4 | 3.7 |
| Comparative Example 7 | | | Blue | E-3 | 2E-1 | Mg/Ag | 3.9 | 4.6 |
| Comparative Example 8 | | | Blue | E-4 | 2E-1 | Mg/Ag | 4.9 | 4.5 |
| Comparative Example 9 | | | Blue | E-5 | 2E-1 | Mg/Ag | 4.8 | 4.8 |

TABLE 3-continued

| | Light emitting material | | | Electron transporting layer | | Cathode | External quantum efficiency (%) | Driving voltage (V) |
|---|---|---|---|---|---|---|---|---|
| | Host material | Dopant material | Emitting color | Compound | Donor compound | Metal | | |
| Comparative Example 10 | | | Blue | E-6 | 2E-1 | Mg/Ag | 5.1 | 4.7 |
| Comparative Example 11 | | | Blue | E-7 | 2E-1 | Mg/Ag | 4.6 | 4.7 |
| Comparative Example 12 | | | Blue | E-8 | 2E-1 | Mg/Ag | 5.2 | 4.6 |

Example 24

According to the same manner as in Example 1 except that Compound [1] was used as the host material, and tris(8-quinolinolato)aluminum (III) was used as the electron transporting layer, a light emitting device was manufactured. When this light emitting device was direct current-driven at 10 mA/cm$^2$, high efficiency blue light emission at a driving voltage of 5.0 V and an external quantum efficiency of 4.8% was obtained.

Example 25

According to the same manner as in Example 24 except that Compound [91] was used as the host material, a light emitting device was manufactured. When this light emitting device was direct current-driven at 10 mA/cm$^2$, high efficiency blue light emission at a driving voltage of 4.9 V and an external quantum efficiency of 4.9% was obtained.

Example 26

According to the same manner as in Example 24 except that Compound [106] was used as the host material, a light emitting device was manufactured. When this light emitting device was direct current-driven at 10 mA/cm$^2$, high efficiency blue light emission at a driving voltage of 5.1 V and an external quantum efficiency of 4.6% was obtained.

Example 27

A glass substrate (manufactured by GEOMATEC Co., Ltd., 11Ω/□, sputtered product) on which an ITO transparent electrically conductive film had been deposited in a thickness of 165 nm was cut into 38×46 mm, and this was subjected to etching. The resulting substrate was ultrasound-washed with "SEMICOCLEAN 56" (trade name, manufactured by Furuuchi Chemical Corporation) for 15 minutes, and washed with ultrapure water. This substrate was treated with UV-ozone for 1 hour immediately before manufacturing of a device, and placed in a vacuum evaporation equipment, and the air was evacuated until the degree of vacuum in the equipment became 5×10$^{-4}$ Pa or lower. By a resistance heating method, first, as a hole injection material, copper phthalocyanine was evaporated in a thickness of 10 nm and, as a hole transporting material, Compound (HT-1) was evaporated in a thickness of 50 nm. Then, Compound (H-1) as a host material, and Compound (D-1) as a dopant material were evaporated as an emissive material in a thickness of 40 nm so that the doping concentration became 5% by weight. Then, Compound [10] as an electron transporting layer was evaporated in a thickness of 20 nm. Then, after lithium fluoride was evaporated in a thickness of 0.5 nm, aluminum was evaporated in a thickness of 1000 nm to make a cathode, and a 5×5 square device was manufactured. The film thickness referred herein is a value displayed by a quartz oscillation-type film thickness monitor. When this light emitting device was direct current-driven at 10 mA/cm$^2$, high efficiency blue light emission at a driving voltage of 4.9 V and an external quantum efficiency of 4.6% was obtained.

[Chemical formula 23]

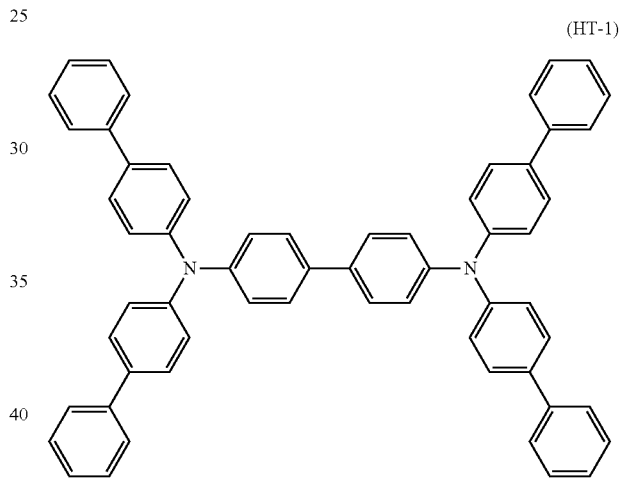

(HT-1)

Examples 28 to 35

According to the same manner as in Example 27 except that materials described in Table 4 were used as the electron transporting layer, light emitting devices were manufactured. Results are shown in Table 4.

Example 36

A layer in which Compound [10] and Compound [106] had been mixed was evaporated and laminated as an electron transporting layer in a thickness of 20 nm at a ratio of evaporation rate of 1:1 (=0.05 nm/s:0.05 nm/s). According to the same manner as in 27 except for those described above, a light emitting device was manufactured. Results are shown in Table 4.

Example 37

According to the same manner as in Example 36 except that a layer in which Compound [10] and Compound (E-9) had been mixed was evaporated and laminated as the electron transporting layer in a thickness of 20 nm at a ratio of evaporation rate of 1:1 (=0.05 nm/s:0.05 nm/s), a light emitting device was manufactured. Results are shown in Table 4. In addition, E-9 in Table 4 is the following compound.

[Chemical formula 24]

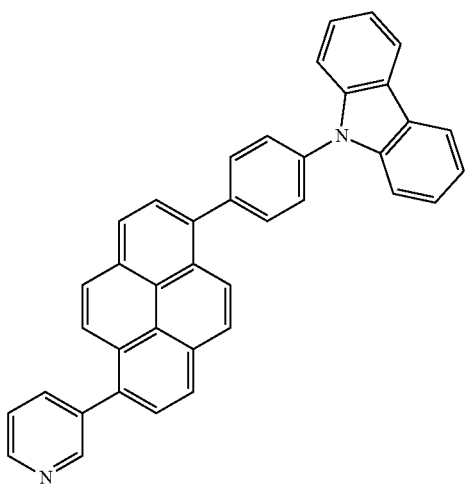

(E-9)

Comparative Examples 13 to 14

According to the same manner as in Example 27 except that materials described in Table 4 were used as the electron transporting layer, light emitting devices were manufactured. Results are shown in Table 4.

Examples 38

A layer in which Compound [10] and a donor compound (lithium fluoride) had been mixed was evaporated and laminated as an electron transporting layer in a thickness of 20 nm at a ratio of evaporation rate of 1:1 (=0.05 nm/s:0.05 nm/s). According to the same manner as in Example 27 except for those described above, a light emitting device was manufactured. Results are shown in Table 5.

Examples 39 to 43

According to the same manner as in Example 38 except that materials described in Table 5 were used as the electron transporting layer, light emitting devices were manufactured. Results are shown in Table 5.

Example 44

A layer in which Compound [10] and Donor Compound (2E-1) had been mixed was evaporated and laminated as an electron transporting layer in a thickness of 20 nm at a ratio of evaporation rate of 1:1 (=0.05 nm/s:0.05 nm/s). According to the same manner as in Example 38 except for those described above, a light emitting device was manufactured. Results are shown in Table 5.

Examples 45 to 49

According to the same manner as in Example 44 except that materials described in Table 5 were used as the electron transporting layer, light emitting devices were manufactured. Results are shown in Table 5.

Example 50

A layer in which Compound [10] and Donor Compound (2E-1) had been mixed was evaporated and laminated as an electron transporting layer in a thickness of 20 nm at a ratio of evaporation rate of 7:3 (=0.07 nm/s:0.03 nm/s). According to

TABLE 4

| | Light emitting material | | | Electron transporting layer | | Cathode | External quantum | Driving voltage |
|---|---|---|---|---|---|---|---|---|
| | Host material | Dopant material | Emitting color | Compound | Donor compound | Metal | efficiency (%) | (V) |
| Example 27 | H-1 | D-1 | Blue | Compound [10] | none | Al | 4.6 | 4.9 |
| Example 28 | | | Blue | Compound [107] | none | Al | 4.8 | 4.8 |
| Example 29 | | | Blue | Compound [91] | none | Al | 4.6 | 4.9 |
| Example 30 | | | Blue | Compound [63] | none | Al | 4.5 | 5.0 |
| Example 31 | | | Blue | Compound [106] | none | Al | 4.7 | 4.8 |
| Example 32 | | | Blue | Compound [144] | none | Al | 4.6 | 5.0 |
| Example 33 | | | Blue | Compound [1] | none | Al | 4.2 | 5.1 |
| Example 34 | | | Blue | Compound [26] | none | Al | 4.0 | 5.2 |
| Example 35 | | | Blue | Compound [32] | none | Al | 4.0 | 5.1 |
| Example 36 | | | Blue | Compound [10] | Compound [106] | Al | 4.5 | 5.1 |
| Example 37 | | | Blue | Compound [10] | E-7 | Al | 4.6 | 5.0 |
| Comparative Example 13 | | | Blue | E-1 | none | Al | 2.5 | 7.7 |
| Comparative Example 14 | | | Blue | E-2 | none | Al | 3.0 | 5.7 | the same manner as in Example 44 except for those described above, a light emitting device was manufactured. Results are shown in Table 5.

Examples 51 to 55

According to the same manner as in Example 50 except that materials described in Table 5 were used as the electron transporting layer, light emitting devices were manufactured. Results are shown in Table 5.

Example 56

A layer in which Compound [10] and Donor Compound (2E-1) had been mixed was evaporated and laminated as an electron transporting layer in a thickness of 20 nm at a ratio of evaporation rate of 3:7 (=0.03 nm/s:0.07 nm/s). According to the same manner as in Example 44 except for those described above, a light emitting device was manufactured. Results are shown in Table 5.

Examples 57 to 61

According to the same manner as in Example 56 except that materials described in Table 5 were used as the electron transporting layer, light emitting devices were manufactured. Results are shown in Table 5.

TABLE 5

| | Light emitting material | | | Electron transporting layer | | | | External | Driving |
|---|---|---|---|---|---|---|---|---|---|
| | Host material | Dopant material | Emitting color | Compound | Donor compound | Mixing ratio | Cathode Metal | quantum efficiency (%) | voltage (V) |
| Example 38 | H-1 | D-1 | Blue | Compound [10] | Lithium fluoride | 1:1 | Al | 5.2 | 4.6 |
| Example 39 | | | Blue | Compound [107] | | | | 5.1 | 4.5 |
| Example 40 | | | Blue | Compound [91] | | | | 5.2 | 4.6 |
| Example 41 | | | Blue | Compound [63] | | | | 5.2 | 4.7 |
| Example 42 | | | Blue | Compound [106] | | | | 5.1 | 4.5 |
| Example 43 | | | Blue | Compound [144] | | | | 5.0 | 4.6 |
| Example 44 | H-1 | D-1 | Blue | Compound [10] | 2E-1 | 1:1 | Al | 6.1 | 4.0 |
| Example 45 | | | Blue | Compound [107] | | | | 5.8 | 4.1 |
| Example 46 | | | Blue | Compound [91] | | | | 6.0 | 4.0 |
| Example 47 | | | Blue | Compound [63] | | | | 5.8 | 4.1 |
| Example 48 | | | Blue | Compound [106] | | | | 5.9 | 4.0 |
| Example 49 | | | Blue | Compound [144] | | | | 5.7 | 4.1 |
| Example 50 | H-1 | D-1 | Blue | Compound [10] | 2E-1 | 7:3 | Al | 5.7 | 4.1 |
| Example 51 | | | Blue | Compound [107] | | | | 5.8 | 4.1 |
| Example 52 | | | Blue | Compound [91] | | | | 5.9 | 4.1 |
| Example 53 | | | Blue | Compound [63] | | | | 5.8 | 4.1 |
| Example 54 | | | Blue | Compound [106] | | | | 6.0 | 3.9 |
| Example 55 | | | Blue | Compound [144] | | | | 5.7 | 4.2 |
| Example 56 | H-1 | D-1 | Blue | Compound [10] | 2E-1 | 3:7 | Al | 6.0 | 4.1 |
| Example 57 | | | Blue | Compound [107] | | | | 6.0 | 4.0 |
| Example 58 | | | Blue | Compound [91] | | | | 5.9 | 4.0 |
| Example 59 | | | Blue | Compound [63] | | | | 6.0 | 4.1 |
| Example 60 | | | Blue | Compound [106] | | | | 6.2 | 3.8 |
| Example 61 | | | Blue | Compound [144] | | | | 5.9 | 4.0 |

Examples 62 to 109

According to the same manner as in Example 38 except that materials described in Table 6 were used as the host material and the dopant material, light emitting devices were manufactured. Results are shown in Table 6. In addition, in Table 6, D-11, and H-9 to H-12 are the following compounds.

[Chemical formula 25]
(D-11)
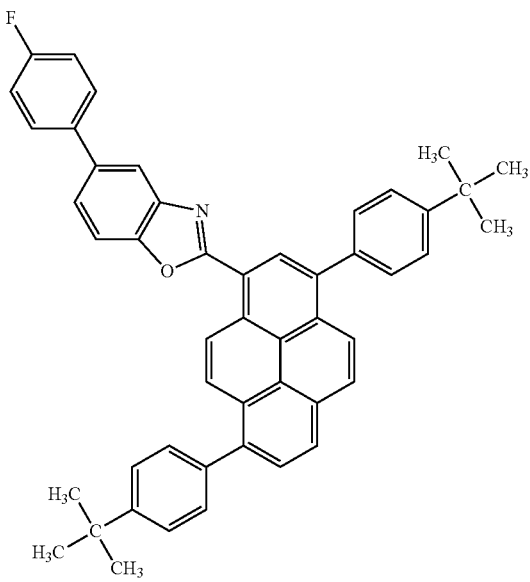
(H-11)
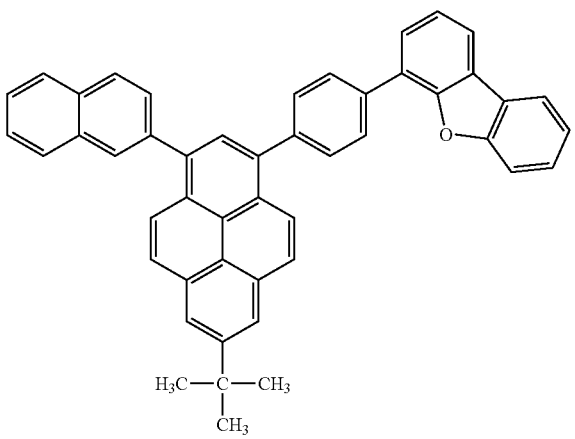
(H-9)
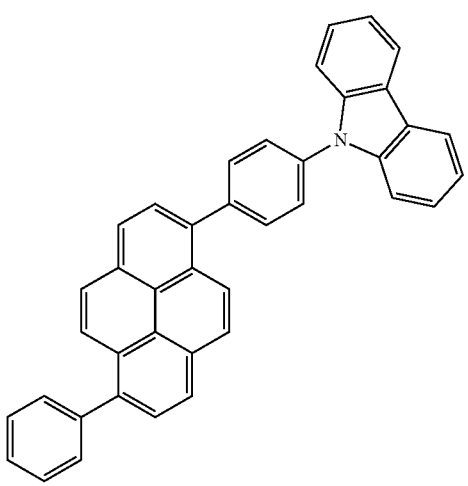
(H-10)
(H-12)
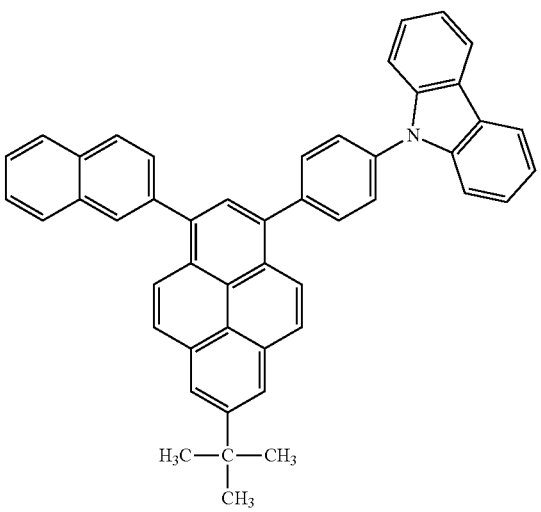

TABLE 6

| | Light emitting material | | | Electron transporting layer | | Cathode | External quantum | Driving voltage |
|---|---|---|---|---|---|---|---|---|
| | Host material | Dopant material | Emitting color | Compound | Donor compound | Metal | efficiency (%) | (V) |
| Example 62 | H-1 | D-2 | Blue | Compound [107] | 2E-1 | Al | 6.0 | 4.1 |
| Example 63 | | D-3 | Blue | | | | 5.9 | 4.0 |
| Example 64 | | D-4 | Blue | | | | 5.8 | 4.1 |
| Example 65 | | D-11 | Blue | | | | 6.0 | 4.1 |
| Example 66 | H-9 | D-3 | Blue | | | | 5.8 | 4.2 |
| Example 67 | H-10 | | Blue | | | | 5.9 | 4.2 |
| Example 68 | H-11 | | Blue | | | | 5.7 | 4.4 |
| Example 69 | H-12 | | Blue | | | | 5.8 | 4.3 |
| Example 70 | H-2 | D-5 | Blue | | | | 7.4 | 4.7 |
| Example 71 | H-3 | D-6 | Green | | | | 7.4 | 4.4 |
| Example 72 | | D-7 | Green | | | | 7.3 | 4.5 |
| Example 73 | H-4 | D-8 | Green | | | | 11.3 | 4.9 |
| Example 74 | H-5 | D-9 | Red | | | | 5.2 | 4.5 |
| Example 75 | H-6 | | Red | | | | 6.4 | 4.4 |
| Example 76 | H-7 | | Red | | | | 6.1 | 4.5 |
| Example 77 | H-8 | D-10 | Red | | | | 10.3 | 4.9 |
| Example 78 | H-1 | D-2 | Blue | Compound [91] | 2E-1 | Al | 6.0 | 4.0 |
| Example 79 | | D-3 | Blue | | | | 6.0 | 3.9 |
| Example 80 | | D-4 | Blue | | | | 5.9 | 3.9 |
| Example 81 | | D-11 | Blue | | | | 5.9 | 4.2 |
| Example 82 | H-9 | D-3 | Blue | | | | 5.7 | 4.2 |
| Example 83 | H-10 | | Blue | | | | 5.8 | 4.2 |
| Example 84 | H-11 | | Blue | | | | 5.8 | 4.3 |
| Example 85 | H-12 | | Blue | | | | 5.7 | 4.2 |
| Example 86 | H-2 | D-5 | Blue | | | | 7.3 | 4.7 |
| Example 87 | H-3 | D-6 | Green | | | | 7.4 | 4.3 |
| Example 88 | | D-7 | Green | | | | 7.3 | 4.6 |
| Example 89 | H-4 | D-8 | Green | | | | 11.2 | 4.9 |
| Example 90 | H-5 | D-9 | Red | | | | 5.3 | 4.6 |
| Example 91 | H-6 | | Red | | | | 6.6 | 4.4 |
| Example 92 | H-7 | | Red | | | | 6.2 | 4.5 |
| Example 93 | H-8 | D-10 | Red | | | | 10.1 | 5.0 |
| Example 94 | H-1 | D-2 | Blue | Compound [106] | 2E-1 | Al | 6.0 | 4.1 |
| Example 95 | | D-3 | Blue | | | | 5.9 | 4.0 |
| Example 96 | | D-4 | Blue | | | | 5.8 | 4.0 |
| Example 97 | | D-11 | Blue | | | | 6.1 | 4.0 |
| Example 98 | H-9 | D-3 | Blue | | | | 5.8 | 4.1 |
| Example 99 | H-10 | | Blue | | | | 5.8 | 4.3 |
| Example 100 | H-11 | | Blue | | | | 5.7 | 4.4 |
| Example 101 | H-12 | | Blue | | | | 5.8 | 4.2 |
| Example 102 | H-2 | D-5 | Blue | | | | 7.3 | 4.8 |
| Example 103 | H-3 | D-6 | Green | | | | 7.5 | 4.3 |
| Example 104 | | D-7 | Green | | | | 7.2 | 4.6 |
| Example 105 | H-4 | D-8 | Green | | | | 11.2 | 4.9 |
| Example 106 | H-5 | D-9 | Red | | | | 5.3 | 4.5 |
| Example 107 | H-6 | | Red | | | | 6.5 | 4.4 |
| Example 108 | H-7 | | Red | | | | 6.2 | 4.4 |
| Example 109 | H-8 | D-10 | Red | | | | 10.2 | 4.9 |

Example 110

A glass substrate (manufactured by GEOMATEC Co., Ltd., 110/D, sputtered product) on which an ITO transparent electrically conductive film had been deposited in a thickness of 165 nm was cut into 38×46 mm, and this was subjected to etching. The resulting substrate was ultrasound-washed with "SEMICOCLEAN 56" (trade name, manufactured by Furuuchi Chemical Corporation) for 15 minutes, and washed with ultrapure water. This substrate was treated with UV-ozone for 1 hour immediately before manufacturing of a device, and placed in a vacuum evaporation equipment, and the air was evacuated until the degree of vacuum in the equipment became $5 \times 10^{-4}$ Pa or lower. By a resistance heating method, first, as a hole injection material, Compound (HT-2) was laminated in a thickness of 65 nm, and 1,4,5,8,9,12-hexaazatriphenylenehexacarbonitrile was laminated in a thickness of 5 nm, sequentially. Compound (HT-3) as a hole transporting material was evaporated in a thickness of 60 nm. Then, Compound (H-1) as a host material, and Compound (D-3) as a dopant material were evaporated as an emissive material in a thickness of 20 nm so that the doping concentration became 5% by weight. Then, a layer in which Compound [10] and donor compound (2E-1: lithium quinolinol) had been mixed was evaporated as an electron transporting layer in thickness of 30 nm at a ratio of evaporation rate of 1:1 (=0.05 nm/s:0.05 nm/s).

Then, after lithium quinolinol was evaporated in a thickness of 5 nm, a co-evaporated film of magnesium and silver was evaporated in a thickness of 15 nm at a ratio of evaporation rate of magnesium:silver=10:1 (=0.05 nm/s:0.05 nm/s) to make a cathode, and a 5×5 mm square device was manufactured. The film thickness referred herein is a value displayed by a quartz oscillation-type film thickness monitor. When this light emitting device was direct current-driven at 10 mA/cm$^2$, high efficiency blue light emission at a driving voltage of 3.8 V and an external quantum efficiency of 6.3% was obtained.

[Chemical formula 26]
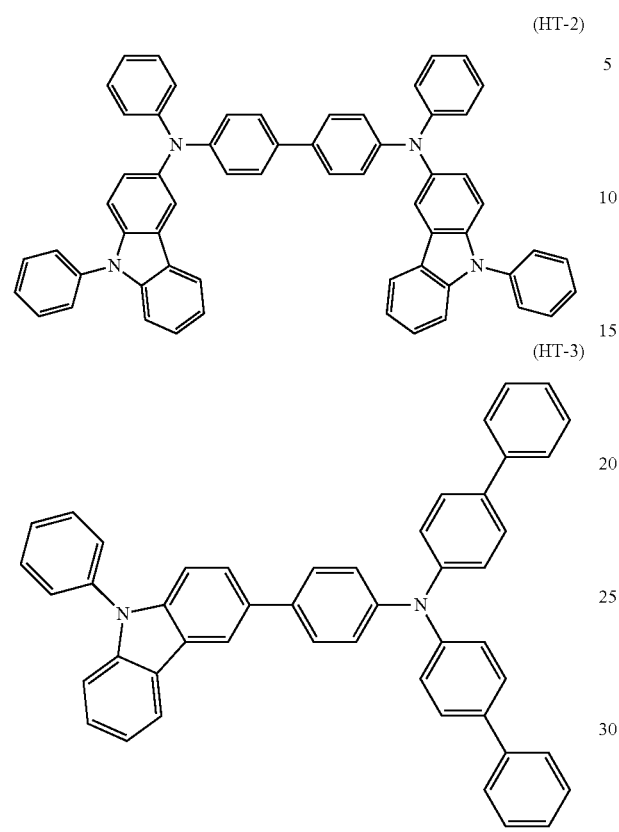
(HT-2)
(HT-3)
Examples 111 to 147
According to the same manner as in Example 110 except that materials described in Tables 7 and 8 were used as the electron transporting layer, light emitting devices were manufactured. Results are shown in Tables 7 and 8. In addition, in Tables 7 and 8, D-12 to D-14, and H-13 and H-14 are the following compounds.
[Chemical formula 27]
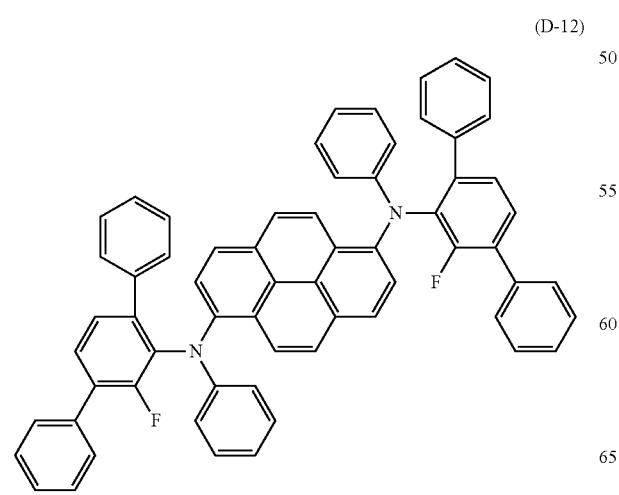
(D-12)
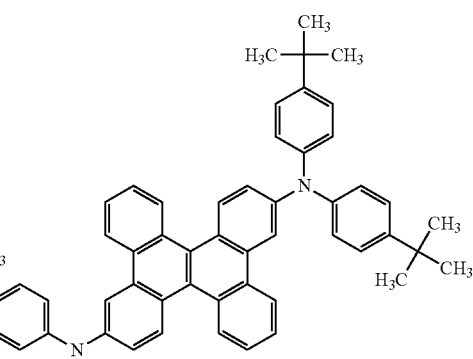
(D-13)
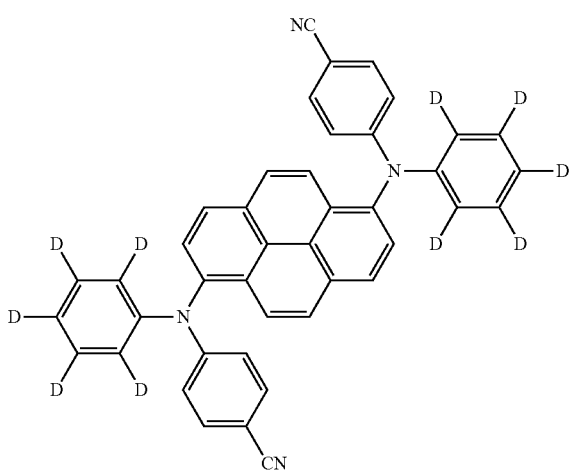
(D-14)
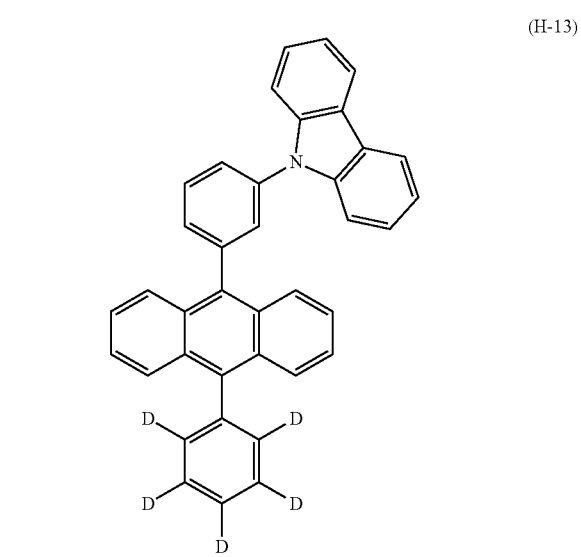
(H-13)

-continued

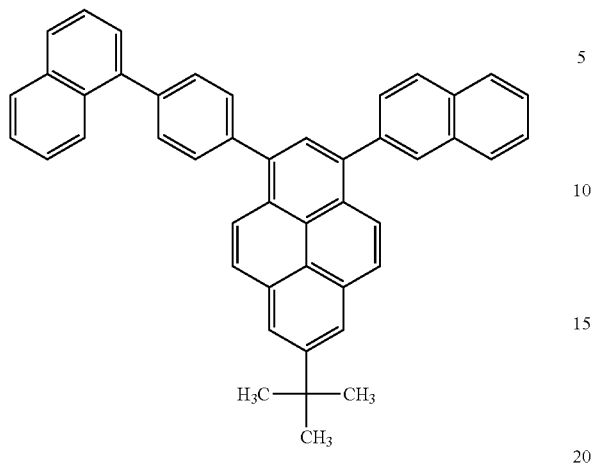
(H-14)

TABLE 7

| | Light emitting material | | | Electron transporting layer | | Cathode | External quantum | Driving voltage |
|---|---|---|---|---|---|---|---|---|
| | Host material | Dopant material | Emitting color | Compound | Donor compound | Metal | efficiency (%) | (V) |
| Example 110 | H-1 | D-3 | Blue | Compound [10] | 2E-1 | Mg/Ag | 6.3 | 3.8 |
| Example 111 | | | Blue | Compound [107] | | | 6.4 | 3.8 |
| Example 112 | | | Blue | Compound [91] | | | 6.5 | 3.7 |
| Example 113 | | | Blue | Compound [63] | | | 6.2 | 3.9 |
| Example 114 | | | Blue | Compound [106] | | | 6.3 | 3.7 |
| Example 115 | | | Blue | Compound [144] | | | 6.2 | 3.7 |
| Example 116 | H-1 | D-12 | Blue | Compound [34] | 2E-1 | Mg/Ag | 6.2 | 3.8 |
| Example 117 | | | Blue | Compound [36] | | | 5.8 | 4.4 |
| Example 118 | | | Blue | Compound [46] | | | 5.7 | 4.1 |
| Example 119 | | | Blue | Compound [47] | | | 5.7 | 4.4 |
| Example 120 | | | Blue | Compound [49] | | | 6.1 | 3.9 |
| Example 121 | | | Blue | Compound [60] | | | 6.2 | 3.8 |
| Example 122 | | | Blue | Compound [65] | | | 6.2 | 3.8 |
| Example 123 | | | Blue | Compound [67] | | | 6.3 | 3.9 |
| Example 124 | | | Blue | Compound [86] | | | 6.1 | 3.8 |
| Example 125 | | | Blue | Compound [93] | | | 6.2 | 3.7 |
| Example 126 | | | Blue | Compound [111] | | | 6.3 | 3.7 |
| Example 127 | | | Blue | Compound [120] | | | 6.1 | 3.9 |
| Example 128 | | | Blue | Compound [177] | | | 6.0 | 3.9 |

TABLE 8

| | Light emitting material | | | Electron transporting layer | | Cathode | External quantum | Driving voltage |
|---|---|---|---|---|---|---|---|---|
| | Host material | Dopant material | Emitting color | Compound | Donor compound | Metal | efficiency (%) | (V) |
| Example 129 | H-1 | D-13 | Blue | Compound [66] | 2E-1 | Mg/Ag | 6.1 | 3.8 |
| Example 130 | | | Blue | Compound [81] | | | 6.0 | 3.9 |
| Example 131 | | | Blue | Compound [88] | | | 6.2 | 3.7 |
| Example 132 | | | Blue | Compound [96] | | | 6.0 | 3.9 |
| Example 133 | | | Blue | Compound [105] | | | 6.0 | 3.8 |
| Example 134 | | | Blue | Compound [168] | | | 5.6 | 4.2 |
| Example 135 | | | Blue | Compound [176] | | | 6.3 | 3.7 |
| Example 136 | H-13 | | Blue | Compound [76] | | | 6.0 | 3.9 |
| Example 137 | | | Blue | Compound [82] | | | 5.8 | 4.0 |
| Example 138 | | | Blue | Compound [85] | | | 6.1 | 3.8 |
| Example 139 | | | Blue | Compound [90] | | | 6.2 | 3.7 |
| Example 140 | | | Blue | Compound [94] | | | 6.0 | 3.9 |
| Example 141 | H-1 | D-14 | Blue | Compound [112] | 2E-1 | Mg/Ag | 6.2 | 3.7 |
| Example 142 | | | Blue | Compound [116] | | | 6.1 | 3.8 |

TABLE 8-continued

| | Light emitting material | | | Electron transporting layer | | Cathode | External quantum | Driving voltage |
|---|---|---|---|---|---|---|---|---|
| | Host material | Dopant material | Emitting color | Compound | Donor compound | Metal | efficiency (%) | (V) |
| Example 143 | | | Blue | Compound [160] | | | 5.9 | 3.9 |
| Example 144 | | | Blue | Compound [164] | | | 5.6 | 4.2 |
| Example 145 | H-143 | | Blue | Compound [69] | | | 6.2 | 3.8 |
| Example 146 | | | Blue | Compound [97] | | | 6.0 | 3.9 |
| Example 147 | | | Blue | Compound [169] | | | 5.7 | 4.2 |

The invention claimed is:

1. A light emitting device material comprising a pyrene compound represented by formula (1):

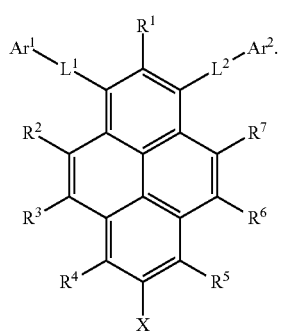

(1)

$R^1$ to $R^7$ may be the same or different, and are each selected from the group consisting of hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen, a carbonyl group, a carboxyl group, an oxycarbonyl group, a carbamoyl group, an amino group, and a silyl group;

$L^1$ and $L^2$ may be the same or different, and $L^1$ is an arylene group and $L^2$ is a single bond or an arylene group;

X is selected from the group consisting of an alkyl group, an aryl group and a heteroaryl group; and $Ar^1$ is a pyridyl group, a quinolinyl group, an isoquinolinly group, a quinoxanyl group, a pyrazinyl group, a pyrimidyl group, a pyridazinyl group, a phenanthrolinyl group, an imidazopyridyl group, a triazyl group, an acridyl group, a benzoimidazolyl group, a benzooxazolyl group and a benzothiazolyl group, and $Ar^2$ is an aryl group or a heteroaryl group, provided that when $Ar^2$ is a heteroaryl group, a dibenzofuranyl group, a dibenzothiophenyl group and a carbazolyl group are excluded.

2. A light emitting device comprising at least an emissive layer and an electron transporting layer between an anode and a cathode, and emitting light by an electric energy, wherein the light emitting device contains a pyrene compound represented by formula (1) in any layer between the anode and the cathode:

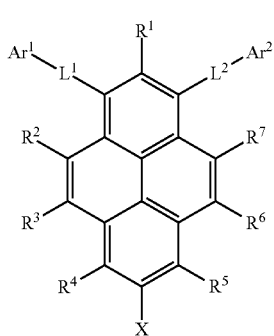

(1)

$R^1$ to $R^7$ may be the same or different, and are each selected from the group consisting of hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen, a carbonyl group, a carboxyl group, an oxycarbonyl group, a carbamoyl group, an amino group, and a silyl group;

$L^1$ and $L^2$ may be the same or different, and $L^1$ is an arylene group and $L^2$ is a single bond or an arylene group;

X is selected form the group consisting of an alkyl group, an aryl group and a heteroaryl group; and $Ar^1$ is a pyridyl group, a quinolinyl group, an isoquinolinyl group, a quinoxanyl group, a pyrazinyl group, a pyrimidyl group, a pyridazinyl group, a phenanthrolinyl group, an imidazopyridyl group, a triazyl group, an acridyl group, a benzoimidazolyl group, a benzooxazolyl group and a benzothiazolyl group, and $Ar^2$ is an aryl group or a heteroaryl group, provided that when $Ar^2$ is a heteroaryl group, a dibenzofuranyl group and a carbazoyl group are excluded.

3. The light emitting device according to claim 2, which comprises the pyrene compound represented by formula (1) in the electron transporting layer.

4. The light emitting device according to claim 3, which comprises a donor compound in the electron transporting layer.

5. The light emitting device according to claim 4, wherein the donor compound is an alkali metal, an inorganic salt containing an alkali metal, a complex of an alkali metal and an organic substance, an alkaline earth metal, an inorganic salt containing an alkaline earth metal, or a complex of an alkaline earth metal and an organic substance.

6. The light emitting device according to claim 4, wherein the donor compound is a complex of an alkali metal and an organic substance or a complex of an alkaline earth metal and an organic substance.

7. The light emitting device according to claim 2, which comprises the pyrene compound represented by formula (1) in the emissive layer.

8. The light emitting device according to claim 2, wherein the cathode is constituted by magnesium and silver.

9. The light emitting device according to claim 3, wherein the cathode is constituted by magnesium and silver.

10. The light emitting device according to claim 4, wherein the cathode is constituted by magnesium and silver.

11. The light emitting device according to claim 5, wherein the cathode is constituted by magnesium and silver.

12. The light emitting device according to claim 6, wherein the cathode is constituted by magnesium and silver.

13. The light emitting device according to claim 7, wherein the cathode is constituted by magnesium and silver.

* * * * *